(12) United States Patent
Chen et al.

(10) Patent No.: US 10,741,386 B2
(45) Date of Patent: Aug. 11, 2020

(54) DEPOSITION OF SIN

(71) Applicant: ASM IP Holding B.V., Almere (NL)

(72) Inventors: Shang Chen, Tokyo (JP); Viljami Pore, Helsinki (FI); Ryoko Yamada, Tokyo (JP); Antti Juhani Niskanen, Helsinki (FI)

(73) Assignee: ASM IP Holding B.V., Almere (NL)

( * ) Notice: Subject to any disclaimer, the term of this patent is extended or adjusted under 35 U.S.C. 154(b) by 0 days.

(21) Appl. No.: 16/381,634

(22) Filed: Apr. 11, 2019

(65) Prior Publication Data

US 2019/0295838 A1  Sep. 26, 2019

Related U.S. Application Data

(63) Continuation of application No. 15/706,435, filed on Sep. 15, 2017, now Pat. No. 10,262,854, which is a
(Continued)

(51) Int. Cl.
*H01L 21/02* (2006.01)
*C23C 16/04* (2006.01)
(Continued)

(52) U.S. Cl.
CPC ........ *H01L 21/0228* (2013.01); *C23C 16/045* (2013.01); *C23C 16/345* (2013.01);
(Continued)

(58) Field of Classification Search
CPC ........... H01L 21/0217; H01L 21/02274; H01L 21/02211; H01L 21/02271;
(Continued)

(56) References Cited

U.S. PATENT DOCUMENTS 4,668,365 A  5/1987 Foster et al.
4,683,147 A  7/1987 Eguchi et al.
(Continued)

FOREIGN PATENT DOCUMENTS

JP  01-103844  4/1989
JP  05-070957  3/2003
(Continued)

OTHER PUBLICATIONS

Cho, Namtae, "Processing of Boron Carbide," Ph.D. Thesis, School of Materials Science and Engineering, Georgia Institute of Technology, 2006, in 89 pages.
(Continued)

*Primary Examiner* — Karen Kusumakar
(74) *Attorney, Agent, or Firm* — Knobbe, Martens, Olson & Bear LLP

(57) ABSTRACT

Methods and precursors for forming silicon nitride films are provided. In some embodiments, silicon nitride can be deposited by atomic layer deposition (ALD), such as plasma enhanced ALD. In some embodiments, deposited silicon nitride can be treated with a plasma treatment. The plasma treatment can be a nitrogen plasma treatment. In some embodiments the silicon precursors for depositing the silicon nitride comprise an iodine ligand. The silicon nitride films may have a relatively uniform etch rate for both vertical and the horizontal portions when deposited onto three-dimensional structures such as FinFETS or other types of multiple gate FETs. In some embodiments, various silicon nitride films of the present disclosure have an etch rate of less than half the thermal oxide removal rate with diluted HF (0.5%). In some embodiments, a method for depositing silicon nitride films comprises a multi-step plasma treatment.

23 Claims, 19 Drawing Sheets

Related U.S. Application Data continuation of application No. 15/426,593, filed on Jul. 7, 2017, now abandoned, which is a continuation of application No. 14/855,261, filed on Sep. 15, 2015, now Pat. No. 9,576,792.

(60) Provisional application No. 62/180,511, filed on Jun. 16, 2015, provisional application No. 62/051,867, filed on Sep. 17, 2014.

(51) Int. Cl.
*C23C 16/34* (2006.01)
*C23C 16/455* (2006.01)

(52) U.S. Cl.
CPC .. *C23C 16/45536* (2013.01); *C23C 16/45553* (2013.01); *H01L 21/0217* (2013.01); *H01L 21/02274* (2013.01)

(58) Field of Classification Search
CPC .............. H01L 21/76834; C23C 16/345; C23C 16/45542; C23C 16/34; C23C 16/4554
See application file for complete search history.

(56) References Cited

U.S. PATENT DOCUMENTS

| | | | |
|---|---|---|---|
| 4,696,834 | A | 9/1987 | Varaprath |
| 5,024,716 | A | 6/1991 | Sato |
| 6,391,803 | B1 | 5/2002 | Kim et al. |
| 6,475,276 | B1 | 11/2002 | Elers et al. |
| 6,586,056 | B2 | 7/2003 | Arkles et al. |
| 6,730,614 | B1 | 5/2004 | Lim et al. |
| 6,756,318 | B2 | 6/2004 | Nguyen et al. |
| 6,933,245 | B2 | 8/2005 | Lee et al. |
| 7,473,655 | B2 | 1/2009 | Wang et al. |
| 7,625,609 | B2 | 12/2009 | Matsuura |
| 7,651,955 | B2 | 1/2010 | Ranish et al. |
| 7,713,592 | B2 | 5/2010 | Nguyen et al. |
| 7,713,874 | B2 | 5/2010 | Milligan |
| 8,080,290 | B2 | 12/2011 | Hasebe et al. |
| 8,114,761 | B2 | 2/2012 | Mandrekar et al. |
| 8,119,544 | B2 | 2/2012 | Hasebe et al. |
| 8,236,097 | B2 | 8/2012 | Wang et al. |
| 8,242,031 | B2 | 8/2012 | Mallick et al. |
| 8,298,628 | B2 | 10/2012 | Yang et al. |
| 8,329,599 | B2 | 12/2012 | Fukazawa et al. |
| 8,563,096 | B2 | 10/2013 | Matsunaga et al. |
| 8,580,664 | B2 | 11/2013 | Clark |
| 8,592,328 | B2 | 11/2013 | Hausmann et al. |
| 8,722,546 | B2 | 5/2014 | Fukazawa et al. |
| 8,956,984 | B2 | 2/2015 | Okuda |
| 9,455,138 | B1 | 9/2016 | Fukazawa et al. |
| 9,564,309 | B2 | 2/2017 | Niskanen et al. |
| 9,576,792 | B2 | 2/2017 | Chen et al. |
| 9,824,881 | B2 | 11/2017 | Niskanen et al. |
| 9,905,416 | B2 | 2/2018 | Niskanen et al. |
| 2001/0012701 | A1 | 8/2001 | Kang et al. |
| 2002/0061659 | A1 | 5/2002 | Abe |
| 2002/0068466 | A1 | 6/2002 | Lee et al. |
| 2002/0119327 | A1 | 8/2002 | Arkles et al. |
| 2002/0151426 | A1 | 10/2002 | Murata et al. |
| 2002/0180028 | A1 | 12/2002 | Borovik et al. |
| 2003/0097987 | A1 | 5/2003 | Fukada |
| 2003/0215570 | A1 | 11/2003 | Seutter et al. |
| 2003/0228770 | A1* | 12/2003 | Lee .................... C23C 16/4554 438/791 |
| 2004/0042307 | A1* | 3/2004 | Ohmi .................. H01L 27/1052 365/212 |
| 2004/0121085 | A1 | 6/2004 | Wang et al. |
| 2004/0146644 | A1 | 7/2004 | Xiao et al. |
| 2004/0224089 | A1 | 11/2004 | Singh et al. |
| 2005/0000430 | A1 | 1/2005 | Jang et al. |
| 2005/0025885 | A1 | 2/2005 | McSwiney et al. |
| 2005/0145177 | A1 | 7/2005 | McSwiney et al. |
| 2005/0159017 | A1 | 7/2005 | Kim et al. |
| 2005/0181633 | A1 | 8/2005 | Hochberg et al. |
| 2005/0282350 | A1 | 12/2005 | Chou et al. |
| 2006/0019032 | A1 | 1/2006 | Wang et al. |
| 2006/0084283 | A1 | 4/2006 | Paranjpe et al. |
| 2006/0148271 | A1 | 7/2006 | Borovik et al. |
| 2006/0213437 | A1 | 9/2006 | Ishizaka et al. |
| 2006/0255315 | A1 | 11/2006 | Yellowaga et al. |
| 2007/0026540 | A1 | 2/2007 | Nooten et al. |
| 2007/0116888 | A1 | 5/2007 | Faguet |
| 2007/0232071 | A1 | 10/2007 | Balseanu et al. |
| 2007/0251444 | A1 | 11/2007 | Gros-Jean et al. |
| 2008/0020591 | A1 | 1/2008 | Balseanu et al. |
| 2008/0020593 | A1 | 1/2008 | Wang et al. |
| 2008/0050523 | A1 | 2/2008 | Kitazoe et al. |
| 2008/0146033 | A1 | 6/2008 | Park |
| 2008/0242077 | A1 | 10/2008 | Clark |
| 2008/0242116 | A1 | 10/2008 | Clark |
| 2008/0274605 | A1 | 11/2008 | Hoshi et al. |
| 2008/0292798 | A1 | 11/2008 | Huh et al. |
| 2009/0041952 | A1 | 2/2009 | Yoon et al. |
| 2009/0155606 | A1 | 6/2009 | Yoon et al. |
| 2009/0163041 | A1 | 6/2009 | Mungekar et al. |
| 2009/0246972 | A1 | 10/2009 | Kher et al. |
| 2009/0263972 | A1 | 10/2009 | Balseanu et al. |
| 2009/0269941 | A1 | 10/2009 | Raisanen et al. |
| 2009/0275210 | A1 | 11/2009 | Shanker et al. |
| 2009/0311857 | A1 | 12/2009 | Todd et al. |
| 2010/0041243 | A1 | 2/2010 | Cheng et al. |
| 2010/0124621 | A1 | 5/2010 | Kobayashi et al. |
| 2010/0184302 | A1 | 7/2010 | Lee et al. |
| 2010/0285237 | A1 | 11/2010 | Ditizio et al. |
| 2010/0304047 | A1 | 12/2010 | Yang et al. |
| 2010/0304574 | A1 | 12/2010 | Nodera et al. |
| 2011/0014795 | A1 | 1/2011 | Lee et al. |
| 2011/0086516 | A1 | 4/2011 | Lee et al. |
| 2011/0129990 | A1 | 6/2011 | Mandrekar et al. |
| 2011/0136343 | A1 | 6/2011 | Wang et al. |
| 2011/0136347 | A1 | 6/2011 | Kovarsky et al. |
| 2011/0183528 | A1 | 7/2011 | Wang et al. |
| 2011/0244690 | A1 | 10/2011 | Shanker et al. |
| 2011/0256734 | A1* | 10/2011 | Hausmann ............ C23C 16/045 438/776 |
| 2012/0009802 | A1 | 1/2012 | LaVoie et al. |
| 2012/0021127 | A1 | 1/2012 | Sato et al. |
| 2012/0021138 | A1 | 1/2012 | Ditizio et al. |
| 2012/0028454 | A1 | 2/2012 | Shankar et al. |
| 2012/0028469 | A1 | 2/2012 | Onizawa et al. |
| 2012/0077350 | A1 | 3/2012 | Miya et al. |
| 2012/0153442 | A1 | 6/2012 | Honda et al. |
| 2012/0164848 | A1 | 6/2012 | Fujii et al. |
| 2012/0178264 | A1 | 7/2012 | Murakami et al. |
| 2012/0196048 | A1 | 8/2012 | Ueda |
| 2012/0196450 | A1 | 8/2012 | Balseanu et al. |
| 2012/0213940 | A1 | 8/2012 | Mallick |
| 2012/0220139 | A1 | 8/2012 | Lee et al. |
| 2012/0295449 | A1 | 11/2012 | Fukazawa |
| 2013/0040447 | A1 | 2/2013 | Swaminathan et al. |
| 2013/0065371 | A1 | 3/2013 | Wei et al. |
| 2013/0078392 | A1 | 3/2013 | Xiao et al. |
| 2013/0084714 | A1 | 4/2013 | Oka et al. |
| 2013/0095664 | A1 | 4/2013 | Matero et al. |
| 2013/0115374 | A1 | 5/2013 | Jayakar et al. |
| 2013/0115763 | A1 | 5/2013 | Takamure et al. |
| 2013/0157466 | A1 | 6/2013 | Fox et al. |
| 2013/0171839 | A1 | 7/2013 | Nguyen et al. |
| 2013/0175621 | A1 | 7/2013 | Chen et al. |
| 2013/0183835 | A1 | 7/2013 | Nguyen et al. |
| 2013/0189854 | A1 | 7/2013 | Hausmann et al. |
| 2013/0224964 | A1 | 8/2013 | Fukuzawa et al. |
| 2013/0244446 | A1 | 9/2013 | Tsuji et al. |
| 2013/0252439 | A1 | 9/2013 | Hirose et al. |
| 2013/0323435 | A1 | 12/2013 | Xiao et al. |
| 2013/0330933 | A1 | 12/2013 | Fukazawa et al. |
| 2014/0023794 | A1 | 1/2014 | Mahajani et al. |
| 2014/0030444 | A1 | 1/2014 | Swaminathan et al. |
| 2014/0051263 | A1 | 2/2014 | Tanaka et al. |
| 2014/0062304 | A1 | 3/2014 | Nakano et al. |
| 2014/0073144 | A1 | 3/2014 | Chatterjee et al. |

(56) References Cited

U.S. PATENT DOCUMENTS

| | | | |
|---|---|---|---|
| 2014/0113457 A1 | 4/2014 | Sims et al. |
| 2014/0124841 A1 | 5/2014 | Xie et al. |
| 2014/0141625 A1 | 5/2014 | Fukazawa et al. |
| 2014/0174353 A1 | 6/2014 | Spangler et al. |
| 2014/0191301 A1 | 7/2014 | He et al. |
| 2014/0193983 A1 | 7/2014 | LaVoie |
| 2014/0227458 A1 | 8/2014 | Karakawa et al. |
| 2014/0273477 A1 | 9/2014 | Niskanen et al. |
| 2014/0273527 A1 | 9/2014 | Niskanen et al. |
| 2014/0273528 A1 | 9/2014 | Niskanen et al. |
| 2014/0273529 A1 | 9/2014 | Nguyen et al. |
| 2014/0273530 A1 | 9/2014 | Nguyen et al. |
| 2014/0273531 A1 | 9/2014 | Niskanen et al. |
| 2014/0287164 A1 | 9/2014 | Xiao et al. |
| 2014/0342573 A1 | 11/2014 | Hirose et al. |
| 2014/0363980 A1 | 12/2014 | Kawamata et al. |
| 2015/0031218 A1 | 1/2015 | Karakawa |
| 2015/0104954 A1 | 4/2015 | Pore |
| 2015/0104955 A1 | 4/2015 | Pore |
| 2015/0162185 A1 | 6/2015 | Pore |
| 2015/0206719 A1 | 7/2015 | Swaminathan et al. |
| 2015/0255324 A1 | 9/2015 | Li et al. |
| 2015/0259791 A1 | 9/2015 | Hausmann et al. |
| 2015/0287591 A1 | 10/2015 | Pore et al. |
| 2017/0062204 A1 | 3/2017 | Suzuki et al. |
| 2017/0372886 A1 | 12/2017 | Chen et al. |
| 2018/0068844 A1 | 3/2018 | Chen et al. |
| 2018/0182613 A1 | 6/2018 | Blanquart et al. |

FOREIGN PATENT DOCUMENTS

| | | |
|---|---|---|
| JP | 2006/190770 | 7/2006 |
| JP | 2010/103484 | 5/2010 |
| JP | 2012-138641 | 7/2012 |
| JP | 2012-216873 | 8/2012 |
| JP | 2013-93551 | 5/2013 |
| JP | 2013/125762 | 6/2013 |
| KR | 101491726 | 2/2015 |
| WO | WO 2011/162136 | 12/2011 |
| WO | WO 2012/144523 | 10/2012 |
| WO | WO 2013/121936 | 8/2013 |

OTHER PUBLICATIONS

Domnich, et al., "Boron Carbide: Structures, Properties, and Stability under Stress," J. Am. Ceram. Soc., vol. 94, No. 11, 2011, pp. 3605-3628.
File History of U.S. Appl. No. 13/830,084, filed Mar. 14, 2013.
File History of U.S. Appl. No. 15/703,241, filed Sep. 13, 2017.
File History of U.S. Appl. No. 14/062,328, filed Oct. 24, 2013.
File History of U.S. Appl. No. 14/167,904, filed Jan. 29, 2014.
File History of U.S. Appl. No. 15/414,485, filed Jan. 24, 2017.
File History of U.S. Appl. No. 15/902,300, filed Feb. 22, 2018.
File History of U.S. Appl. No. 14/855,261, filed Sep. 15, 2015.
File History of U.S. Appl. No. 15/426,593, filed Feb. 7, 2017.
File History of U.S. Appl. No. 15/706,435, filed Sep. 15, 2017.
File History of U.S. Appl. No. 14/834,290, filed Aug. 24, 2015.
File History of U.S. Appl. No. 15/966,717, filed Apr. 30, 2018.
Keinan et al., "Diiodosilane. 3. Direct Synthesis of Acyl Iodides from Carboxylic Acids, Esters, Lactones, Acyl Chlorides, and Anhydrides," J. Org. Chem. (1990), 55, 3922-3926.
Keinan et al., "Diiodosilane. 2. A Multipurpose Reagent for Hyddrolysis and Reductive Iodination of Ketals, Acetals, Ketones, and Aldehydes," J. Org. Chem. (1990), 55, 2927-2938.
Keinan et al., "Diiodosilane. 1. A Novel Reagent for Deoxygenation of Alcohols and Ethers," J. Org. Chem. (1987), 52, 4846-4851.
Knoops, Harm C.M. et al. "Plasma-assisted ALD of Silicon Nitride from BTBAS," 131h International Conference on Atomic Layer Deposition, Jul. 28-31, 2013, San Diego, California, U.S.A., 21 pages.
Lin et al., "Silicon Nitride Films Deposited by Atmospheric Pressure Chemical Vapor Deposition", Mat. Res. Soc. Symp. Proc. vol. 495, 1998 Materials Research Society, pp. 107-112.
Lowenstein, et al., "Chemical etching of thermally oxidized silicon nitride: comparison of wet dry etching methods", Journal of the Electrochemical Society, vol. 138, No. 5, 1991, 1389-1394.
Pedersen, et al. "Low Temperature CVD of Thin, Amorphous Boron-Carbon Films for Neutron Detectors," 2012, Chemical Vapor Deposition, (18), 7-9, 221-224.
Sarubbi, et al., "Pure Boron-Doped Photodiodes: a Solution for Radiation Detection in EUV Lithography," ESSDERC 2008—38th European Solid-State Device Research Conference, 2008, pp. 278-281.
Tamizhmani et al., "Physical Characterization of a-Si Thin Films Deposited by Thermal Decomposition of Iodosilanes," J. Phys. D: Appl. Phys. 24 (1991), 1015-1021.
Tamizhmani et al., "Some Physical Properties of Undoped Amorphous Silicon Prepared by a New Chemical Vapor Deposition Process Using Iodosilanes", Chem. Mater. (1990), 2, 473-476.
Triyoso et al., "Robust PEALD SiN spacer for gate first high-k metal gate integration", IEEE, 2012, 4 pages.
File History of U.S. Appl. No. 16/574,542, filed Sep. 18, 2019.
File History of U.S. Appl. No. 16/540,349, filed Aug. 14, 2019.
File History of U.S. Appl. No. 16/543,917, filed Aug. 19, 2019.
Aylett et al., "The Preparation and Properties of Dimethylamino- and Diethylamino-silane", J. Chem. Soc. (A), 1967, pp. 652-655.

* cited by examiner

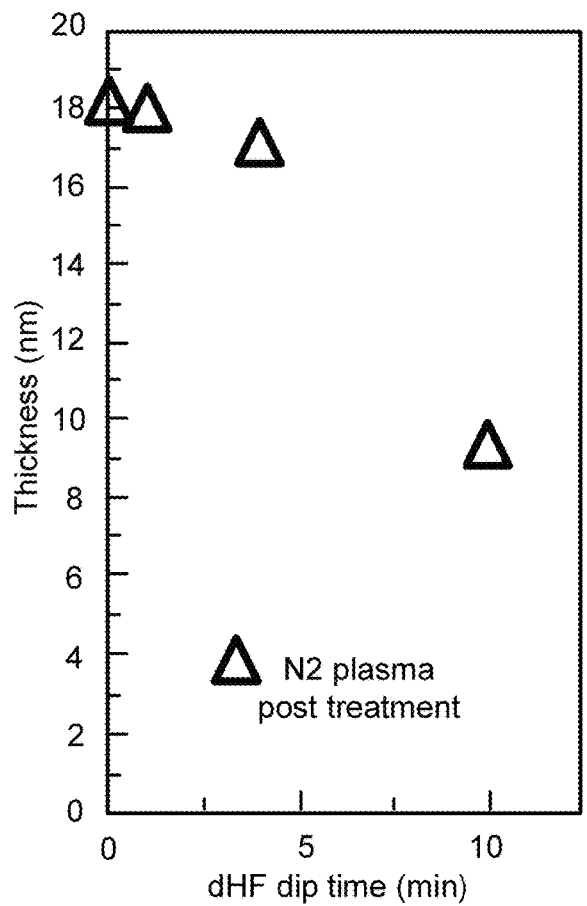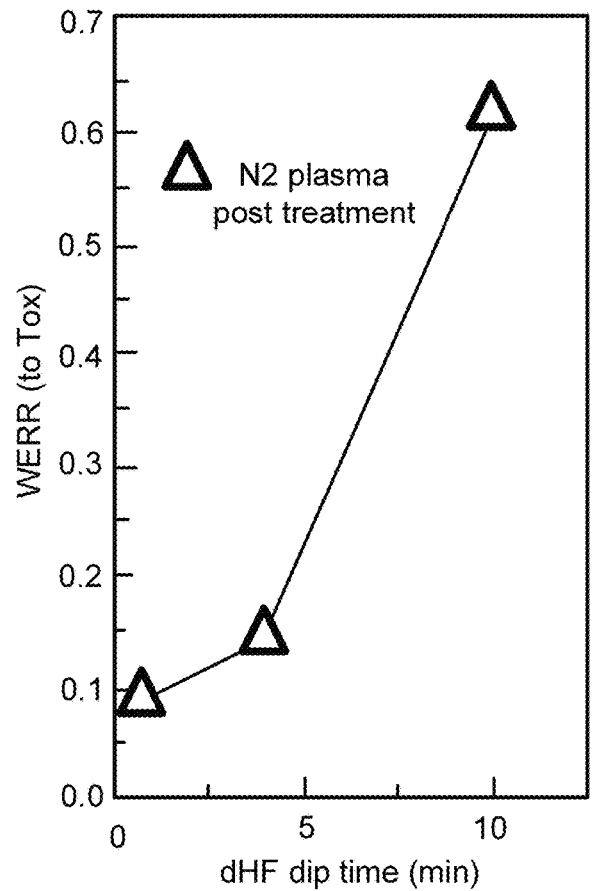
FIG. 13A  FIG. 13B

SiN deposition and dHF {0.5%} etch test results

| Process / property | Growth rate/ Å/cycle | Refractive index | Wet etch rate/ mn/min | Wet etch rate/ Times TOx {planar} |
|---|---|---|---|---|
| OCTS + $N_2/H_2$ @ 120° C* | 0.73 | 1.78 | 21.7 | 10.10 |
| OCTS + 3-steps @ 120° C* | 0.74 | 1.80 | 11.5 | 5.4 |

FIG. 19A

| Gas composition | $H_2 + N_2$ | $H_2$ | $H_2$ | $H_2 + N_2$ | $H_2 + N_2$ | $H_2 + N_2$ |
|---|---|---|---|---|---|---|
| Step | Pulse | Purge | Pulse | Purge | Pulse | Purge |
| Plasma | ON | OFF | ON | OFF | ON | OFF |
| Time | 6s | 4s | 4s | 4s | 2s | 0s |

FIG. 19B

DEPOSITION OF SIN

REFERENCE TO RELATED APPLICATIONS

This application is a continuation of U.S. application Ser. No. 15/706,435, filed Sep. 15, 2017, which is a continuation of U.S. application Ser. No. 15/426,593, filed Feb. 7, 2017, which is a continuation of U.S. application Ser. No. 14/855,261, filed Sep. 15, 2015, now issued as U.S. Pat. No. 9,576,792, which claims priority to U.S. Provisional Application No. 62/180,511, filed Jun. 16, 2015, and U.S. Provisional Application No. 62/051,867, filed Sep. 17, 2014, each of which is incorporated herein by reference in its entirety.

BACKGROUND

Field

The present disclosure relates generally to the field of semiconductor device manufacturing and, more particularly, to low temperature deposition of silicon nitride films and precursors for use in deposition of silicon nitride films.

Description of the Related Art

Spacers are widely used in semiconductor manufacturing as structures to protect against subsequent processing steps. For example, nitride spacers formed beside gate electrodes can be used as a mask to protect underlying source/drain areas during doping or implanting steps.

As the physical geometry of semiconductor devices shrinks, the gate electrode spacer becomes smaller and smaller. The spacer width is limited by the nitride thickness that can be deposited conformably over the dense gate electrodes lines. So the nitride spacer etching process is preferred to have a high ratio of spacer width to nitride layer thickness as deposited.

Current PEALD silicon nitride processes in general suffer from anisotropic etch behavior when deposited on a three-dimensional structure, such as a trench structure. In other words, the film deposited on the sidewalls of a trench or fin or another three dimensional feature display inferior film properties as compared to film on the top region of the feature. The film quality may be sufficient for the target application on the top of the trench, or on planar regions of a structured wafer, but not on the sidewalls or other non-horizontal or vertical surfaces.

FIGS. 1A and 1B illustrate a typical example of a silicon nitride film, which could be used in spacer applications. The film was deposited at 400° C. using a PEALD process other than those described in the present application. FIG. 1A illustrates the film after it was deposited on a three-dimensional surface but prior to being etched by HF. An etching process was then performed by dipping the workpiece in 0.5% HF for about 60 seconds. FIG. 1B illustrates the extent to which vertical portions of the silicon nitride film etch to a greater extent than the horizontal portions of the film. The film thicknesses are indicated in nanometers. Structures such as these would not generally survive further processing, such as in a FinFET spacer application.

SUMMARY

In some aspects, atomic layer deposition (ALD) methods of depositing silicon nitride films are provided. In some embodiments the ALD methods may be plasma enhanced ALD methods or thermal ALD methods. The methods allow for the deposition of silicon nitride films with desirable qualities, such as good step coverage and pattern loading effects, as well as desirable etch characteristics. According to some embodiments, the silicon nitride films have a relatively uniform etch rate for both the vertical and the horizontal portions, when deposited onto 3-dimensional structures. Such three-dimensional structures may include, for example and without limitation, FinFETS or other types of multiple gate FETs. In some embodiments, various silicon nitride films of the present disclosure have an etch rate of less than half the thermal oxide removal rate of about 2-3 nm per minute with diluted HF (0.5%).

In some embodiments, methods of depositing silicon nitride films on a substrate in a reaction chamber comprise introducing a vapor phase silicon reactant to the reaction space such that silicon species adsorb on the substrate surface, removing excess silicon reactant, contacting the adsorbed silicon species with a reactive species generated by plasma from a nitrogen precursor, and removing excess reactive species and reaction by-products. These steps are repeated to achieve a silicon nitride film of the desired thickness.

In some embodiments, the silicon precursor comprises a precursor of formulas (1)-(8) as described herein. In some embodiments the silicon precursor is selected from the group consisting of $HSiI_3$, $H_2SiI_2$, $H_3SiI$, $H_2Si_2I_4$, $H_4Si_2I_2$, and $H_5Si_2I$. In some embodiments the silicon precursor is $H_2SiI_2$. The reactive species may comprise, for example, hydrogen, hydrogen atoms, hydrogen plasma, hydrogen radicals, N* radicals, NH* radicals or $NH_2$* radicals. In some embodiments, the reactive species may comprise N-containing plasma or a plasma comprising N. In some embodiments, the reactive species may comprise a plasma comprising N-containing species. In some embodiments the reactive species may comprise nitrogen atoms and/or N* radicals.

In some embodiments the silicon nitride film is deposited on a three-dimensional structure. In some embodiments the silicon nitride film exhibits a step coverage and pattern loading effect of at least about 80%. In some embodiments the structure comprises a sidewall and top regions and the sidewall wet etch rate (WER) of the silicon nitride film relative to the top region WER is less than about 3 in 0.5% dHF. In some embodiments the etch rate of the silicon nitride film is less than about 0.4 nm/min in 0.5% aqueous HF.

In some embodiments, methods of depositing a silicon nitride film comprise loading a substrate comprising at least one three-dimensional feature into a reaction space, contacting the substrate in the reaction space with a silicon precursor so that silicon species are adsorbed on a surface of the substrate, purging the reaction space of excess silicon precursor, contacting silicon species adsorbed onto the surface of the substrate in the reaction space with a nitrogen precursor, purging the reaction space of excess nitrogen precursor, and repeating the steps to produce a film of the desired thickness. In some embodiments the film has a step coverage of more than about 50% on the three-dimensional feature. In some embodiments the wet etch rate of the silicon nitride film is less than about 5 nm/min in 5% aqueous HF. In some embodiments a ratio of an etch rate of the silicon nitride film in a sidewall of a three-dimensional structure to an etch rate on a top surface is less than about 4. In some embodiments the step coverage is at least about 80% or about 90%.

In some embodiments, methods of depositing a silicon nitride film on a substrate comprise, exposing the substrate to a vapor phase silicon precursor so that silicon species are adsorbed on a surface of the substrate, exposing silicon species adsorbed on the surface of the substrate to a purge gas and/or a vacuum to remove excess precursor and reaction byproducts from the substrate surface, contacting the adsorbed silicon species with species generated by a nitrogen plasma, exposing the substrate to a purge gas and/or a vacuum to remove the species of a nitrogen containing plasma and reaction byproducts from the substrate surface and from the proximity of the substrate surface, and repeating the steps to produce a film of the desired thickness.

In some embodiments, methods of depositing a silicon nitride film on a substrate comprise, exposing the substrate to a vapor phase silicon reactant so that silicon species is adsorbed on a surface of the substrate, exposing the substrate to a purge gas and/or a vacuum to remove excess precursor and reaction byproducts from the substrate surface, contacting the adsorbed silicon species with a nitrogen precursor, exposing the substrate to a purge gas and/or a vacuum to remove excess nitrogen precursor and reaction byproducts from the substrate surface and from the proximity of the substrate surface, and repeating the steps to produce a film of the desired thickness.

In some embodiments the silicon precursor comprises iodine or bromine. In some embodiments the film has a step coverage of more than about 50%. In some embodiments the etch rate of the silicon nitride is less than about 5 nm/min in 0.5% aqueous HF. In some embodiments a ratio of an etch rate of the silicon nitride on a sidewall of a three-dimensional structure to an etch rate on a top surface of the three-dimensional structure is less than about 4.

In some aspects, a silicon nitride thin film deposited by a method as described herein can be subject to a plasma treatment. In some embodiments, the plasma treatment comprises exposing the deposited silicon nitride thin film to plasma generated from nitrogen containing gas free or substantially free of hydrogen species. In some embodiments, the silicon nitride film can be deposited using a plurality of silicon nitride deposition cycles, and the plasma treatment can be applied after every deposition cycle, at pre-determined intervals, or after a silicon nitride film of desired thickness is deposited.

In some embodiments, methods of forming a thin film on a substrate in a reaction space can include contacting the substrate with a first silicon halide to provide a first silicon species adsorbed on a surface of the substrate, and contacting the substrate comprising the first species adsorbed on the surface with a first plasma step to deposit a material on the substrate. The method may further include conducting a nitrogen plasma treatment, where the nitrogen plasma treatment includes contacting the substrate comprising the material on the surface with a second plasma formed from a nitrogen containing gas substantially free of hydrogen-containing species to form the thin film. In some embodiments, the thin film is a silicon nitride film.

In some embodiments, methods of forming a SiN thin film on a substrate in a reaction space can include contacting the substrate with a first silicon halide to provide a first silicon species adsorbed on a surface of the substrate, and contacting the substrate comprising the first silicon species adsorbed on the surface with a first plasma including an activated hydrogen species to thereby deposit SiN. The method may further include conducting a nitrogen plasma treatment to form the SiN thin film, where the nitrogen plasma treatment includes contacting the substrate comprising the SiN with a second plasma formed from a nitrogen containing gas substantially free of hydrogen-containing species. In some embodiments, a silicon nitride deposition cycle comprises contacting the substrate with the first silicon precursor and contacting the first silicon species adsorbed on the surface of the substrate with the second nitrogen precursor. In some embodiments, the silicon nitride on the substrate can be contacted with the second plasma after every silicon nitride deposition cycle, or at various repetitions of the silicon nitride deposition cycle, such as after every 2, 3, 4, 5, 10, 25, 50 or 100 repetitions.

In some embodiments, the first plasma includes at least one of hydrogen, hydrogen atoms, hydrogen plasma, hydrogen radicals, N* radicals, NH* radicals and $NH_2$* radicals. In some embodiments, the first plasma may comprise N-containing plasma or a plasma comprising N. In some embodiments, the first plasma may comprise N-containing species. In some embodiments the first plasma may comprise nitrogen atoms and/or N* radicals.

In some embodiments, the first plasma is generated using a first power and the second plasma is generated using a second power. The second power may be greater than the first power. In some embodiments, the second power is about 100% to about 900% that of the first power. In some embodiments, the second power is about 100% to about 200% that of the first power.

In some embodiments, second power is less than the first power. The second power is between about 50% and about 100% that of the first power. In some embodiments, the first power is about 50 W to about 600 W. The plasma power of the first power may be about 150 W to about 250 W. In some embodiments, the second power is about 100 W to about 1000 W. The second power may be about 150 W to about 300 W.

In some embodiments, contacting the substrate with the first plasma is carried out for a duration that is greater than the duration of the nitrogen plasma treatment. In some embodiments, the duration of the nitrogen plasma treatment is about 5% to about 75% that of the duration of the first plasma step. The duration of the nitrogen plasma treatment may be about 20% to about 50% that of the duration of the first plasma step.

In some embodiments, methods of depositing the thin film may further include repeating contacting the substrate with the first precursor, such as a silicon precursor, and contacting the species, such as silicon species, adsorbed onto the surface of the substrate with the first plasma two or more times prior to conducting the nitrogen plasma treatment. In some embodiments, the nitrogen plasma treatment is conducted after at least 25 repetitions of contacting the substrate with the first precursor and contacting the species adsorbed onto the surface of the substrate with the activated hydrogen species. In some embodiments, the nitrogen plasma treatment is conducted after every 25th repetition. In some embodiments, the nitrogen plasma treatment is conducted after every 50th repetition In some embodiments, the nitrogen plasma treatment is conducted after every 100th repetition.

The SiN film may be formed on a three-dimensional structure. In some embodiments, the structure comprises sidewalls and top regions and where a ratio of a wet etch rate (WER) of the SiN thin film on the sidewalls to a wet etch rate (WER) of the SiN film on the top regions is less than about 1 in 0.5% dHF. In some embodiments, the ratio is from about 0.75 to about 1.5, and in some embodiments may be about 0.9 to about 1.1.

In some embodiments, an etch rate ratio of an etch rate of the SiN thin film to an etch rate of a thermal silicon oxide film is less than about 0.5 in 0.5% aqueous HF.

In some embodiments, contacting the substrate with a silicon halide comprises iodine. In some embodiments, the silicon halide comprises chlorine. The silicon precursor may be inorganic. In some embodiments, the silicon halide includes $SiI_2H_2$.

In some aspects, a method of depositing a SiN thin film on a substrate in a reaction space can include exposing the substrate to a silicon halide to provide silicon species adsorbed onto a surface of the substrate, and exposing the substrate comprising the silicon species adsorbed onto the surface to a first nitrogen-containing plasma, and a second, different plasma. In some embodiments, the silicon halide includes iodine. In some embodiments, the silicon halide includes chlorine. In some embodiments, the silicon halide includes octachlorotrisilane.

In some embodiments, exposing the substrate the first nitrogen-containing plasma and second other different plasma can include exposing the substrate to a plasma generated using at least one of hydrogen gas and nitrogen gas. In some embodiments, exposing the substrate to the first nitrogen-containing plasma can include exposing the silicon species to a plasma generated using both hydrogen gas and nitrogen gas.

In some embodiments, the substrate can be further exposed to a third plasma different from at least one of the first plasma and the second plasma. Two of the first, second and third plasmas may include a plasma generated using both hydrogen gas and nitrogen gas, and one of the first, second and third plasmas may include a plasma generated using hydrogen gas.

In some embodiments, the substrate is exposed to the first plasma for a first duration, the substrate is exposed to the second plasma for a second duration, and the substrate is exposed to the third plasma for a third duration, and wherein the first duration is greater than the second duration. The first duration may be longer than the second. In some embodiments, the second duration is longer than the third duration.

In some embodiments, each of the first plasma and the third plasma can include a plasma generated using both hydrogen gas and nitrogen gas. In some embodiments, the second plasma can include a plasma generated using hydrogen gas.

The method of depositing the thin film may include removing excess reactants from the reaction space between the first plasma and the second plasma, and removing excess reactants from the reaction space between the second plasma and the third plasma. In some embodiments, removing excess reactants from the reaction space between the first plasma and the second plasma, and between the second plasma and the third plasma can each include flowing hydrogen gas. In some embodiments, removing excess reactants from the reaction space a first purge step between the first plasma and the second plasma can include ramping down a flow rate of nitrogen gas. In some embodiments, removing excess reactants from the reaction space between the second plasma and the third plasma includes flowing hydrogen gas and nitrogen gas. In some embodiments, the removing excess reactants from the reaction space between the second plasma and the third plasma includes ramping up a flow rate of nitrogen gas.

In some aspects, a method of depositing a thin film on a substrate in a reaction space can include exposing the substrate to a silicon halide such that silicon species adsorb onto a surface of the substrate, exposing the substrate to a first plasma generated using nitrogen-containing and hydrogen-containing gas, exposing the substrate to a second plasma generated using hydrogen-containing gas, exposing the substrate to a third plasma generated using hydrogen-containing gas and nitrogen-containing gas, and repeating exposing the substrate to the silicon halide, the first plasma, the second plasma and the third plasma. In some embodiments, the thin film is a silicon nitride thin film. In some embodiments, depositing the thin film is substantially free from additional reactants.

In some embodiments, the first plasma and the third plasma are generated using hydrogen gas and nitrogen gas. In some embodiments, the second plasma is generated using hydrogen gas.

The method of depositing the thin film may include removing excess reactants from the reaction space between exposing the substrate to the first plasma and the second plasma, and removing excess reactants from the reaction space between exposing the substrate to the second plasma and the third plasma. In some embodiments, removing excess reactants may include turning off the plasma. In some embodiments, removing excess reactants may include continuing flow of hydrogen gas. The method of depositing the thin film may include ramping down flow of nitrogen gas during removing excess reactants from the reaction space between exposing the substrate to the first plasma and the second plasma. The method of depositing the thin film may include ramping up flow of nitrogen gas during removing excess reactants from the reaction space between exposing the substrate to the second plasma and the third plasma.

In some aspects, a method of forming a SiN thin film on a substrate in a reaction space can include depositing SiN on the substrate using an atomic layer deposition process; and conducting a nitrogen plasma treatment upon the deposited SiN, where the nitrogen plasma treatment includes contacting the substrate comprising the SiN with a nitrogen plasma formed from a nitrogen containing gas substantially free of hydrogen-containing species. In some embodiments, the atomic layer deposition process comprises contacting the substrate with a silicon precursor. In some embodiments, the silicon precursor comprises iodine.

In some embodiments, conducting the nitrogen plasma treatment includes contacting the SiN on the substrate with a plasma substantially free of hydrogen-containing species.

In some embodiments, the atomic layer deposition process includes a PEALD process, and the PEALD process can include contacting the substrate with a silicon halide to provide a first silicon species adsorbed on a surface of the substrate, and contacting the substrate comprising the first silicon species adsorbed on the surface with a first plasma comprising activated hydrogen species. In some embodiments, the silicon halide can include an iodine or chlorine. In some embodiments, the activated hydrogen species can include at least one of hydrogen, hydrogen atoms, hydrogen plasma, hydrogen radicals, N* radicals, NH* radicals and $NH_2$* radicals. In some embodiments, the first plasma may comprise N-containing plasma or a plasma comprising N. In some embodiments, the first plasma may comprise a plasma comprising N-containing species. In some embodiments the first plasma may comprise nitrogen atoms and/or N* radicals. In some embodiments, depositing the SiN includes generating the first plasma using a first power and wherein conducting the nitrogen plasma treatment includes generating the nitrogen plasma using a second power, where the second power is greater than the first power. In some embodiments, contacting the substrate with the silicon halide and the first plasma can be repeated two or more times prior to conducting the nitrogen plasma treatment.

In some embodiments, the atomic layer deposition process includes a thermal ALD process.

BRIEF DESCRIPTION OF THE DRAWINGS

The invention will be better understood from the Detailed Description of the Preferred Embodiments and from the appended drawings, which are meant to illustrate and not to limit the invention, and wherein:

FIG. 13A shows a thickness of silicon nitride film as a function of time dipped in dHF.

FIG. 13B shows wet etch rate ratio of the silicon nitride film of FIG. 12A as compared to a thermal silicon oxide film.

FIG. 19A is a table showing characteristics of an example of a SiN film deposited using a PEALD process comprising a multi-step plasma exposure.

FIG. 19B is a table listing some conditions of the multi-step plasma exposure used in depositing the SiN film of FIG. 19A.

DETAILED DESCRIPTION

Figure 1A:
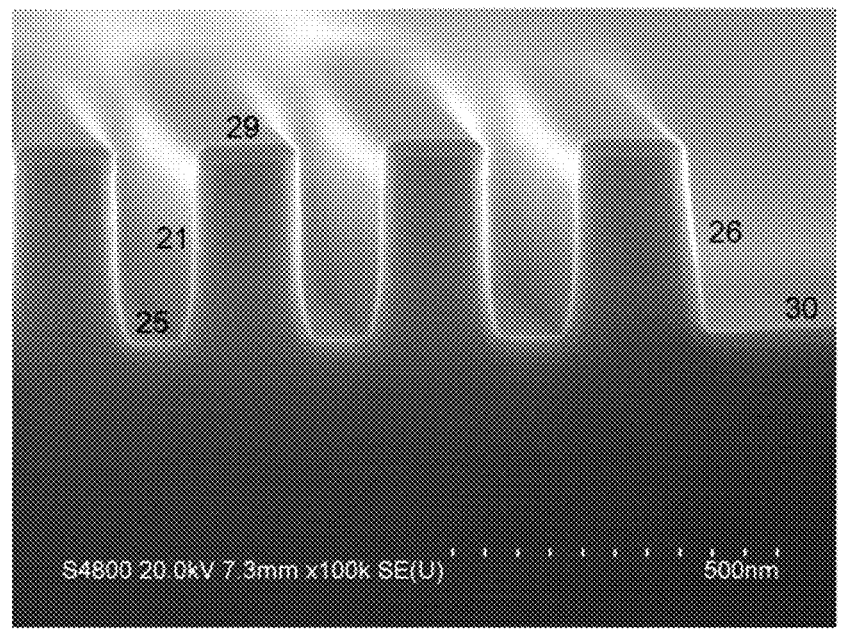
FIGS. 1A and 1B illustrate the results of an etching process on a silicon nitride film.
Figure 1B:
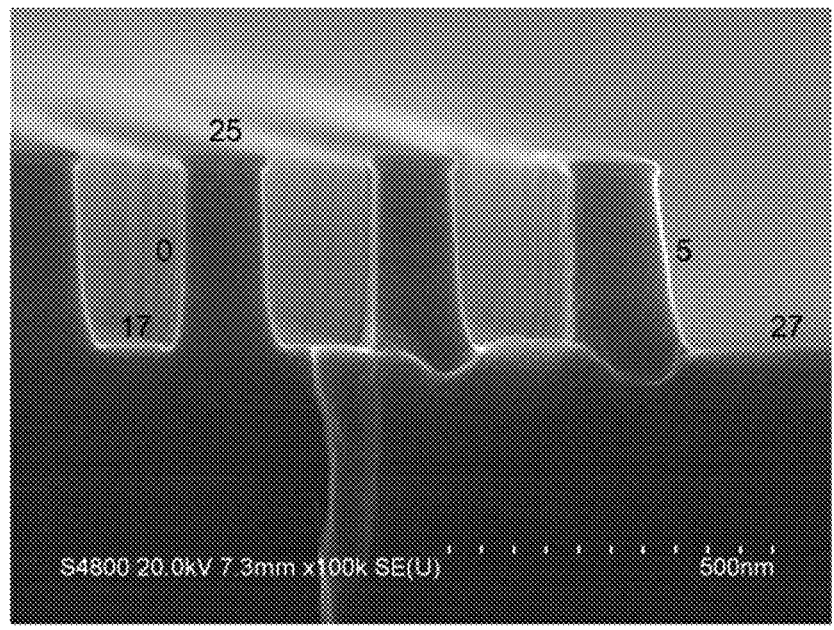

Silicon nitride films have a wide variety of applications, as will be apparent to the skilled artisan, such as in planar logic, DRAM, and NAND Flash devices. More specifically, conformal silicon nitride thin films that display uniform etch behavior have a wide variety of applications, both in the semiconductor industry and also outside of the semiconductor industry. According to some embodiments of the present disclosure, various silicon nitride films and precursors and methods for depositing those films by atomic layer deposition (ALD) are provided. Importantly, in some embodiments the silicon nitride films have a relatively uniform etch rate for both the vertical and the horizontal portions, when deposited onto 3-dimensional structures. Such three-dimensional structures may include, for example and without limitation, FinFETS or other types of multiple gate FETs. In some embodiments, various silicon nitride films of the present disclosure have an etch rate of less than half the thermal oxide removal rate of about 2-3 nm per minute with diluted HF (0.5%).

Thin film layers comprising silicon nitride can be deposited by plasma-enhanced atomic layer deposition (PEALD) type processes or by thermal ALD processes. In some embodiments, silicon nitride thin films are deposited on a substrate by PEALD. In some embodiments, silicon nitride thin films are deposited on a substrate by a thermal ALD process. In some embodiments a silicon nitride thin film is deposited over a three dimensional structure, such as a fin in the formation of a finFET device, and/or in the application of spacer defined double patterning (SDDP) and/or spacer defined quadruple patterning (SDQP).

The formula of the silicon nitride is generally referred to herein as SiN for convenience and simplicity. However, the skilled artisan will understand that the actual formula of the silicon nitride, representing the Si:N ratio in the film and excluding hydrogen or other impurities, can be represented as $SiN_x$, where x varies from about 0.5 to about 2.0, as long as some Si—N bonds are formed. In some cases, x may vary from about 0.9 to about 1.7, from about 1.0 to about 1.5, or from about 1.2 to about 1.4. In some embodiments silicon nitride is formed where Si has an oxidation state of +IV and the amount of nitride in the material might vary.

ALD-type processes are based on controlled, generally self-limiting surface reactions. Gas phase reactions are typically avoided by contacting the substrate alternately and sequentially with the reactants. Vapor phase reactants are separated from each other in the reaction chamber, for example, by removing excess reactants and/or reactant byproducts between reactant pulses. The reactants may be removed from proximity with the substrate surface with the aid of a purge gas and/or vacuum. In some embodiments excess reactants and/or reactant byproducts are removed from the reaction space by purging, for example with an inert gas.

The methods presented herein provide for deposition of SiN thin films on substrate surfaces. Geometrically challenging applications are also possible due to the nature of ALD-type processes. According to some embodiments, ALD-type processes are used to form SiN thin films on substrates such as integrated circuit workpieces, and in some embodiments on three-dimensional structures on the substrates. In some embodiments, ALD type processes comprise alternate and sequential contact of the substrate with a silicon precursor and a nitrogen precursor. In some embodiments, a silicon precursor contacts the substrate such silicon species adsorb onto the surface of the substrate. In some embodiments, the silicon species may be same as the silicon precursor, or may be modified in the adsorbing step, such as by losing one or more ligands.

Figure 2:
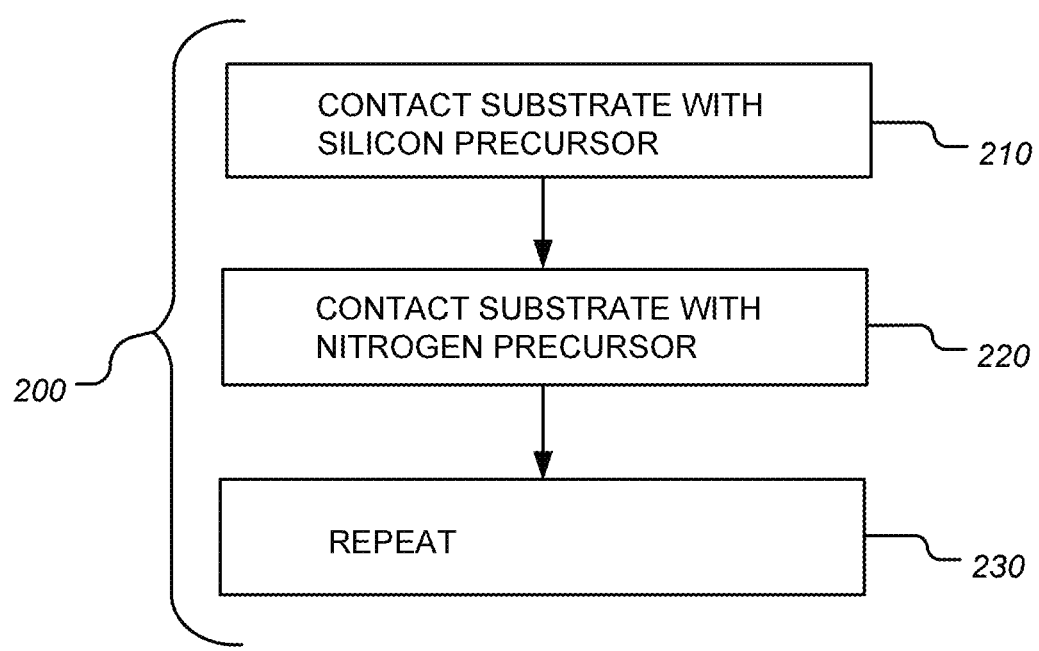
FIG. 2 is a flow chart generally illustrating a method of forming a silicon nitride film by an ALD process in accordance with some embodiments of the present disclosure.

FIG. 2 is a flow chart generally illustrating a silicon nitride ALD deposition cycle that can be used to deposit a silicon nitride thin film in accordance with some embodiments. According to certain embodiments, a silicon nitride thin film is formed on a substrate by an ALD-type process comprising multiple silicon nitride deposition cycles, each silicon nitride deposition cycle 200 comprising:

(1) contacting a substrate with a silicon precursor 210 such that silicon species adsorb on the substrate surface;

(2) contacting the substrate with a nitrogen precursor 220; and (3) repeating steps 210 and 220 as many times as required to achieve a thin film of a desired thickness and composition.

Excess reactants may be removed from the vicinity of the substrate, for example by purging from the reaction space with an inert gas, after each contacting step. The discussion below addresses each of these steps in greater detail.

PEALD Processes

In some embodiments, plasma enhanced ALD (PEALD) processes are used to deposit SiN films. Briefly, a substrate or workpiece is placed in a reaction chamber and subjected to alternately repeated surface reactions. In some embodiments, thin SiN films are formed by repetition of a self-limiting ALD cycle. Preferably, for forming SiN films, each ALD cycle comprises at least two distinct phases. The provision and removal of a reactant from the reaction space may be considered a phase. In a first phase, a first reactant comprising silicon is provided and forms no more than about one monolayer on the substrate surface. This reactant is also referred to herein as "the silicon precursor," "silicon-containing precursor," or "silicon reactant" and may be, for example, $H_2SiI_2$.

In a second phase, a second reactant comprising a reactive species is provided and may convert adsorbed silicon species to silicon nitride. In some embodiments the second reactant comprises a nitrogen precursor. In some embodiments, the reactive species comprises an excited species. In some embodiments the second reactant comprises a species from a nitrogen containing plasma. In some embodiments, the second reactant comprises nitrogen radicals, nitrogen atoms and/or nitrogen plasma. In some embodiments, the second reactant may comprise N-containing plasma or a plasma comprising N. In some embodiments, the second reactant may comprise a plasma comprising N-containing species. In some embodiments the second reactant may comprise nitrogen atoms and/or N* radicals. The second reactant may comprise other species that are not nitrogen precursors. In some embodiments, the second reactant may comprise a plasma of hydrogen, radicals of hydrogen, or atomic hydrogen in one form or another. In some embodiments, the second reactant may comprise a species from a noble gas, such as He, Ne, Ar, Kr, or Xe, preferably Ar or He, for example as radicals, in plasma form, or in elemental form. These reactive species from noble gases do not necessarily contribute material to the deposited film, but can in some circumstances contribute to film growth as well as help in the formation and ignition of plasma. In some embodiments a gas that is used to form a plasma may flow constantly throughout the deposition process but only be activated intermittently. In some embodiments, the second reactant does not comprise a species from a noble gas, such as Ar. Thus, in some embodiments the adsorbed silicon precursor is not contacted with a reactive species generated by a plasma from Ar Additional phases may be added and phases may be removed as desired to adjust the composition of the final film.

One or more of the reactants may be provided with the aid of a carrier gas, such as Ar or He. In some embodiments the silicon precursor and the second reactant are provided with the aid of a carrier gas.

In some embodiments, two of the phases may overlap, or be combined. For example, the silicon precursor and the second reactant may be provided simultaneously in pulses that partially or completely overlap. In addition, although referred to as the first and second phases, and the first and second reactants, the order of the phases may be varied, and an ALD cycle may begin with any one of the phases. That is, unless specified otherwise, the reactants can be provided in any order, and the process may begin with any of the reactants.

As discussed in more detail below, in some embodiments for depositing a silicon nitride film, one or more deposition cycles begin with provision of the silicon precursor, followed by the second precursor. In other embodiments deposition may begin with provision of the second precursor, followed by the silicon precursor.

In some embodiments the substrate on which deposition is desired, such as a semiconductor workpiece, is loaded into a reactor. The reactor may be part of a cluster tool in which a variety of different processes in the formation of an integrated circuit are carried out. In some embodiments a flow-type reactor is utilized. In some embodiments a shower head type of reactor is utilized. In some embodiments, a space divided reactor is utilized. In some embodiments a high-volume manufacturing-capable single wafer ALD reactor is used. In other embodiments a batch reactor comprising multiple substrates is used. For embodiments in which batch ALD reactors are used, the number of substrates is preferably in the range of 10 to 200, more preferably in the range of 50 to 150, and most preferably in the range of 100 to 130.

Exemplary single wafer reactors, designed specifically to enhance ALD processes, are commercially available from ASM America, Inc. (Phoenix, Ariz.) under the tradenames Pulsar® 2000 and Pulsar® 3000 and ASM Japan K.K (Tokyo, Japan) under the tradename Eagle® XP, XP8 and Dragon®. Exemplary batch ALD reactors, designed specifically to enhance ALD processes, are commercially available from and ASM Europe B.V (Almere, Netherlands) under the tradenames A400™ and A412™.

In some embodiments, if necessary, the exposed surfaces of the workpiece can be pretreated to provide reactive sites to react with the first phase of the ALD process. In some embodiments a separate pretreatment step is not required. In some embodiments the substrate is pretreated to provide a desired surface termination. In some embodiments the substrate is pretreated with plasma.

Excess reactant and reaction byproducts, if any, are removed from the vicinity of the substrate, and in particular from the substrate surface, between reactant pulses. In some embodiments the reaction chamber is purged between reactant pulses, such as by purging with an inert gas. The flow rate and time of each reactant, is tunable, as is the removal step, allowing for control of the quality and various properties of the films.

As mentioned above, in some embodiments a gas is provided to the reaction chamber continuously during each deposition cycle, or during the entire ALD process, and reactive species are provided by generating a plasma in the gas, either in the reaction chamber or upstream of the reaction chamber. In some embodiments the gas comprises nitrogen. In some embodiments the gas is nitrogen. In other embodiments the gas may comprise helium, or argon. In some embodiments the gas is helium or nitrogen. The flowing gas may also serve as a purge gas for the first and/or second reactant (or reactive species). For example, flowing nitrogen may serve as a purge gas for a first silicon precursor and also serve as a second reactant (as a source of reactive species). In some embodiments, nitrogen, argon, or helium may serve as a purge gas for a first precursor and a source of excited species for converting the silicon precursor to the silicon nitride film. In some embodiments the gas in which the plasma is generated does not comprise argon and the adsorbed silicon precursor is not contacted with a reactive species generated by a plasma from Ar.

The cycle is repeated until a film of the desired thickness and composition is obtained. In some embodiments the deposition parameters, such as the flow rate, flow time, purge time, and/or reactants themselves, may be varied in one or more deposition cycles during the ALD process in order to obtain a film with the desired characteristics. In some embodiments, hydrogen and/or hydrogen plasma are not provided in a deposition cycle, or in the deposition process.

The term "pulse" may be understood to comprise feeding reactant into the reaction chamber for a predetermined amount of time. The term "pulse" does not restrict the length or duration of the pulse and a pulse can be any length of time.

In some embodiments, the silicon reactant is provided first. After an initial surface termination, if necessary or desired, a first silicon reactant pulse is supplied to the workpiece. In accordance with some embodiments, the first reactant pulse comprises a carrier gas flow and a volatile silicon species, such as $H_2SiI_2$, that is reactive with the workpiece surfaces of interest. Accordingly, the silicon reactant adsorbs upon these workpiece surfaces. The first reactant pulse self-saturates the workpiece surfaces such that any excess constituents of the first reactant pulse do not further react with the molecular layer formed by this process.

The first silicon reactant pulse is preferably supplied in gaseous form. The silicon precursor gas is considered "volatile" for purposes of the present description if the species exhibits sufficient vapor pressure under the process conditions to transport the species to the workpiece in sufficient concentration to saturate exposed surfaces.

In some embodiments the silicon reactant pulse is from about 0.05 seconds to about 5.0 seconds, about 0.1 seconds to about 3 seconds or about 0.2 seconds to about 1.0 seconds. The optimum pulsing time can be readily determined by the skilled artisan based on the particular circumstances.

In some embodiments the silicon reactant consumption rate is selected to provide a desired dose of precursor to the reaction space. Reactant consumption refers to the amount of reactant consumed from the reactant source, such as a reactant source bottle, and can be determined by weighing the reactant source before and after a certain number of deposition cycles and dividing the mass difference by the number of cycles. In some embodiments the silicon reactant consumption is more than about 0.1 mg/cycle. In some embodiments the silicon reactant consumption is about 0.1 mg/cycle to about 50 mg/cycle, about 0.5 mg/cycle to about 30 mg/cycle or about 2 mg/cycle to about 20 mg/cycle. In some embodiments the minimum preferred silicon reactant consumption may be at least partly defined by the reactor dimensions, such as the heated surface area of the reactor. In some embodiments in a showerhead reactor designed for 300 mm silicon wafers, silicon reactant consumption is more than about 0.5 mg/cycle, or more than about 2.0 mg/cycle. In some embodiments the silicon reactant consumption is more than about 5 mg/cycle in a showerhead reactor designed for 300 mm silicon wafers. In some embodiments the silicon reactant consumption is more than about 1 mg/cycle, preferably more than 5 mg/cycle at reaction temperatures below about 400° C. in a showerhead reactor designed for 300 mm silicon wafers.

After sufficient time for a molecular layer to adsorb on the substrate surface, excess first silicon reactant is then removed from the reaction space. In some embodiments the excess first reactant is purged by stopping the flow of the first chemistry while continuing to flow a carrier gas or purge gas for a sufficient time to diffuse or purge excess reactants and reactant by-products, if any, from the reaction space. In some embodiments the excess first precursor is purged with the aid of inert gas, such as nitrogen or argon, that is flowing throughout the ALD cycle.

In some embodiments, the first reactant is purged for about 0.1 seconds to about 10 seconds, about 0.3 seconds to about 5 seconds or about 0.3 seconds to about 1 second. Provision and removal of the silicon reactant can be considered the first or silicon phase of the ALD cycle.

In the second phase, a second reactant comprising a reactive species, such as nitrogen plasma is provided to the workpiece. Nitrogen, $N_2$, is flowed continuously to the reaction chamber during each ALD cycle in some embodiments. Nitrogen plasma may be formed by generating a plasma in nitrogen in the reaction chamber or upstream of the reaction chamber, for example by flowing the nitrogen through a remote plasma generator.

In some embodiments, plasma is generated in flowing $H_2$ and $N_2$ gases. In some embodiments the $H_2$ and $N_2$ are provided to the reaction chamber before the plasma is ignited or nitrogen and hydrogen atoms or radicals are formed. Without being bound to any theory, it is believed that the hydrogen may have a beneficial effect on the ligand removal step i.e. it may remove some of the remaining ligands or have other beneficial effects on the film quality. In some embodiments the $H_2$ and $N_2$ are provided to the reaction chamber continuously and nitrogen and hydrogen containing plasma, atoms or radicals is created or supplied when needed.

Typically, the second reactant, for example comprising nitrogen plasma, is provided for about 0.1 seconds to about 10 seconds. In some embodiments the second reactant, such as nitrogen plasma, is provided for about 0.1 seconds to about 10 seconds, 0.5 seconds to about 5 seconds or 0.5 seconds to about 2.0 seconds. However, depending on the reactor type, substrate type and its surface area, the second reactant pulsing time may be even higher than about 10 seconds. In some embodiments, pulsing times can be on the order of minutes. The optimum pulsing time can be readily determined by the skilled artisan based on the particular circumstances.

In some embodiments the second reactant is provided in two or more distinct pulses, without introducing another reactant in between any of the two or more pulses. For example, in some embodiments a nitrogen plasma is provided in two or more, preferably in two, sequential pulses, without introducing a Si-precursor in between the sequential pulses. In some embodiments during provision of nitrogen plasma two or more sequential plasma pulses are generated by providing a plasma discharge for a first period of time, extinguishing the plasma discharge for a second period of time, for example from about 0.1 seconds to about 10 seconds, from about 0.5 seconds to about 5 seconds or about 1.0 seconds to about 4.0 seconds, and exciting it again for a third period of time before introduction of another precursor or a removal step, such as before the Si-precursor or a purge step. Additional pulses of plasma can be introduced in the same way. In some embodiments a plasma is ignited for an equivalent period of time in each of the pulses.

Nitrogen plasma may be generated by applying RF power of from about 10 W to about 2000 W, preferably from about 50 W to about 1000 W, more preferably from about 100 W to about 500 W in some embodiments. In some embodiments the RF power density may be from about 0.02 W/cm² to about 2.0 W/cm², preferably from about 0.05 W/cm² to about 1.5 W/cm². The RF power may be applied to nitrogen that flows during the nitrogen plasma pulse time, that flows continuously through the reaction chamber, and/or that flows through a remote plasma generator. Thus in some embodiments the plasma is generated in situ, while in other embodiments the plasma is generated remotely. In some embodiments a showerhead reactor is utilized and plasma is generated between a susceptor (on top of which the substrate is located) and a showerhead plate. In some embodiments the gap between the susceptor and showerhead plate is from about 0.1 cm to about 20 cm, from about 0.5 cm to about 5 cm, or from about 0.8 cm to about 3.0 cm.

After a time period sufficient to completely saturate and react the previously adsorbed molecular layer with the nitrogen plasma pulse, any excess reactant and reaction byproducts are removed from the reaction space. As with the removal of the first reactant, this step may comprise stopping the generation of reactive species and continuing to flow the inert gas, such as nitrogen or argon for a time period sufficient for excess reactive species and volatile reaction by-products to diffuse out of and be purged from the reaction space. In other embodiments a separate purge gas may be used. The purge may, in some embodiments, be from about 0.1 seconds to about 10 seconds, about 0.1 seconds to about 4 seconds or about 0.1 seconds to about 0.5 seconds. Together, the nitrogen plasma provision and removal represent a second, reactive species phase in a silicon nitride atomic layer deposition cycle.

The two phases together represent one ALD cycle, which is repeated to form silicon nitride thin films of a desired thickness. While the ALD cycle is generally referred to herein as beginning with the silicon phase, it is contemplated that in other embodiments the cycle may begin with the reactive species phase. One of skill in the art will recognize that the first precursor phase generally reacts with the termination left by the last phase in the previous cycle. Thus, while no reactant may be previously adsorbed on the substrate surface or present in the reaction space if the reactive species phase is the first phase in the first ALD cycle, in subsequent cycles the reactive species phase will effectively follow the silicon phase. In some embodiments one or more different ALD cycles are provided in the deposition process.

According to some embodiments of the present disclosure, PEALD reactions may be performed at temperatures ranging from about 25° C. to about 700° C., preferably from about 50° C. to about 600° C., more preferably from about 100° C. to about 450° C., and most preferably from about 200° C. to about 400° C. In some embodiments, the optimum reactor temperature may be limited by the maximum allowed thermal budget. Therefore, in some embodiments the reaction temperature is from about 300° C. to about 400° C. In some applications, the maximum temperature is around about 400° C., and, therefore the PEALD process is run at that reaction temperature.

According to some embodiments of the present disclosure, the pressure of the reaction chamber during processing is maintained at from about 0.01 torr to about 50 torr, preferably from about 0.1 torr to about 10 torr.

Si Precursors

A number of suitable silicon precursors can be used in the presently disclosed PEALD processes. At least some of the suitable precursors may have the following general formula:

$$H_{2n+2-y-z}Si_nX_yA_z \qquad (1)$$

wherein, n=1-10, y=1 or more (and up to 2n+2−z), z=0 or more (and up to 2n+2−y), X is I or Br, and A is a halogen other than X, preferably n=1-5 and more preferably n=1-3 and most preferably 1-2.

According to some embodiments, silicon precursors may comprise one or more cyclic compounds. Such precursors may have the following general formula:

$$H_{2n-y-z}Si_nX_yA_z \qquad (2)$$

wherein the formula (2) compound is cyclic compound, n=3-10, y=1 or more (and up to 2n−z), z=0 or more (and up to 2n−y), X is I or Br, and A is a halogen other than X, preferably n=3-6.

According to some embodiments, silicon precursors may comprise one or more iodosilanes. Such precursors may have the following general formula:

$$H_{2n+2-y-z}Si_nI_yA_z \qquad (3)$$

wherein, n=1-10, y=1 or more (and up to 2n+2−z), z=0 or more (and up to 2n+2−y), and A is a halogen other than I, preferably n=1-5 and more preferably n=1-3 and most preferably 1-2.

According to some embodiments, some silicon precursors may comprise one or more cyclic iodosilanes. Such precursors may have the following general formula:

$$H_{2n-y-z}Si_nI_yA_z \qquad (4)$$

wherein the formula (4) compound is a cyclic compound, n=3-10, y=1 or more (and up to 2n−z), z=0 or more (and up to 2n−y), and A is a halogen other than I, preferably n=3-6.

According to some embodiments, some silicon precursors may comprise one or more bromosilanes. Such precursors may have the following general formula:

$$H_{2n+2-y-z}Si_nBr_yA_z \qquad (4)$$

wherein, n=1-10, y=1 or more (and up to 2n+2−z), z=0 or more (and up to 2n+2−y), and A is a halogen other than Br, preferably n=1-5 and more preferably n=1-3 and most preferably 1-2.

According to some embodiments, some silicon precursors may comprise one or more cyclic bromosilanes. Such precursors may have the following general formula:

$$H_{2n-y-z}Si_nBr_yA_z \qquad (6)$$

wherein the formula (6) compound is a cyclic compound, n=3-10, y=1 or more (and up to 2n−z), z=0 or more (and up to 2n−y), and A is a halogen other than Br, preferably n=3-6.

According to some embodiments, preferred silicon precursors comprise one or more iodosilanes. Such precursors may have the following general formula:

$$H_{2n+2-y}Si_nI_y \qquad (7)$$

wherein, n=1-5, y=1 or more (up to 2n+2), preferably n=1-3 and more preferably n=1-2.

According to some embodiments, preferred silicon precursors comprise one or more bromosilanes. Such precursors may have the following general formula:

$$H_{2n+2-y}Si_nBr_y \qquad (8)$$

wherein, n=1-5, y=1 or more (up to 2n+2), preferably n=1-3 and more preferably n=1-2.

According to some embodiments of a PEALD process, suitable silicon precursors can include at least compounds having any one of the general formulas (1) through (8). In general formulas (1) through (8), halides/halogens can include F, Cl, Br and I. In some embodiments, a silicon precursor comprises $SiI_4$, $HSiI_3$, $H_2SiI_2$, $H_3SiI$, $Si_2I_6$, $HSi_2I_5$, $H_2Si_2I_4$, $H_3Si_2I_3$, $H_4Si_2I_2$, $H_5Si_2I$, or $Si_3I_8$. In some embodiments, a silicon precursor comprises one of $HSiI_3$, $H_2SiI_2$, $H_3SiI$, $H_2Si_2I_4$, $H_4Si_2I_2$, and $H_5Si_2I$. In some embodiments the silicon precursor comprises two, three, four, five or six of $HSiI_3$, $H_2SiI_2$, $H_3SiI$, $H_2Si_2I_4$, $H_4Si_2I_2$, and $H_5Si_2I$, including any combinations thereof.

In certain embodiments, the Si precursor is $H_2SiI_2$.

In some embodiments, Si precursors of formulas (9)-(28), below, can be used in PEALD processes.

N Precursors

As discussed above, the second reactant according to the present disclosure may comprise a nitrogen precursor. In some embodiments the second reactant in a PEALD process may comprise a reactive species. Suitable plasma compositions include nitrogen plasma, radicals of nitrogen, or atomic nitrogen in one form or another. In some embodiments, the reactive species may comprise N-containing plasma or a plasma comprising N. In some embodiments, the reactive species may comprise a plasma comprising N-containing species. In some embodiments the reactive species may comprise nitrogen atoms and/or N* radicals. In some embodiments, hydrogen plasma, radicals of hydrogen, or atomic hydrogen in one form or another are also provided. And in some embodiments, a plasma may also contain noble gases, such as He, Ne, Ar, Kr and Xe, preferably Ar or He, in plasma form, as radicals, or in atomic form. In some embodiments, the second reactant does not comprise any species from a noble gas, such as Ar. Thus, in some embodiments plasma is not generated in a gas comprising a noble gas.

Thus, in some embodiments the second reactant may comprise plasma formed from compounds having both N and H, such as $NH_3$ and $N_2H_4$, a mixture of $N_2/H_2$ or other precursors having an N—H bond. In some embodiments the second reactant may be formed, at least in part, from $N_2$. In some embodiments the second reactant may be formed, at least in part, from $N_2$ and $H_2$, where the $N_2$ and $H_2$ are provided at a flow ratio ($N_2/H_2$) from about 20:1 to about 1:20, preferably from about 10:1 to about 1:10, more preferably from about 5:1 to about 1:5 and most preferably from about 1:2 to about 4:1, and in some cases 1:1.

The second reactant may be formed in some embodiments remotely via plasma discharge ("remote plasma") away from the substrate or reaction space. In some embodiments, the second reactant may be formed in the vicinity of the substrate or directly above substrate ("direct plasma").

Figure 3:
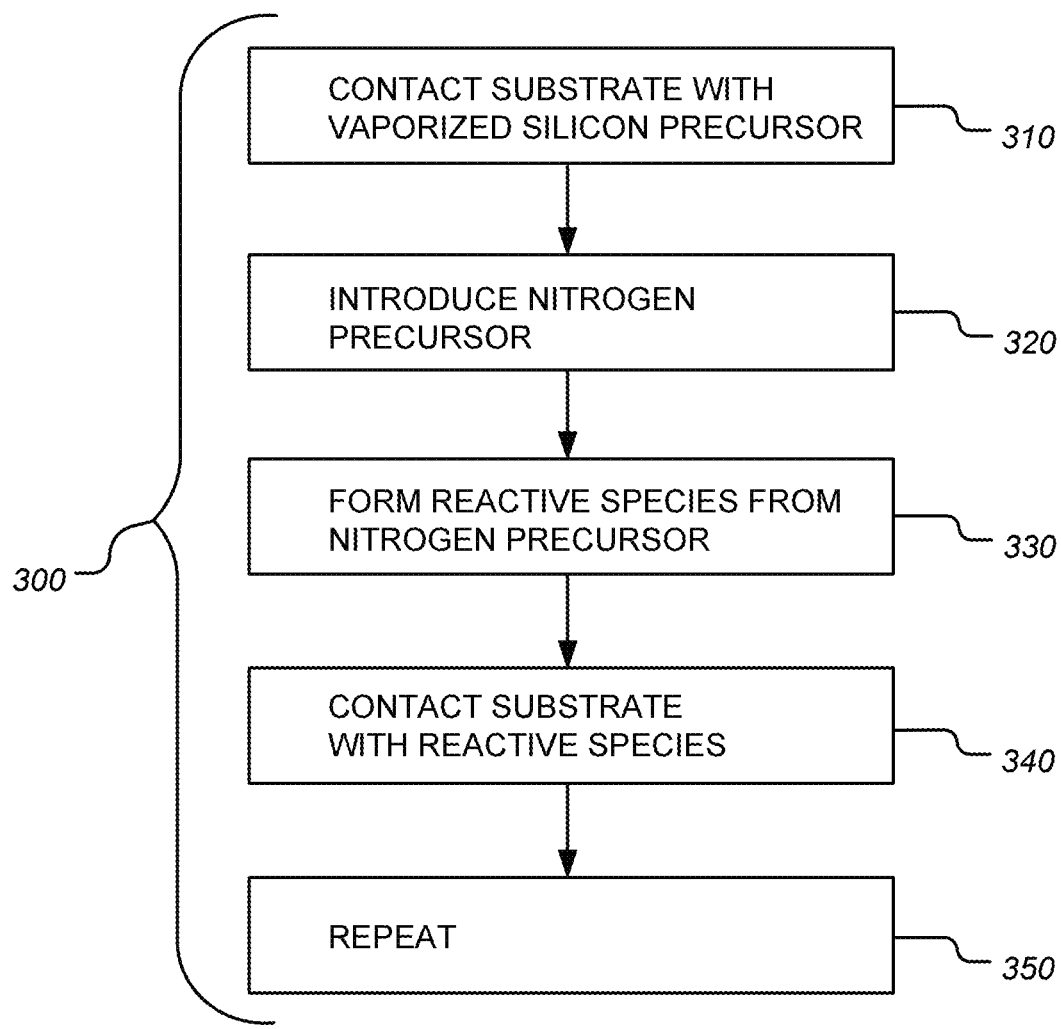
FIG. 3 is a flow chart illustrating a method of forming a silicon nitride thin film by a PEALD process in accordance with some embodiments of the present disclosure.

FIG. 3 is a flow chart generally illustrating a silicon nitride PEALD deposition cycle that can be used to deposit a silicon nitride thin film in accordance with some embodiments. According to certain embodiment, a silicon nitride thin film is formed on a substrate by a PEALD-type process comprising multiple silicon nitride deposition cycles, each silicon nitride deposition cycle 300 comprising:

(1) contacting a substrate with a vaporized silicon precursor 310 such that silicon species adsorb on the substrate surface;

(2) introduction of a nitrogen precursor into a reaction space 320;

(3) generating a reactive species from a nitrogen precursor 330; and (4) contacting the substrate with the reactive species 340, thereby converting the adsorbed silicon compound into silicon nitride.

Nitrogen may flow continuously throughout the cycle, with nitrogen plasma formed at the appropriate times to convert adsorbed silicon compound into silicon nitride.

As mentioned above, in some embodiments the substrate may be contacted simultaneously with the silicon compound and the reactive species, while in other embodiments these reactants are provided separately.

The contacting steps are repeated 350 until a thin film of a desired thickness and composition is obtained. Excess reactants may be purged from the reaction space after each contacting step, i.e., steps 310 and 340.

According to some embodiments, a silicon nitride thin film is deposited using a PEALD process on a substrate having three-dimensional features, such as in a FinFET application. The process may comprise the following steps:

(1) a substrate comprising a three-dimensional structure is provided in a reaction space;

(2) a silicon-containing precursor, such as $SiI_2H_2$, is introduced into the reaction space so that silicon-containing species are adsorbed to a surface of the substrate;

(3) excess silicon-containing precursor and reaction byproducts are removed from the reaction space;

(4) a nitrogen-containing precursor, such as $N_2$, $NH_3$, $N_2H_4$, or $N_2$ and $H_2$, is introduced into the reaction space;

(5) generating reactive species from the nitrogen precursor;

(6) contacting the substrate with the reactive species; and (7) removing excess nitrogen atoms, plasma, or radicals and reaction byproducts;

Steps (2) through (7) may be repeated until a silicon nitride film of a desired thickness is formed.

In some embodiments steps (5) and (6) are replaced by a step in which the nitrogen atoms, plasma or radicals are formed remotely and provided to the reaction space.

In some embodiments, the PEALD process is performed at a temperature between about 200° C. to about 400° C., between about 300° C. and about 400° C., or at about 400° C.

Thermal ALD Processes

The methods presented herein also allow deposition of silicon nitride films on substrate surfaces by thermal ALD processes. Geometrically challenging applications, such as 3-dimensional structures, are also possible with these thermal processes. According to some embodiments, thermal atomic layer deposition (ALD) type processes are used to form silicon nitride films on substrates such as integrated circuit workpieces.

A substrate or workpiece is placed in a reaction chamber and subjected to alternately repeated, self-limiting surface reactions. Preferably, for forming silicon nitride films each thermal ALD cycle comprises at least two distinct phases. The provision and removal of a reactant from the reaction space may be considered a phase. In a first phase, a first reactant comprising silicon is provided and forms no more than about one monolayer on the substrate surface. This reactant is also referred to herein as "the silicon precursor" or "silicon reactant" and may be, for example, $H_2SiI_2$. In a second phase, a second reactant comprising a nitrogen-containing compound is provided and reacts with the adsorbed silicon precursor to form SiN. This second reactant may also be referred to as a "nitrogen precursor" or "nitrogen reactant." The second reactant may comprise $NH_3$ or another suitable nitrogen-containing compound. Additional phases may be added and phases may be removed as desired to adjust the composition of the final film.

One or more of the reactants may be provided with the aid of a carrier gas, such as Ar or He. In some embodiments the silicon precursor and the nitrogen precursor are provided with the aid of a carrier gas.

In some embodiments, two of the phases may overlap, or be combined. For example, the silicon precursor and the nitrogen precursor may be provided simultaneously in pulses that partially or completely overlap. In addition, although referred to as the first and second phases, and the first and second reactants, the order of the phases and the order of provision of reactants may be varied, and an ALD cycle may begin with any one of the phases or any of the reactants. That is, unless specified otherwise, the reactants can be provided in any order and the process may begin with any of the reactants.

As discussed in more detail below, in some embodiments for depositing a silicon nitride film, one or more deposition cycles typically begins with provision of the silicon precursor followed by the nitrogen precursor. In some embodiments, one or more deposition cycles begins with provision of the nitrogen precursor followed by the silicon precursor.

Again, one or more of the reactants may be provided with the aid of a carrier gas, such as Ar or He. In some embodiments the nitrogen precursor is provided with the aid of a carrier gas. In some embodiments, although referred to as a first phase and a second phase and a first and second reactant, the order of the phases and thus the order of provision of the reactants may be varied, and an ALD cycle may begin with any one of the phases.

In some embodiments the substrate on which deposition is desired, such as a semiconductor workpiece, is loaded into a reactor. The reactor may be part of a cluster tool in which a variety of different processes in the formation of an integrated circuit are carried out. In some embodiments a flow-type reactor is utilized. In some embodiments a shower head type of reactor is utilized. In some embodiments a space divided reactor is utilized. In some embodiments a high-volume manufacturing-capable single wafer ALD reactor is used. In other embodiments a batch reactor comprising multiple substrates is used. For embodiments in which batch ALD reactors are used, the number of substrates is preferably in the range of 10 to 200, more preferably in the range of 50 to 150, and most preferably in the range of 100 to 130.

Exemplary single wafer reactors, designed specifically to enhance ALD processes, are commercially available from ASM America, Inc. (Phoenix, Ariz.) under the tradenames Pulsar® 2000 and Pulsar® 3000 and ASM Japan K.K (Tokyo, Japan) under the tradename Eagle® XP, XP8 and Dragon®. Exemplary batch ALD reactors, designed specifically to enhance ALD processes, are commercially available from and ASM Europe B.V (Almere, Netherlands) under the tradenames A400™ and A412™.

In some embodiments, if necessary, the exposed surfaces of the workpiece can be pretreated to provide reactive sites to react with the first phase of the ALD process. In some embodiments a separate pretreatment step is not required. In some embodiments the substrate is pretreated to provide a desired surface termination.

In some embodiments, excess reactant and reaction byproducts, if any, are removed from the vicinity of the precursor, such as from the substrate surface, between reactant pulses. In some embodiments excess reactant and reaction byproducts are removed from the reaction chamber by purging between reactant pulses, for example with an inert gas. The flow rate and time of each reactant, is tunable, as is the purge step, allowing for control of the quality and properties of the films. In some embodiments removing excess reactant and/or reaction byproducts comprises moving the substrate.

As mentioned above, in some embodiments, a gas is provided to the reaction chamber continuously during each deposition cycle, or during the entire ALD process. In other embodiments the gas may be nitrogen, helium or argon.

The ALD cycle is repeated until a film of the desired thickness and composition is obtained. In some embodiments the deposition parameters, such as the flow rate, flow time, purge time, and/or precursors themselves, may be varied in one or more deposition cycles during the ALD process in order to obtain a film with the desired characteristics.

The term "pulse" may be understood to comprise feeding reactant into the reaction chamber for a predetermined amount of time. The term "pulse" does not restrict the length or duration of the pulse and a pulse can be any length of time.

In some embodiments, the silicon precursor is provided first. After an initial surface termination, if necessary or desired, a first silicon precursor pulse is supplied to the workpiece. In accordance with some embodiments, the first precursor pulse comprises a carrier gas flow and a volatile silicon species, such as $H_2SiI_2$, that is reactive with the workpiece surfaces of interest. Accordingly, the silicon precursor adsorbs upon the workpiece surfaces. The first precursor pulse self-saturates the workpiece surfaces such that any excess constituents of the first precursor pulse do not substantially react further with the molecular layer formed by this process.

The first silicon precursor pulse is preferably supplied in gaseous form. The silicon precursor gas is considered "volatile" for purposes of the present description if the species exhibits sufficient vapor pressure under the process conditions to transport the species to the workpiece in sufficient concentration to saturate exposed surfaces.

In some embodiments the silicon precursor pulse is from about 0.05 seconds to about 5.0 seconds, about 0.1 seconds to about 3 seconds or about 0.2 seconds to about 1.0 second. In batch process the silicon precursor pulses can be substantially longer as can be determined by the skilled artisan given the particular circumstances.

After sufficient time for a molecular layer to adsorb on the substrate surface, excess first precursor is then removed from the reaction space. In some embodiments the excess first precursor is purged by stopping the flow of the first precursor while continuing to flow a carrier gas or purge gas for a sufficient time to diffuse or purge excess reactants and reactant by-products, if any, from the reaction space.

In some embodiments, the first precursor is purged for about 0.1 seconds to about 10 seconds, about 0.3 seconds to about 5 seconds or about 0.3 seconds to about 1 seconds. Provision and removal of the silicon precursor can be considered the first or silicon phase of the ALD cycle. In batch process the first precursor purge can be substantially longer as can be determined by the skilled artisan given the specific circumstances.

A second, nitrogen precursor is pulsed into the reaction space to contact the substrate surface. The nitrogen precursor may be provided with the aid of a carrier gas. The nitrogen precursor may be, for example, $NH_3$ or $N_2H_4$. The nitrogen precursor pulse is also preferably supplied in gaseous form. The nitrogen precursor is considered "volatile" for purposes of the present description if the species exhibits sufficient vapor pressure under the process conditions to transport the species to the workpiece in sufficient concentration to saturate exposed surfaces.

In some embodiments, the nitrogen precursor pulse is about 0.05 seconds to about 5.0 seconds, 0.1 seconds to about 3.0 seconds or about 0.2 seconds to about 1.0 second. In batch process the nitrogen precursor pulses can be substantially longer as can be determined by the skilled artisan given the specific circumstances.

After sufficient time for a molecular layer to adsorb on the substrate surface at the available binding sites, the second, nitrogen precursor is then removed from the reaction space. In some embodiments the flow of the second nitrogen precursor is stopped while continuing to flow a carrier gas for a sufficient time to diffuse or purge excess reactants and reactant by-products, if any, from the reaction space, preferably with greater than about two reaction chamber volumes of the purge gas, more preferably with greater than about three chamber volumes. Provision and removal of the nitrogen precursor can be considered the second or nitrogen phase of the ALD cycle.

In some embodiments, the nitrogen precursor is purged for about 0.1 seconds to about 10.0 seconds, about 0.3 seconds to about 5.0 seconds or about 0.3 seconds to about 1.0 second. In batch process the first precursor purge can be substantially longer as can be determined by the skilled artisan given the specific circumstances.

The flow rate and time of the nitrogen precursor pulse, as well as the removal or purge step of the nitrogen phase, are tunable to achieve a desired composition in the silicon nitride film. Although the adsorption of the nitrogen precursor on the substrate surface is typically self-limiting, due to the limited number of binding sites, pulsing parameters can be adjusted such that less than a monolayer of nitrogen is adsorbed in one or more cycles.

The two phases together represent one ALD cycle, which is repeated to form silicon nitrogen thin films of the desired thickness. While the ALD cycle is generally referred to herein as beginning with the silicon phase, it is contemplated that in other embodiments the cycle may begin with the nitrogen phase. One of skill in the art will recognize that the first precursor phase generally reacts with the termination left by the last phase in the previous cycle. In some embodiments one or more different ALD cycles are provided in the deposition process.

According to some embodiments of the present disclosure, ALD reactions may be performed at temperatures ranging from about 25° C. to about 1000° C., preferably from about 100° C. to about 800° C., more preferably from about 200° C. to about 650° C., and most preferably from about 300° C. to about 500° C. In some embodiments, the optimum reactor temperature may be limited by the maximum allowed thermal budget. Therefore, the reaction temperature can be from about 300° C. to about 400° C. In some applications, the maximum temperature is around about 400° C., and, therefore, the process is run at that reaction temperature.

Si Precursors

A number of suitable silicon precursors may be used in the presently disclosed thermal processes, such as thermal ALD processes. In some embodiments these precursors may also be used in plasma ALD processes in which a film with a desired quality (at least one of the desired WER, WERR, pattern loading effect or/and step coverage features described below) is deposited.

According to some embodiments, some silicon precursors comprise iodine and the film deposited by using that precursor has at least one desired property, for example at least one of the desired WER, WERR, pattern loading effect or/and step coverage features described below.

According to some embodiments, some silicon precursors comprise bromine and the film deposited by using that precursor have at least one desired property, for example at least one of the desired WER, WERR, pattern loading effect or/and step coverage features described below.

At least some of the suitable precursors may have the following general formula:

$$H_{2+2-y-z-w}Si_nX_yA_zR_w \qquad (9)$$

wherein, n=1-10, y=1 or more (and up to 2n+2-z-w), z=0 or more (and up to 2n+2-y-w), w=0 or more (and up to 2n+2-y-z), X is I or Br, A is a halogen other than X, R is an organic ligand and can be independently selected from the group consisting of alkoxides, alkylsilyls, alkyl, substituted alkyl, alkylamines and unsaturated hydrocarbon; preferably n=1-5 and more preferably n=1-3 and most preferably 1-2. Preferably R is a $C_1$-$C_3$ alkyl ligand, such as methyl, ethyl, n-propyl or isopropyl.

According to some embodiments, some silicon precursors comprise one or more cyclic compounds. Such precursors may have the following general formula:

$$H_{2n-y-z-w}Si_nX_yA_zR_w \qquad (10)$$

wherein, n=3-10, y=1 or more (and up to 2n-z-w), z=0 or more (and up to 2n-y-w), w=0 or more (and up to 2n-y-z), X is I or Br, A is a halogen other than X, R is an organic ligand and can be independently selected from the group consisting of alkoxides, alkylsilyls, alkyl, substituted alkyl, alkylamines and unsaturated hydrocarbon; preferably n=3-6. Preferably R is a $C_1$-$C_3$ alkyl ligand, such as methyl, ethyl, n-propyl or isopropyl.

According to some embodiments, some silicon precursors comprise one or more iodosilanes. Such precursors may have the following general formula:

$$H_{2n+2-y-z-w}Si_nI_yA_zR_w \qquad (11)$$

wherein, n=1-10, y=1 or more (and up to 2n+2-z-w), z=0 or more (and up to 2n+2-y-w), w=0 or more (and up to 2n+2-y-z), A is a halogen other than I, R is an organic ligand and can be independently selected from the group consisting of alkoxides, alkylsilyls, alkyl, substituted alkyl, alkylamines and unsaturated hydrocarbon; preferably n=1-5 and more preferably n=1-3 and most preferably 1-2. Preferably R is a $C_1$-$C_3$ alkyl ligand, such as methyl, ethyl, n-propyl or isopropyl.

According to some embodiments, some silicon precursors comprise one or more cyclic iodosilanes. Such precursors may have the following general formula:

$$H_{2n-y-z-w}Si_nI_yA_zR_w \quad (12)$$

wherein, n=3-10, y=1 or more (and up to 2n−z−w), z=0 or more (and up to 2n−y−w), w=0 or more (and up to 2n−y−z), A is a halogen other than I, R is an organic ligand and can be independently selected from the group consisting of alkoxides, alkylsilyls, alkyl, substituted alkyl, alkylamines and unsaturated hydrocarbon; preferably n=3-6. Preferably R is a $C_1$-$C_3$ alkyl ligand, such as methyl, ethyl, n-propyl or isopropyl.

According to some embodiments, some silicon precursors comprise one or more bromosilanes. Such precursors may have the following general formula:

$$H_{2n+2-y-z-w}Si_nBr_yA_zR_w \quad (13)$$

wherein, n=1-10, y=1 or more (and up to 2n+2−z−w), z=0 or more (and up to 2n+2−y−w), w=0 or more (and up to 2n+2−y−z), A is a halogen other than Br, R is an organic ligand and can be independently selected from the group consisting of alkoxides, alkylsilyls, alkyl, substituted alkyl, alkylamines and unsaturated hydrocarbon; preferably n=1-5 and more preferably n=1-3 and most preferably 1-2. Preferably R is a $C_1$-$C_3$ alkyl ligand, such as methyl, ethyl, n-propyl or isopropyl.

According to some embodiments, some silicon precursors comprise one or more cyclic bromosilanes. Such precursors may have the following general formula:

$$H_{2n-y-z-w}Si_nBr_yA_zR_w \quad (14)$$

wherein, n=3-10, y=1 or more (and up to 2n−z−w), z=0 or more (and up to 2n−y−w), w=0 or more (and up to 2n−y−z), A is a halogen other than Br, R is an organic ligand and can be independently selected from the group consisting of alkoxides, alkylsilyls, alkyl, substituted alkyl, alkylamines and unsaturated hydrocarbon; preferably n=3-6. Preferably R is a $C_1$-$C_3$ alkyl ligand such as methyl, ethyl, n-propyl or isopropyl.

According to some embodiments, some silicon precursors comprise one or more iodosilanes or bromosilanes in which the iodine or bromine is not bonded to the silicon in the compound. Accordingly some suitable compounds may have iodine/bromine substituted alkyl groups. Such precursors may have the following general formula:

$$H_{2n+2-y-z-w}Si_nX_yA_zR''_w \quad (15)$$

wherein, n=1-10, y=0 or more (and up to 2n+2−z−w), z=0 or more (and up to 2n+2−y−w), w=1 or more (and up to 2n+2−y−z), X is I or Br, A is a halogen other than X, R″ is an organic ligand containing I or Br and can be independently selected from the group consisting of I or Br substituted alkoxides, alkylsilyls, alkyls, alkylamines and unsaturated hydrocarbons; preferably n=1-5 and more preferably n=1-3 and most preferably 1-2. Preferably R″ is an iodine substituted $C_1$-$C_3$ alkyl ligand.

According to some embodiments, some silicon precursors comprise one or more cyclic iodosilanes or bromosilanes. Accordingly some suitable cyclic compounds may have iodine/bromine substituted alkyl groups. Such precursors may have the following general formula:

$$H_{2n-y-z-w}Si_nX_yA_zR''_w \quad (16)$$

wherein, n=3-10, y=0 or more (and up to 2n+2−z−w), z=0 or more (and up to 2n+2−y−w), w=1 or more (and up to 2n+2−y−z), X is I or Br, A is a halogen other than X, R″ is an organic ligand containing I or Br and can be independently selected from the group consisting of I or Br substituted alkoxides, alkylsilyls, alkyls, alkylamines and unsaturated hydrocarbons; preferably n=3-6. Preferably R is an iodine substituted $C_1$-$C_3$ alkyl ligand.

According to some embodiments, some suitable silicon precursors may have at least one of the following general formulas:

$$H_{2n+2-y-z-w}Si_nX_yA_z(NR_1R_2)_w \quad (17)$$

wherein, n=1-10, y=1 or more (and up to 2n+2−z−w), z=0 or more (and up to 2n+2−y−w), w=1 or more (and up to 2n+2−y−z), X is I or Br, A is a halogen other than X, N is nitrogen and $R_1$ and $R_2$ can be independently selected from the group consisting of hydrogen, alkyl, substituted alkyl, silyl, alkylsilyl and unsaturated hydrocarbon; preferably n=1-5 and more preferably n=1-3 and most preferably 1-2. Preferably $R_1$ and $R_2$ are hydrogen or $C_1$-$C_4$ alkyl groups, such as methyl, ethyl, n-propyl, isopropyl, t-butyl, isobutyl, sec-butyl and n-butyl. More preferably $R_1$ and $R_2$ are hydrogen or $C_1$-$C_3$ alkyl groups, such as methyl, ethyl, n-propyl or isopropyl. Each of the $(NR_1R_2)_w$ ligands can be independently selected from each other.

$$(H_{3-y-z-w}X_yA_z(NR_1R_2)_wSi)_3-N \quad (18)$$

wherein, y=1 or more (and up to 3−z−w), z=0 or more (and up to 3−y−w), w=1 or more (and up to 3−y−z), X is I or Br, A is a halogen other than X, N is nitrogen and $R_1$ and $R_2$ can be independently selected from the group consisting of hydrogen, alkyl, substituted alkyl, silyl, alkylsilyl, and unsaturated hydrocarbon. Preferably $R_1$ and $R_2$ are hydrogen or $C_1$-$C_4$ alkyl groups, such as methyl, ethyl, n-propyl, isopropyl, t-butyl, isobutyl, sec-butyl and n-butyl. More preferably $R_1$ and $R_2$ are hydrogen or $C_1$-$C_3$ alkyl groups, such as methyl, ethyl, n-propyl or isopropyl. Each of the $(NR_1R_2)_w$ ligands can be independently selected from each other. Each of the three $H_{3-y-z-w}X_yA_z(NR_1R_2)_wSi$ ligands can be independently selected from each other.

In some embodiments, some suitable precursors may have at least one of the following more specific formulas:

$$H_{2n+2-y-w}Si_nI_y(NR_1R_2)_w \quad (19)$$

wherein, n=1-10, y=1 or more (and up to 2n+2−w), w=1 or more (and up to 2n+2−y), N is nitrogen, and $R_1$ and $R_2$ can be independently selected from the group consisting of hydrogen, alkyl, substituted alkyl, silyl, alkylsilyl, and unsaturated hydrocarbon; preferably n=1-5 and more preferably n=1-3 and most preferably 1-2. Preferably $R_1$ and $R_2$ are hydrogen or $C_1$-$C_4$ alkyl groups, such as methyl, ethyl, n-propyl, isopropyl, t-butyl, isobutyl, sec-butyl and n-butyl. More preferably $R_1$ and $R_2$ are hydrogen or $C_1$-$C_3$ alkyl groups, such as methyl, ethyl, n-propyl or isopropyl. Each of the $(NR_1R_2)_w$ ligands can be independently selected from each other.

$$(H_{3-y-w}I_y(NR_1R_2)_wSi)_3-N \quad (20)$$

wherein, y=1 or more (and up to 3−w), w=1 or more (and up to 3−y), N is nitrogen and $R_1$ and $R_2$ can be independently selected from the group consisting of hydrogen, alkyl, substituted alkyl, silyl, alkylsilyl, and unsaturated hydrocarbon. Preferably $R_1$ and $R_2$ are hydrogen or $C_1$-$C_4$ alkyl groups, such as methyl, ethyl, n-propyl, isopropyl, t-butyl, isobutyl, sec-butyl and n-butyl. More preferably $R_1$ and $R_2$ are hydrogen or $C_1$-$C_3$ alkyl groups, such as methyl, ethyl, n-propyl or isopropyl. Each of the three $H_{3-y-w}I_y(NR_1R_2)_w$Si ligands can be independently selected from each other.

According to some embodiments, some suitable silicon precursors may have at least one of the following general formulas:

$$H_{2n+2-y-z-w}Si_nX_yA_z(NR_1R_2)_w \quad (21)$$

wherein, n=1-10, y=1 or more (and up to 2n+2−z−w), z=0 or more (and up to 2n+2−y−w), w=1 or more (and up to 2n+2−y−z), X is I or Br, A is a halogen other than X, N is nitrogen, $R_1$ can be independently selected from the group consisting of hydrogen, alkyl, substituted alkyl, silyl, alkylsilyl, and unsaturated hydrocarbon, and $R_2$ can be independently selected from the group consisting of alkyl, substituted alkyl, silyl, alkylsilyl and unsaturated hydrocarbon; preferably n=1-5 and more preferably n=1-3 and most preferably 1-2. Preferably $R_1$ is hydrogen or $C_1$-$C_4$ alkyl groups, such as methyl, ethyl, n-propyl, isopropyl, t-butyl, isobutyl, sec-butyl, and n-butyl. More preferably $R_1$ is hydrogen or $C_1$-$C_3$ alkyl groups, such as methyl, ethyl, n-propyl, or isopropyl. Preferably $R_2$ is $C_1$-$C_4$ alkyl groups, such as methyl, ethyl, n-propyl, isopropyl, t-butyl, isobutyl, sec-butyl, and n-butyl. More preferably $R_2$ is $C_1$-$C_3$ alkyl groups, such as methyl, ethyl, n-propyl, or isopropyl. Each of the $(NR_1R_2)_w$ ligands can be independently selected from each other.

$$(H_{3-y-z-w}X_yA_z(NR_1R_2)_wSi)_3\text{—N} \quad (22)$$

wherein, y=1 or more (and up to 3−z−w), z=0 or more (and up to 3−y−w), w=1 or more (and up to 3−y−z), X is I or Br, A is a halogen other than X, N is nitrogen, $R_1$ can be independently selected from the group consisting of hydrogen, alkyl, substituted alkyl, silyl, alkylsilyl, and unsaturated hydrocarbon, and $R_2$ can be independently selected from the group consisting of alkyl, substituted alkyl, silyl, alkylsilyl, and unsaturated hydrocarbon; preferably n=1-5 and more preferably n=1-3 and most preferably 1-2. Preferably $R_1$ is hydrogen or $C_1$-$C_4$ alkyl groups, such as methyl, ethyl, n-propyl, isopropyl, t-butyl, isobutyl, sec-butyl, and n-butyl. More preferably $R_1$ is hydrogen or $C_1$-$C_3$ alkyl groups, such as methyl, ethyl, n-propyl, or isopropyl. Preferably $R_2$ is $C_1$-$C_4$ alkyl groups, such as methyl, ethyl, n-propyl, isopropyl, t-butyl, isobutyl, sec-butyl, and n-butyl. More preferably $R_2$ is $C_1$-$C_3$ alkyl groups, such as methyl, ethyl, n-propyl, or isopropyl. Each of the $(NR_1R_2)_w$ ligands can be independently selected from each other.

In some embodiments, some suitable precursors may have at least one of the following more specific formulas:

$$H_{2n+2-y-w}Si_nI_y(NR_1R_2)_w \quad (23)$$

wherein, n=1-10, y=1 or more (and up to 2n+2−w), w=1 or more (and up to 2n+2−y), N is nitrogen, $R_1$ can be independently selected from the group consisting of hydrogen, alkyl, substituted alkyl, silyl, alkylsilyl, and unsaturated hydrocarbon, and $R_2$ can be independently selected from the group consisting of alkyl, substituted alkyl, silyl, alkylsilyl, and unsaturated hydrocarbon; preferably n=1-5 and more preferably n=1-3 and most preferably 1-2. Preferably $R_1$ is hydrogen or $C_1$-$C_4$ alkyl groups, such as methyl, ethyl, n-propyl, isopropyl, t-butyl, isobutyl, sec-butyl, and n-butyl. More preferably $R_1$ is hydrogen or $C_1$-$C_3$ alkyl groups, such as methyl, ethyl, n-propyl, or isopropyl. Preferably $R_2$ is $C_1$-$C_4$ alkyl groups, such as methyl, ethyl, n-propyl, isopropyl, t-butyl, isobutyl, sec-butyl, and n-butyl. More preferably $R_2$ is $C_1$-$C_3$ alkyl groups, such as methyl, ethyl, n-propyl, or isopropyl. Each of the $(NR_1R_2)_w$ ligands can be independently selected from each other.

$$(H_{3-y-w}I_y(NR_1R_2)_wSi)_3\text{—N} \quad (24)$$

wherein, y=1 or more (and up to 3−w), w=1 or more (and up to 3−y), N is nitrogen, $R_i$ can be independently selected from the group consisting of hydrogen, alkyl, substituted alkyl, silyl, alkylsilyl, and unsaturated hydrocarbon, and $R_2$ can be independently selected from the group consisting of alkyl, substituted alkyl, silyl, alkylsilyl, and unsaturated hydrocarbon; preferably n=1-5 and more preferably n=1-3 and most preferably 1-2. Preferably $R_i$ is hydrogen or $C_1$-$C_4$ alkyl groups, such as methyl, ethyl, n-propyl, isopropyl, t-butyl, isobutyl, sec-butyl, and n-butyl. More preferably $R_i$ is hydrogen or $C_1$-$C_3$ alkyl groups, such as methyl, ethyl, n-propyl, or isopropyl. Preferably $R_2$ is $C_1$-$C_4$ alkyl groups, such as methyl, ethyl, n-propyl, isopropyl, t-butyl, isobutyl, sec-butyl, and n-butyl. More preferably $R_2$ is $C_1$-$C_3$ alkyl groups, such as methyl, ethyl, n-propyl, or isopropyl. Each of the $(NR_1R_2)_w$ ligands can be independently selected from each other.

According to some embodiments of a thermal ALD process, suitable silicon precursors can include at least compounds having any one of the general formulas (9) through (24). In general formulas (9) through (18) as well as in general formulas (21) and (22), halides/halogens can include F, Cl, Br and I.

In some embodiments, a silicon precursor comprises one or more of the following: $SiI_4$, $HSiI_3$, $H_2SiI_2$, $H_3SiI$, $Si_2I_6$, $HSi_2I_5$, $H_2Si_2I_4$, $H_3Si_2I_3$, $H_4Si_2I_2$, $H_5Si_2I$, $Si_3I_8$, $HSi_2I_5$, $H_2Si_2I_4$, $H_3Si_2I_3$, $H_4Si_2I_2$, $H_5Si_2I$, $MeSiI_3$, $Me_2SiI_2$, $Me_3SiI$, $MeSi_2I_5$, $Me_2Si_2I_4$, $Me_3Si_2I_3$, $Me_4Si_2I_2$, $Me_5Si_2I$, $HMeSiI_2$, $HMe_2SiI$, $HMeSi_2I_4$, $HMe_2Si_2I_3$, $HMe_3Si_2I_2$, $HMe_4Si_2I$, $H_2MeSiI$, $H_2MeSi_2I_3$, $H_2Me_2Si_2I_2$, $H_2Me_3Si_2I$, $H_3MeSi_2I_2$, $H_3Me_2Si_2I$, $H_4MeSi_2I$, $EtSiI_3$, $Et_2SiI_2$, $Et_3SiI$, $EtSi_2I_5$, $Et_2Si_2I_4$, $Et_3Si_2I_3$, $Et_4Si_2I_2$, $EtsSi_2I$, $HEtSiI_2$, $HEt_2SiI$, $HEtSi_2I_4$, $HEt_2Si_2I_3$, $HEt_3Si_2I_2$, $HEt_4Si_2I$, $H_2EtSiI$, $H_2EtSi_2I_3$, $H_2Et_2Si_2I_2$, $H_2Et_3Si_2I$, $H_3EtSi_2I_2$, $H_3Et_2Si_2I$, and $H_4EtSi_2I$.

In some embodiments, a silicon precursor comprises one or more of the following: $EtMeSiI_2$, $Et_2MeSi$, $EtMe_2SiI$, $EtMeSi_2I_4$, $Et_2MeSi_2I_3$, $EtMe_2Si_2I_3$, $Et_3MeSi_2I_2$, $Et_2Me_2Si_2I_2$, $EtMe_3Si_2I_2$, $Et_4MeSi_2I$, $Et_3Me_2Si_2I$, $Et_2Me_3Si_2I$, $EtMe_4Si_2I$, $HEtMeSiI$, $HEtMeSi_2I_3$, $HEt_2MeSi_2I_2$, $HEtMe_2Si_2I_2$, $HEt_3MeSi_2I$, $HEt_2Me_2Si_2I$, $HEtMe_3Si_2I$, $H_2EtMeSi_2I_2$, $H_2Et_2MeSi_2I$, $H_2EtMe_2Si_2I$, $H_3EtMeSi_2I$.

In some embodiments, a silicon precursor comprises one or more of the following: $HSi_3$, $H_2SiI_2$, $H_3SiI$, $H_2Si_2I_4$, $H_4Si_2I_2$, $H_5Si_2I$, $MeSiI_3$, $Me_2SiI_2$, $Me_3Si$, $Me_2Si_2I_4$, $Me_4Si_2I_2$, $HMeSiI_2$, $H_2Me_2Si_2I_2$, $EtSiI_3$, $Et_2SiI_2$, $Et_3SiI$, $Et_2Si_2I_4$, $Et_4Si_2I_2$, and $HEtSiI_2$. In some embodiments a silicon precursor comprises two, three, four, five, six, seven, eight, nine, ten, eleven, twelve, thirteen, fourteen, fifteen, sixteen, seventeen, eighteen, nineteen or more compounds selected from $HSiI_3$, $H_2SiI_2$, $H_3SiI$, $H_2Si_2I_4$, $H_4Si_2I_2$, $H_5Si_2I$, $MeSiI_3$, $Me_2SiI_2$, $Me_3SiI$, $Me_2Si_2I_4$, $Me_4Si_2I_2$, $HMeSiI_2$, $H_2Me_2Si_2I_2$, $EtSiI_3$, $Et_2SiI_2$, $Et_3SiI$, $Et_2Si_2I_4$, $Et_4Si_2I_2$, and $HEtSiI_2$, including any combinations thereof. In certain embodiments, the silicon precursor is $H_2SiI_2$.

In some embodiments, a silicon precursor comprises a three iodines and one amine or alkylamine ligands bonded to silicon. In some embodiments silicon precursor comprises one or more of the following: (SiI$_3$)NH$_2$, (SiI$_3$)NHMe, (SiI$_3$)NHEt, (SiI$_3$)NH$^i$Pr, (SiI$_3$)NH$^t$Bu, (SiI$_3$)NMe$_2$, (SiI$_3$) NMeEt, (SiI$_3$)NMe$^i$Pr, (SiI$_3$)NMe$^t$Bu, (SiI$_3$)NEt$_2$, (SiI$_3$) NEt$^i$Pr, (SiI$_3$)NEt$^t$Bu, (Si$_3$)NiPr$_2$, (SiI$_3$)N$^i$Pr$^t$Bu, and (SiI$_3$) N$^t$Bu$_2$. In some embodiments, a silicon precursor comprises two, three, four, five, six, seven, eight, nine, ten, eleven, twelve, thirteen, fourteen, fifteen or more compounds selected from (SiI$_3$)NH$_2$, (SiI$_3$)NHMe, (SiI$_3$)NHEt, (SiI$_3$) NH$^i$Pr, (SiI$_3$)NH$^t$Bu, (SiI$_3$)NMe$_2$, (SiI$_3$)NMeEt, (SiI$_3$) NMe$^i$pr, (SiI$_3$)NMe$^t$Bu, (SiI$_3$)NEt$_2$, (SiI$_3$)NEt$^i$Pr, (SiI$_3$) NEt$^t$Bu, (SiI$_3$)N$^i$Pr$_2$, (SiI$_3$)N$^i$Pr$^t$Bu, (SiI$_3$)N$^t$Bu$_2$, and combinations thereof. In some embodiments, a silicon precursor comprises two iodines and two amine or alkylamine ligands bonded to silicon. In some embodiments, silicon precursor comprises one or more of the following: (SiI$_2$)(NH$_2$)$_2$, (SiI$_2$)(NHMe)$_2$, (SiI$_2$)(NHEt)$_2$, (SiI$_2$)(NH$_i$Pr)$_2$, (SiI$_2$)(NH$^t$Bu)$_2$, (SiI$_2$)(NMe$_2$)$_2$, (SiI$_2$)(NMeEt)$_2$, (SiI$_2$)(NMe$^i$Pr)$_2$, (SiI$_2$)(NMe$^t$Bu)$_2$, (SiI$_2$)(NEt$_2$)$_2$, (SiI$_2$)(NEt$^i$Pr)$_2$, (SiI$_2$) (NEt$^t$Bu)$_2$, (SiI$_2$)(N$^1$Pr$_2$)$_2$, (SiI$_2$)(N$^i$Pr$^t$Bu)$_2$, and (SiI$_2$) (N$^t$Bu)$_2$. In some embodiments, a silicon precursor comprises two, three, four, five, six, seven, eight, nine, ten, eleven, twelve, thirteen, fourteen, fifteen or more compounds selected from (SiI$_2$)(NH$_2$)$_2$, (SiI$_2$)(NHMe)$_2$, (SiI$_2$) (NHEt)$_2$, (SiI$_2$)(NH$^i$Pr)$_2$, (SiI$_2$)(NH$^t$Bu)$_2$, (SiI$_2$)(NMe$_2$)$_2$, (SiI$_2$)(NMeEt)$_2$, (SiI$_2$)(NMe$^i$Pr)$_2$, (SiI$_2$)(NMe$^t$Bu)$_2$, (SiI$_2$) (NEt$_2$)$_2$, (SiI$_2$)(NEt$^i$Pr)$_2$, (SiI$_2$)(NEt$^t$Bu)$_2$, (SiI$_2$)(N$^1$Pr$_2$)$_2$, (SiI$_2$)(N$^i$Pr$^t$Bu)$_2$, (SiI$_2$)(N$^t$Bu)$_2$, and combinations thereof.

In some embodiments, a silicon precursor comprises two iodines, one hydrogen and one amine or alkylamine ligand bonded to silicon. In some embodiments silicon precursor comprises one or more of the following: (SiI$_2$H)NH$_2$, (SiI$_2$H)NHMe, (SiI$_2$H)NHEt, (SiI$_2$H)NH$^i$Pr, (SiI$_2$H)NH$^t$Bu, (SiI$_2$H)NMe$_2$, (SiI$_2$H)NMeEt, (SiI$_2$H)NMe$^i$Pr, (SiI$_2$H) NMe$^t$Bu, (SiI$_2$H)NEt$_2$, (SiI$_2$H)NEt$^i$Pr, (SiI$_2$H)NEt$^t$Bu, (SiI$_2$H)NPr$_2$, (SiI$_2$H)N$^i$Pr$^t$Bu, and (SiI$_2$H)N$^t$Bu$_2$. In some embodiments a silicon precursor comprises two, three, four, five, six, seven, eight, nine, ten, eleven, twelve, thirteen, fourteen, fifteen or more compounds selected from (SiI$_2$H) NH$_2$, (SiI$_2$H)NHMe, (SiI$_2$H)NHEt, (SiI$_2$H)NH$^i$Pr, (SiI$_2$H) NH$^t$Bu, (SiI$_2$H)NMe$_2$, (SiI$_2$H)NMeEt, (SiI$_2$H)NMe$^i$Pr, (SiI$_2$H)NMe$^t$Bu, (SiI$_2$H)NEt$_2$, (SiI$_2$H)NEt$^i$Pr, (SiI$_2$H) NEt$^t$Bu, (SiI$_2$H)NPr$_2$, (SiI$_2$H)N$^i$Pr$^t$Bu, (SiI$_2$H)N$^t$Bu$_2$, and combinations thereof.

In some embodiments, a silicon precursor comprises one iodine, one hydrogen and two amine or alkylamine ligand bonded to silicon. In some embodiments, silicon precursor comprises one or more of the following: (SiIH)(NH$_2$)$_2$, (SiIH)(NHMe)$_2$, (SiIH)(NHEt)$_2$, (SiIH)(NH$^i$Pr)$_2$, (SiIH) (NH$^t$Bu)$_2$, (SiIH)(NMe$_2$)$_2$, (SiIH)(NMeEt)$_2$, (SiIH) (NMe$^i$Pr)$_2$, (SiIH)(NMe$^t$Bu)$_2$, (SiIH)(NEt$_2$)$_2$, (SiIH) (NEt$^i$Pr)$_2$, (SiIH)(NEt$^t$Bu)$_2$, (SiIH)(N$^i$Pr$_2$)$_2$, (SiIH) (N$^i$Pr$^t$Bu)$_2$, and (SiIH)(N$^t$Bu)$_2$. In some embodiments, a silicon precursor comprises two, three, four, five, six, seven, eight, nine, ten, eleven, twelve, thirteen, fourteen, fifteen or more compounds selected from (SiIH)(NH$_2$)$_2$, (SiIH)(N-HMe)$_2$, (SiIH)(NHEt)$_2$, (SiIH)(NH$^i$Pr)$_2$, (SiIH)(NH$^t$Bu)$_2$, (SiIH)(NMe$_2$)$_2$, (SiIH)(NMeEt)$_2$, (SiIH)(NMe$^i$Pr)$_2$, (SiIH) (NMe$^t$Bu)$_2$, (SiIH)(NEt$_2$)$_2$, (SiIH)(NEt$^i$Pr)$_2$, (SiIH) (NEt$^t$Bu)$_2$, (SiIH)(N$^i$Pr$_2$)$_2$, (SiIH)(N$^i$Pr$^t$Bu)$_2$, and (SiIH) (N$^t$Bu)$_2$, and combinations thereof.

In some embodiments, a silicon precursor comprises one iodine, two hydrogens and one amine or alkylamine ligand bonded to silicon. In some embodiments silicon precursor comprises one or more of the following: (SiIH$_2$)NH$_2$, (SiIH$_2$)NHMe, (SiIH$_2$)NHEt, (SiIH$_2$)NH$^i$Pr, (SiIH$_2$)NH$^t$Bu, (SiIH$_2$)NMe$_2$, (SiIH$_2$)NMeEt, (SiIH$_2$)NMe$^i$Pr, (SiIH$_2$) NMe$^t$Bu, (SiIH$_2$)NEt$_2$, (SiIH$_2$)NEt$^i$Pr, (SiIH$_2$)NEt$^t$Bu, (SiIH$_2$)N$^i$Pr$_2$, (SiIH$_2$)N$^i$Pr$^t$Bu, and (SiIH$_2$)N$^t$Bu$_2$. In some embodiments a silicon precursor comprises two, three, four, five, six, seven, eight, nine, ten, eleven, twelve, thirteen, fourteen, fifteen or more compounds selected from (SiIH$_2$) NH$_2$, (SiIH$_2$)NHMe, (SiIH$_2$)NHEt, (SiIH$_2$)NH$^i$Pr, (SiIH$_2$) NH$^t$Bu, (SiIH$_2$)NMe$_2$, (SiIH$_2$)NMeEt, (SiIH$_2$)NMe$^i$Pr, (SiIH$_2$)NMe$^t$Bu, (SiIH$_2$)NEt$_2$, (SiIH$_2$)NEt$^i$Pr, (SiIH$_2$) NEt$^t$Bu, (SiIH$_2$)NPr$_2$, (SiIH$_2$)N$^i$Pr$^t$Bu, (SiIH$_2$)N$^t$Bu$_2$, and combinations thereof.

In some embodiments, a silicon precursor comprises one iodine and three amine or alkylamine ligands bonded to silicon. In some embodiments, silicon precursor comprises one or more of the following: (SiI)(NH$_2$)$_3$, (SiI)(NHMe)$_3$, (SiI)(NHEt)$_3$, (SiI)(NH$^i$Pr)$_3$, (SiI)(NH$^t$Bu)$_3$, (SiI)(NMe$_2$)$_3$, (SiI)(NMeEt)$_3$, (SiI)(NMe$^i$Pr)$_3$, (SiI)(NMe$^t$Bu)$_3$, (SiI) (NEt$_2$)$_3$, (SiI)(NEt$^i$Pr)$_3$, (SiI)(NEt$^t$Bu)$_3$, (SiI)(N$^i$Pr$_2$)$_3$, (SiI) (N$^i$Pr$^t$Bu)$_3$, and (SiI)(N$^t$Bu)$_3$. In some embodiments a silicon precursor comprises two, three, four, five, six, seven, eight, nine, ten, eleven, twelve, thirteen, fourteen, fifteen or more compounds selected from (SiI)(NH$_2$)$_3$, (SiI)(NHMe)$_3$, (SiI)(NHEt)$_3$, (SiI)(NH$^i$Pr)$_3$, (SiI)(NH$^t$Bu)$_3$, (SiI)(NMe$_2$)$_3$, (SiI)(NMeEt)$_3$, (SiI)(NMe$^i$Pr)$_3$, (SiI)(NMe$^t$Bu)$_3$, (SiI) (NEt$_2$)$_3$, (SiI)(NEt$^i$Pr)$_3$, (SiI)(NEt$^t$Bu)$_3$, (SiI)(N$^i$Pr$_2$)$_3$, (SiI) (N$^i$Pr$^t$Bu)$_3$, (SiI)(N$^t$Bu)$_3$, and combinations thereof.

In certain embodiments, a silicon precursor comprises two iodines, hydrogen and one amine or alkylamine ligand or two iodines and two alkylamine ligands bonded to silicon and wherein amine or alkylamine ligands are selected from amine NH$_2$—, methylamine MeNH—, dimethylamine Me$_2$N—, ethylmethylamine EtMeN—, ethylamine EtNH—, and diethylamine Et$_2$N—. In some embodiments silicon precursor comprises one or more of the following: (SiI$_2$H) NH$_2$, (SiI$_2$H)NHMe, (SiI$_2$H)NHEt, (SiI$_2$H)NMe$_2$, (SiI$_2$H) NMeEt, (SiI$_2$H)NEt$_2$, (SiI$_2$)(NH$_2$)$_2$, (SiI$_2$)(NHMe)$_2$, (SiI$_2$) (NHEt)$_2$, (SiI$_2$)(NMe$_2$)$_2$, (SiI$_2$)(NMeEt)$_2$, and (SiI$_2$)(NEt$_2$)$_2$. In some embodiments a silicon precursor comprises two, three, four, five, six, seven, eight, nine, ten, eleven, twelve or more compounds selected from (SiI$_2$H)NH$_2$, (SiI$_2$H) NHMe, (SiI$_2$H)NHEt, (SiI$_2$H)NMe$_2$, (SiI$_2$H)NMeEt, (SiI$_2$H)NEt$_2$, (SiI$_2$)(NH$_2$)$_2$, (SiI$_2$)(NHMe)$_2$, (SiI$_2$)(NHEt)$_2$, (SiI$_2$)(NMe$_2$)$_2$, (SiI$_2$)(NMeEt)$_2$, (SiI$_2$)(NEt$_2$)$_2$, and combinations thereof.

Other Types of Si-Precursors Containing I or Br

A number of suitable silicon precursors containing nitrogen, such as iodine or bromine substituted silazanes, or sulphur, may be used in the presently disclosed thermal and plasma ALD processes. In some embodiments silicon precursors containing nitrogen, such as iodine or bromine substituted silazanes, may be used in the presently disclosed thermal and plasma ALD processes in which a film with desired quality is to be deposited, for example at least one of the desired WER, WERR, pattern loading effect or/and step coverage features described below.

At least some of the suitable iodine or bromine substituted silicon precursors may have the following general formula:

$$H_{2+2-y-z-w}Si_n(EH)_{n-1}X_yA_zR_w \qquad (25)$$

wherein, n=2-10, y=1 or more (and up to 2n+2−z−w), z=0 or more (and up to 2n+2−y−w), w=0 or more (and up to 2n+2−y−z), X is I or Br, E is N or S, preferably N, A is a halogen other than X, R is an organic ligand and can be independently selected from the group consisting of alkoxides, alkylsilyls, alkyl, substituted alkyl, alkylamines and unsaturated hydrocarbon; preferably n=2-5 and more preferably n=2-3 and most preferably 1-2. Preferably R is a $C_1$-$C_3$ alkyl ligand, such as methyl, ethyl, n-propyl or isopropyl.

At least some of the suitable iodine or bromine substituted silazane precursors may have the following general formula:

$$H_{2n+2-y-z-w}Si_n(NH)_{n-1}X_yA_zR_w \quad (26)$$

wherein, n=2-10, y=1 or more (and up to 2n+2−z−w), z=0 or more (and up to 2n+2−y−w), w=0 or more (and up to 2n+2−y−z), X is I or Br, A is a halogen other than X, R is an organic ligand and can be independently selected from the group consisting of alkoxides, alkylsilyls, alkyl, substituted alkyl, alkylamines and unsaturated hydrocarbon; preferably n=2-5 and more preferably n=2-3 and most preferably 2. Preferably R is a $C_1$-$C_3$ alkyl ligand, such as methyl, ethyl, n-propyl or isopropyl.

In some embodiments, the silicon precursor comprises Si-compound, such as heterocyclic Si compound, which comprises I or Br. Such cyclic precursors may comprise the following substructure:

$$\text{—Si-E-Si—} \quad (27)$$

wherein E is N or S, preferably N.

In some embodiments the silicon precursor comprises substructure according to formula (27) and example of this kind of compounds is for example, iodine or bromine substituted cyclosilazanes, such iodine or bromine substituted cyclotrisilazane.

In some embodiments, the silicon precursor comprises Si-compound, such as silylamine based compound, which comprises I or Br. Such silylamine based Si-precursors may have the following general formula:

$$(H_{3-y-z-w}X_yA_zR_wSi)_3\text{—N} \quad (28)$$

wherein, y=1 or more (and up to 3−z−w), z=0 or more (and up to 3−y−w), w=0 or more (and up to 3−y−z), X is I or Br, A is a halogen other than X, R is an organic ligand and can be independently selected from the group consisting of alkoxides, alkylsilyls, alkyl, substituted alkyl, alkylamines and unsaturated hydrocarbon. Preferably R is a $C_1$-$C_3$ alkyl ligand, such as methyl, ethyl, n-propyl or isopropyl. Each of the three $H_{3-y-z-w}X_yA_zR_wSi$ ligands can be independently selected from each other.

N Precursors

According to some embodiments, the second reactant or nitrogen precursor in a thermal ALD process may be $NH_3$, $N_2H_4$, or any number of other suitable nitrogen compounds having a N—H bond.

Figure 4:
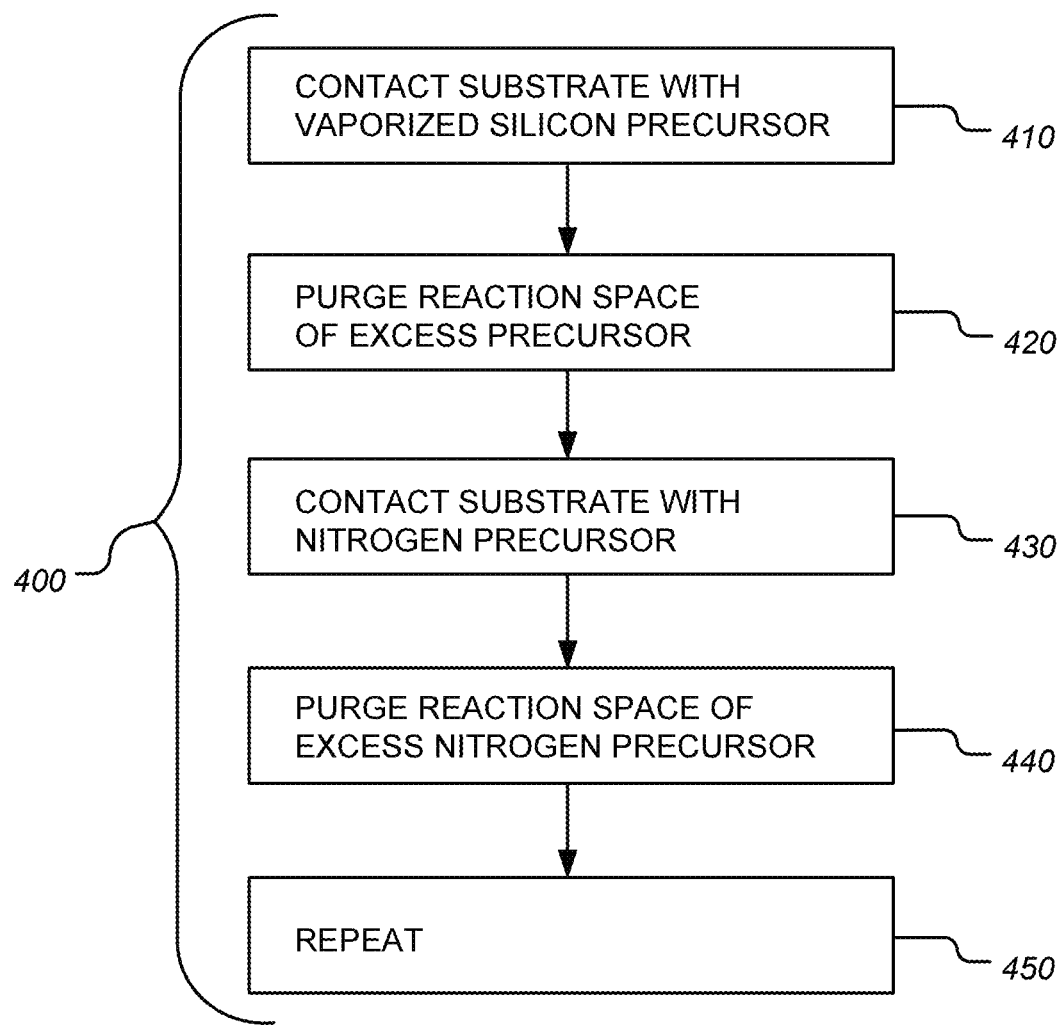
FIG. 4 is a flow chart illustrating a method of forming a silicon nitride thin film by a thermal ALD process in accordance with some embodiments of the present disclosure.

FIG. 4 is a flow chart generally illustrating a silicon nitride thermal ALD deposition cycle that can be used to deposit a silicon nitride thin film in accordance with some embodiments. According to certain embodiment, a silicon nitride thin film is formed on a substrate by an ALD-type process comprising multiple silicon nitride deposition cycles, each silicon nitride deposition cycle 400 comprising:

(1) contacting a substrate with a vaporized silicon precursor 410 such that the silicon compound adsorbs on the substrate surface;

(2) removing excess silicon precursor and any byproducts 420;

(3) contacting the substrate with a nitrogen precursor 430; and (4) removing excess nitrogen precursor and reaction byproducts 440.

The contacting steps are repeated 450 until a thin film of a desired thickness and composition is obtained. As mentioned above, in some embodiments the substrate may be contacted simultaneously with the silicon compound and the nitrogen precursor, while in other embodiments these reactants are provided separately.

According to some embodiments, a silicon nitride thin film is deposited using a thermal ALD process on a substrate having three-dimensional features, such as in a FinFET application. The process may comprise the following steps, not necessarily performed in this order:

(1) a substrate is loaded into a reaction space;

(2) a silicon-containing precursor, such as $H_2SiI_2$, is introduced into the reaction space so that the silicon-containing precursor is adsorbed to a surface of the substrate;

(3) removing excess silicon-containing precursor and reaction byproducts are removed, such as by purging;

(4) a nitrogen-containing precursor, such as $NH_3$ or $N_2H_4$, is introduced into the reaction space to react with the silicon-containing precursor on the substrate;

(5) removing excess nitrogen-containing precursor and reaction byproducts, such as by purging; and (6) steps (2) through (5) may be repeated until a silicon nitride film of a desired thickness is formed.

In some embodiments, the ALD process is performed at a temperature between about 100° C. to about 800° C. or between about 200° C. and about 600° C. or between about 300° C. to about 500° C. In some applications, the reaction temperature is about 400° C.

SiN Film Characteristics

Silicon nitride thin films deposited according to some of the embodiments discussed herein (irrespective of whether the silicon precursor contained bromine or iodine) may achieve impurity levels or concentrations below about 3 at-%, preferably below about 1 at-%, more preferably below about 0.5 at-%, and most preferably below about 0.1 at-%. In some thin films, the total impurity level excluding hydrogen may be below about 5 at-%, preferably below about 2 at-%, more preferably below about 1 at-%, and most preferably below about 0.2 at-%. And in some thin films, hydrogen levels may be below about 30 at-%, preferably below about 20 at-%, more preferably below about 15 at-%, and most preferably below about 10 at-%.

In some embodiments, the deposited SiN films do not comprise an appreciable amount of carbon. However, in some embodiments a SiN film comprising carbon is deposited. For example, in some embodiments an ALD reaction is carried out using a silicon precursor comprising carbon and a thin silicon nitride film comprising carbon is deposited. In some embodiments a SiN film comprising carbon is deposited using a precursor comprising an alkyl group or other carbon-containing ligand. In some embodiments a silicon precursor of one of formulas (9)-(28) and comprising an alkyl group is used in a PEALD or thermal ALD process, as described above, to deposit a SiN film comprising carbon. Different alkyl groups, such as Me or Et, or other carbon-containing ligands may produce different carbon concentrations in the films because of different reaction mechanisms. Thus, different precursors can be selected to produce different carbon concentration in deposited SiN films. In some embodiments the thin SiN film comprising carbon may be used, for example, as a low-k spacer. In some embodiments the thin films do not comprise argon.

Figure 5A:
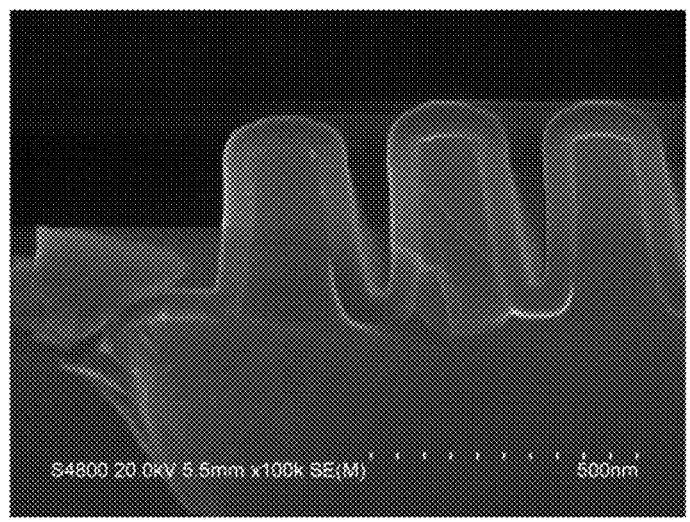
FIGS. 5A-5C illustrate field emission scanning electron microscopy (FESEM) images of various silicon nitride films deposited according to some embodiments of the present disclosure.
Figure 5B:
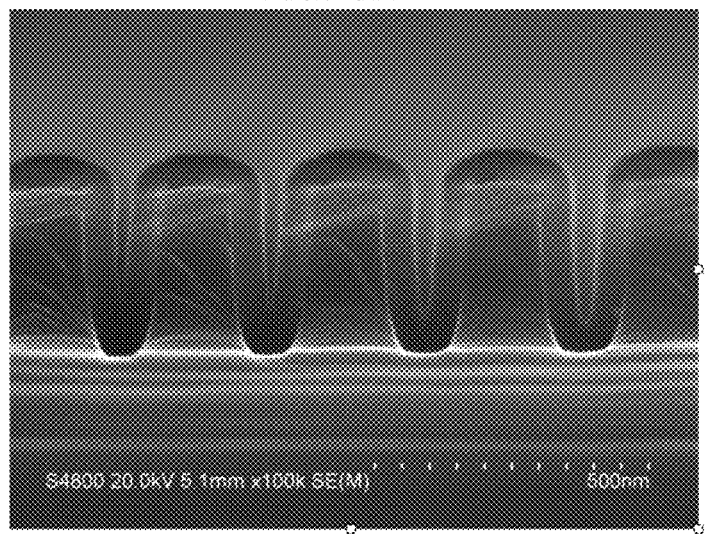
Figure 5C:
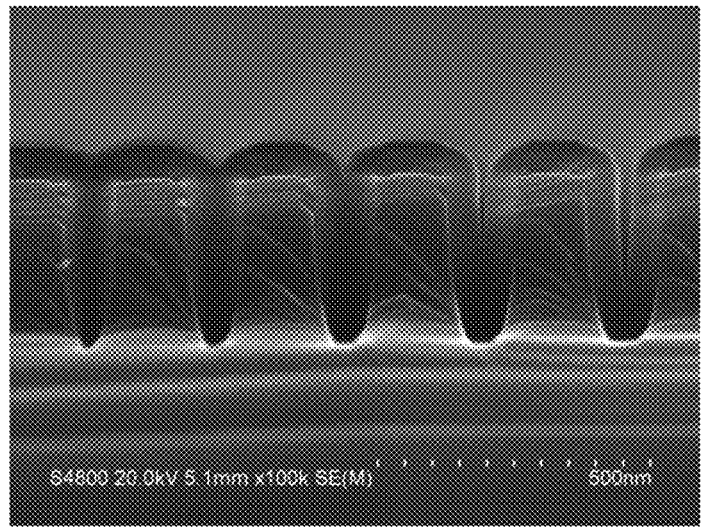
Figure 6A:
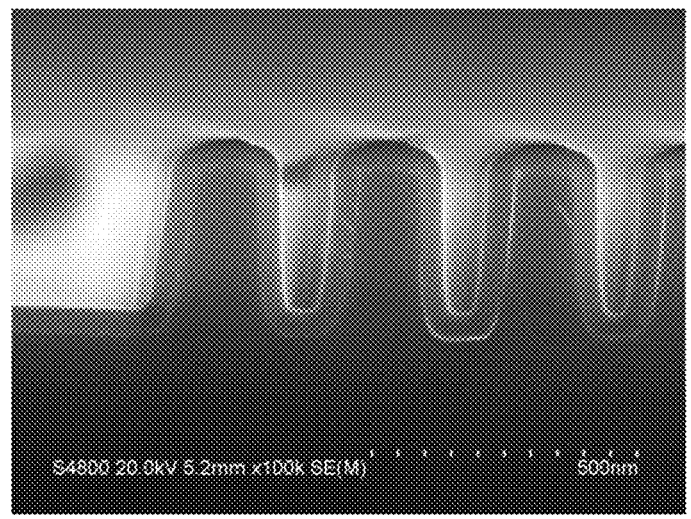
FIGS. 6A-6C illustrate FESEM images of the silicon nitride films of FIGS. 5A-5B after exposure to a 2-minute dHF dip.
Figure 6B:
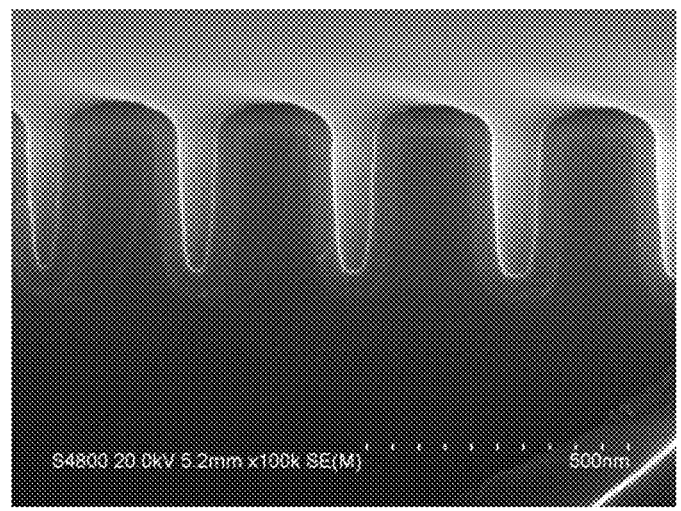
Figure 6C:
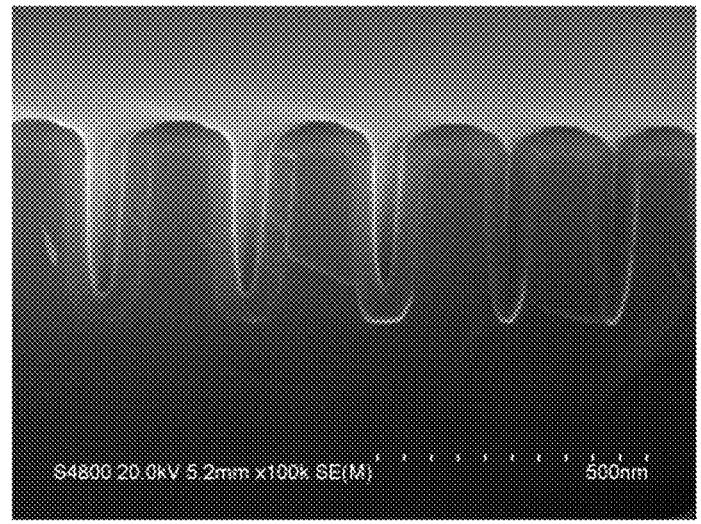

FIGS. 5A-5B show FESEM images of various silicon nitride thin films deposited according to the present disclosure. After the films were deposited, they were HF-dipped for 2 minutes. FIGS. 6A-6C show the same silicon nitride films after the dHF drip process. Uniform etching can be seen.

According to some embodiments, the silicon nitride thin films may exhibit step coverage and pattern loading effects of greater than about 50%, preferably greater than about 80%, more preferably greater than about 90%, and most preferably greater than about 95%. In some cases step coverage and pattern loading effects can be greater than about 98% and in some case about 100% (within the accuracy of the measurement tool or method). These values can be achieved in aspect ratios of more than 2, preferably in aspect ratios more than 3, more preferably in aspect ratios more than 5 and most preferably in aspect ratios more than 8.

As used herein, "pattern loading effect" is used in accordance with its ordinary meaning in this field. While pattern loading effects may be seen with respect to impurity content, density, electrical properties and etch rate, unless indicated otherwise the term pattern loading effect when used herein refers to the variation in film thickness in an area of the substrate where structures are present. Thus, the pattern loading effect can be given as the film thickness in the sidewall or bottom of a feature inside a three-dimensional structure relative to the film thickness on the sidewall or bottom of the three-dimensional structure/feature facing the open field. As used herein, a 100% pattern loading effect (or a ratio of 1) would represent about a completely uniform film property throughout the substrate regardless of features i.e. in other words there is no pattern loading effect (variance in a particular film property, such as thickness, in features vs. open field).

In some embodiments, silicon nitride films are deposited to a thicknesses of from about 3 nm to about 50 nm, preferably from about 5 nm to about 30 nm, more preferably from about 5 nm to about 20 nm. These thicknesses can be achieved in feature sizes (width) below about 100 nm, preferably about 50 nm, more preferably below about 30 nm, most preferably below about 20 nm, and in some cases below about 15 nm. According to some embodiments, a SiN film is deposited on a three-dimensional structure and the thickness at a sidewall may be slightly even more than 10 nm.

According to some embodiments silicon nitride films with various wet etch rates (WER) may be deposited. When using a blanket WER in 0.5% dHF (nm/min), silicon nitride films may have WER values of less than about 5, preferably less than about 4, more preferably less than about 2, and most preferably less than about 1. In some embodiments it could less than about 0.3.

The blanket WER in 0.5% dHF (nm/min) relative to the WER of thermal oxide may be less than about 3, preferably less than about 2, more preferably less than about 1, and most preferably less than about 0.5.

And in some embodiments, the sidewall WER of the three dimensional feature, such as fin or trench relative to the top region WER of a three dimensional feature, such as fin or trench, may be less than about 4, preferably less than about 3, more preferably less than about 2, most preferably about 1.

It has been found that in using the silicon nitride thin films of the present disclosure, thickness differences between top and side may not be as critical for some applications, due to the improved film quality and etch characteristics. Nevertheless, in some embodiments, the thickness gradient along the sidewall may be very important to subsequent applications or processes.

In some embodiments, the amount of etching of silicon nitride films according to the present disclosure may be about one or two times less than amount of etching observed for thermal $SiO_2$ (TOX) in a 0.5% HF-dip process (for example in a process in which about 2 to about 3 nm TOX is removed, one or two times less SiN is removed when deposited according to the methods disclosed herein). The WER of preferred silicon nitride films may be less than that of prior art thermal oxide films.

Specific Contexts for Use of SiN Films

The methods and materials described herein can provide films with increased quality and improved etch properties not only for traditional lateral transistor designs, with horizontal source/drain (S/D) and gate surfaces, but can also provide improved SiN films for use on non-horizontal (e.g., vertical) surfaces, and on complex three-dimensional (3D) structures. In certain embodiments, SiN films are deposited by the disclosed methods on a three-dimensional structure during integrated circuit fabrication. The three-dimensional transistor may include, for example, double-gate field effect transistors (DG FET), and other types of multiple gate FETs, including FinFETs. For example, the silicon nitride thin films of the present disclosure may be useful in nonplanar multiple gate transistors, such as FinFETs, where it may be desirable to form silicide on vertical walls, in addition to the tops of the gate, source, and drain regions.

Another 3D structure for which the SiN deposition techniques taught herein are particularly useful is a 3D elevated source/drain structure, as taught in U.S. Patent Publication No. 2009/0315120 A1 by Shifren et al., the disclosure of which is incorporated herein by reference in its entirety. Shifren et al. teach elevated source/drain structures that include vertical sidewalls.

Example 1

A silicon nitride thin film was deposited at 400° C. according to the present disclosure by a PEALD process using $H_2SiI_2$ as the silane precursor and $H_2+N_2$ plasma as the nitrogen precursor. This film exhibited a combination of some of the best qualities of both ALD reaction types: the typical high quality of PEALD SiN films and the isotropic etch behavior of thermal ALD films. While these results are not fully understood, the film properties and etch behavior were nevertheless within the specs for the high quality spacer layer application.

For this application, the step coverage and pattern loading effect on a trench structure with an aspect ratio of 2 should be over 95%, the wet etch rate (WER) should be less than 50% of the WER of thermally oxidized silicon ($SiO_2$, TOX), and the etch rate should be about the same on horizontal and vertical walls of the trench structure. Finally, the growth rate should be over 0.5 nm/min and impurity contents as low as possible.

At 400° C. the film growth rate was 0.52 Å/cycle, and the thickness non-uniformity 6.2% (1-G). The refractive index was 2.04 with a non-uniformity of 0.7% (1-G). The growth rate per minute was not yet optimized and was 0.13 nm/min.

The wet etch rate of a planar film was 1.13 nm/minute, which is 46.7% of the WER of Tox (2.43 nm/min). On a trench structure the film conformality was from about 91.0 to about 93.1% and the pattern loading effect from about 95.7 to about 99.3% % as deposited (before etching). After a 2 minute dilute (0.5%) HF etch, the conformality value was from about 91.5 to about 94.6% and the pattern loading effect from about 97.4 to about 99.5% %. The wet etch rate top region of the trench was A 4.32 nm/min, B 2.98 nm/min on the trench sidewall and C 3.03 nm/min on trench bottom. The field areas showed D 2.63 nm/min etch rate.

Without being tied to any particular theory, it is believed that it could be beneficial that the ligand removal step of iodine or bromine is completed before the plasma discharge. That can avoid leftover ligands from decomposing and re-entering the film as impurities, and in the case of halides, the formation of plasma activated halides is also avoided.

The composition of a silicon nitride thin film deposited according to the present disclosure was analyzed by HFS-RBS. The results are shown in Table 1 below. Additionally, XRR data was obtained of the same film. The thickness of the film was determined to be about 117 nm. The mass density was determined to be 2.63 (±0.1) g/cm$^3$. And the surface RMS roughness was determined to be 1.76 (±0.1) nm.

TABLE 1

Film composition measured by HFS-RBS.

| Element | Amount/atom-% | Uncertainty/atom-% |
| --- | --- | --- |
| Si | 32.7 | 1 |
| N | 48.9 | 3 |
| H | 18.3 | 2 |
| Combined impurities | ~0.15 | 0.15 |
| Max. individual impurity | 0.1 | 0.1 |

Example 2

Silicon nitride thin film with improved etch properties and impurity content (compared to example 1) were deposited in a direct plasma ALD showerhead reactor by PEALD processes according to the present disclosure. Susceptor temperatures of 200° C. and 400° C. were used. $H_2SiI_2$ was used as the silicon precursor and $H_2+N_2$ plasma was used as the nitrogen precursor. Plasma power was from about 200 W to about 220 W and the gap between the showerhead plate and susceptor (i.e. the space where plasma is generated) was 10 mm. The plasma did not contain Ar. Nitrogen was used as a carrier gas and was flowed throughout the deposition process. $H_2SiI_2$ consumption was about 9.0 mg/cycle.

At 400° C. the films growth rate was 0.7 Å/cycle and the deposited films were conformal. The refractive indexes were 1.92-1.93. The wet etch rates (WER) of planar films in 100:1 dHF were from about 20 to 30% of the WER of thermal oxide ($SiO_2$). On a trench structure the film wet etch rate ratio of trench sidewall to trench top varied from about 0.8 to about 1.0.

The impurity content of silicon nitride thin films deposited at 200° C. were analyzed by TXRF. Films contained $8.43 \times 10^{12}$ iodine atoms per cm$^2$, which is slightly less than the impurity content ($1.418 \times 10^{13}$ iodine atoms per cm$^2$) of films deposited using plasma containing Ar in addition to $H_2+N_2$ plasma. In addition, films deposited at 400° C. using Ar-containing plasma had Ar as an impurity ($8.067 \times 10^{13}$ argon atoms per cm$^2$) as evidenced by TXRF analysis. Without being tied to any particular theory, it is believed that argon could be trapped inside the film and that by using plasma that does not contain argon this can be avoided.

Plasma Treatment

As described herein, plasma treatment steps may be used in formation of a variety of materials to enhance film properties. In particular, utilization of a plasma densification step, for example using a nitrogen plasma, may enhance the properties of nitride films, such as SiN films. In some embodiments, a process for forming SiN films comprises depositing the SiN and treating the deposited SiN with a plasma treatment. In some embodiments, the SiN is deposited by a thermal ALD process, and subsequently subjected to a plasma treatment. For example, SiN may be deposited by a thermal ALD process comprising a plurality of deposition cycles comprising a first phase in which a substrate is contacted with a silicon precursor such that silicon species are adsorbed onto a surface of the substrate, and a second phase in which the silicon species adsorbed onto the substrate surface are contacted with a nitrogen precursor. As discussed herein, the SiN deposited by the thermal ALD process may be subject to a plasma treatment, for example after each deposition cycle, at intervals during the deposition process or following completion of the SiN deposition process. In some embodiments, SiN is deposited by a PEALD process. In some embodiments, a PEALD deposition process comprises a first phase and a second phase. For example, a first phase of a SiN PEALD process may comprise contacting a target substrate with a silicon precursor such that silicon species are adsorbed onto a surface of the target substrate and a second phase of the SiN PEALD process may comprise contacting the silicon species adsorbed onto the surface of the target substrate with a plasma comprising nitrogen in order to form SiN. In this part of the deposition process, the plasma may comprise hydrogen ions. For example, a PEALD silicon nitride deposition cycle may include contacting the target substrate with a silicon precursor, such as those described herein, and an activated nitrogen precursor, for example a plasma of nitrogen and hydrogen gas. The target substrate may be exposed to activated hydrogen containing species (e.g., $H^+$ and/or $H_{3+}$ ions) in this step, which may, for example, facilitate the surface reactions. However, it has been found that while exposure of silicon nitride film to activated hydrogen containing species may facilitate deposition of silicon nitride films (e.g., facilitate one or more surface reactions for conformal deposition of silicon nitride films), such exposure may result in formation of one or more defects, such as delamination of the film and/or formation of blister defects in the silicon nitride film. Thus, in some embodiments the first plasma step in the PEALD silicon nitride deposition cycle (also referred to as a nitrogen plasma precursor step) is carried out at a plasma power and duration that is low enough to avoid significant defect formation or delamination.

In some embodiments, subsequent to deposition of SiN by PEALD, a second plasma treatment step is carried out. The second plasma treatment step may be carried out after each PEALD cycle, at intervals during SiN deposition, or after the PEALD SiN deposition process is complete. The second plasma treatment step may be a nitrogen plasma treatment step. The second plasma step may, for example, lead to densification of the deposited SiN film or otherwise improve film properties. Thus, the second nitrogen plasma treatment step may also be referred to as a densification step. The plasma power and/or duration may be greater in the densification step (second nitrogen plasma treatment step) than in the first nitrogen plasma precursor step, as discussed in more detail below. Importantly, the second nitrogen plasma treatment step does not include provision of energetic hydrogen species, such as $H^+$ or $H_{3+}$. The densification step may be carried out after every cycle of a PEALD process, or after various intervals of the PEALD deposition process, as discussed in more detail below.

Thus, in some embodiments, one or more silicon nitride film deposition cycles can be followed by a nitrogen plasma treatment. Utilizing the nitrogen plasma treatment may facilitate formation of silicon nitride films having certain desired characteristics while reducing or avoiding formation of defects such as silicon nitride film delamination and/or formation of blister defects in the silicon nitride film. Use of a nitrogen plasma treatment may allow for the use of activated hydrogen containing species in the deposition of the silicon nitride films for conformal deposition of silicon nitride films, while obtaining a film that exhibits desired characteristics such as desired wet etch rates (e.g., wet etch rates in dilute HF), and without introducing significant defects in the film. Without being limited by any particular theory or mode of operation, application of a nitrogen plasma treatment may increase a density of the silicon nitride film formed by the silicon nitride film deposition cycles. In some embodiments, application of a nitrogen plasma treatment can facilitate formation of a silicon nitride film which demonstrates increased resistance to wet etch (e.g., as compared to silicon nitride films formed without a nitrogen plasma treatment, in which the top layer may be easily oxidized and demonstrate similar WERR as that of thermal silicon oxide). In some embodiments, application of a nitrogen plasma treatment can facilitate formation of a silicon nitride film having increased etch rate uniformity of horizontal surfaces relative to vertical surfaces on 3-D features, decreased wet etch rate (WER), and/or decreased wet etch rate ratio (WERR) relative to thermal oxide (TOX).

In some embodiments, a silicon nitride thin film formed on 3-D features according to one or more processes described herein can demonstrate a ratio of a wet etch rate (WER) of the silicon nitride thin film on the sidewalls of the 3-D features to a wet etch rate (WER) of the silicon nitride thin film on the top regions of the 3-D features of less than about 1 in 0.5% dHF. In some embodiments, the ratio is about 0.75 to about 1.5 in 0.5% dHF, and in some embodiments may be about 0.9 to about 1.1.

In some embodiments, utilizing a nitrogen plasma treatment may facilitate formation of silicon nitride films useful in applications such as sacrificial layers, gate spacers and/or spacer defined double/quadruple patterning (SDDP/SDQP) in state-of-the-art semiconductor devices such as FiNFETs and other multigate transistors.

Although embodiments described herein refer to PEALD deposition of silicon nitride films, it will be understood that other deposition techniques may also be applicable (e.g., thermal ALD, and/or radical enhanced ALD). Further, the nitrogen plasma treatment may be applied to the deposition of other materials (e.g., metallic materials, dielectric materials, and/or other nitride materials, such as titanium nitride (TiN)).

Figure 7:
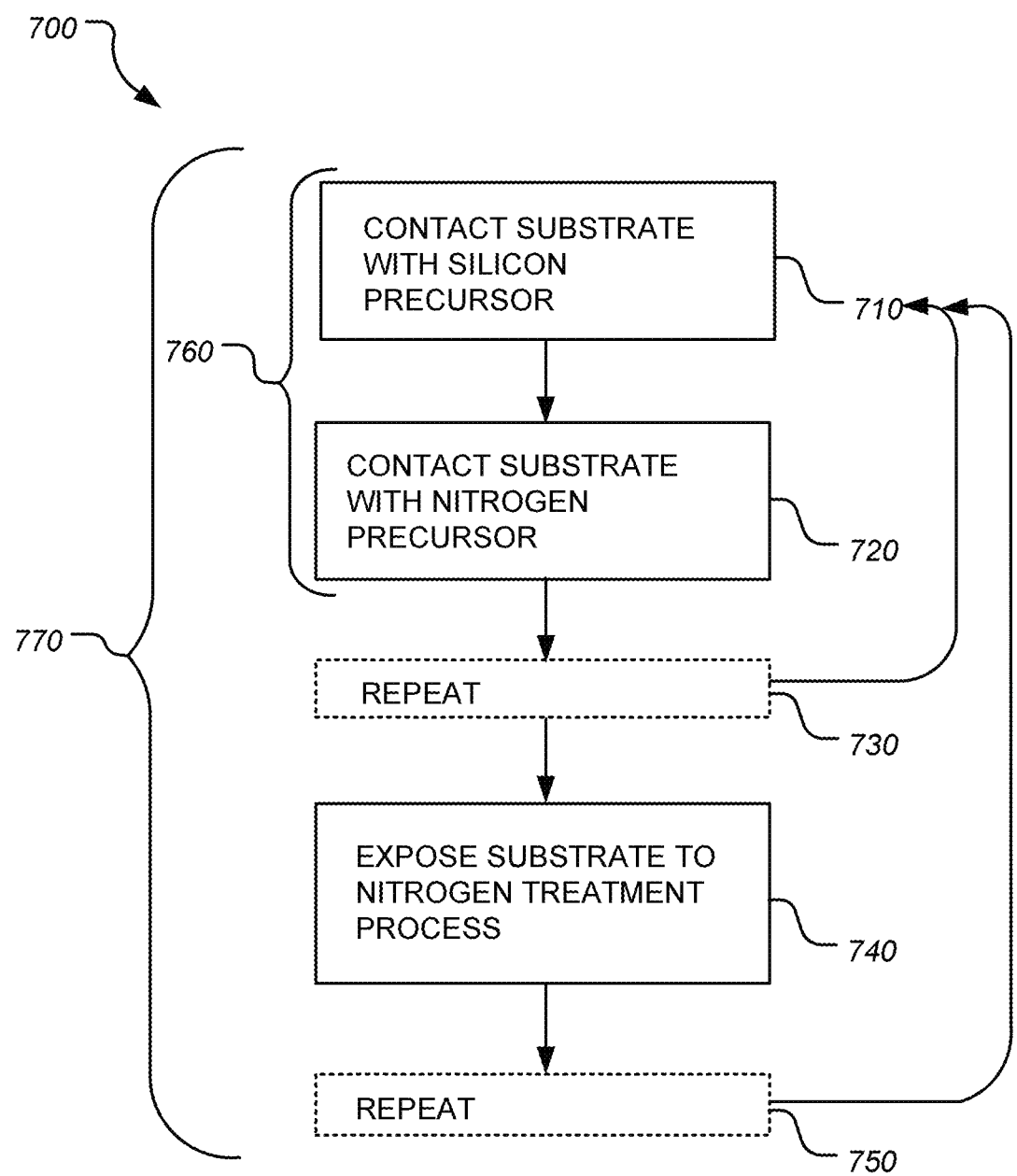
FIG. 7 is a flow chart generally illustrating a method of forming a silicon nitride film by a PEALD process in combination with a nitrogen plasma treatment.

FIG. 7 is a flow chart 700 generally illustrating an example of a silicon nitride film formation process 770 comprising a silicon nitride PEALD deposition process 760 followed by a nitrogen plasma treatment 740 in accordance with some embodiments. As described herein, a silicon nitride film deposition process 760 can include one or more cycles 730 of contacting a target substrate with one or more silicon precursors 710 (e.g., a silicon precursor step), followed by contacting the target substrate with one or more nitrogen precursors 720 (e.g., a nitrogen precursor step). In some embodiments the nitrogen precursor is a nitrogen plasma that may include activated hydrogen species.

Exposing the target substrate to a nitrogen plasma treatment 740 can follow one or more cycles 730 of contacting a target substrate with one or more silicon precursors 710 and contacting the target substrate with one or more nitrogen precursors 720. The nitrogen plasma treatment 740 can be carried out after each deposition cycle 730, or intermittently throughout the deposition process, for example every 2, 3, 4, 5, 6, 7 etc. . . . cycles.

In some embodiments, the silicon nitride deposition process 760 is followed by exposing the target substrate to a nitrogen plasma treatment 740 and that process is repeated 750 a number of times. For example, a complete silicon nitride film formation process 770 can include a number of cycles 730 of contacting a target substrate with one or more silicon precursors 710 and contacting the target substrate with one or more nitrogen precursors 720, followed by exposing the target substrate to a nitrogen plasma treatment 740.

According to certain embodiments, a process for forming a silicon nitride film on a substrate in a reaction space comprises a number of repetitions of the following steps:

(1) a silicon-containing precursor, such as $SiI_2H_2$, is introduced into the reaction space so that silicon-containing species is adsorbed to a surface of the substrate;

(2) excess silicon-containing precursor and/or reaction byproducts are removed from the reaction space, if any;

(3) a nitrogen-containing precursor, such as $N_2$, $NH_3$, $N_2H_4$, or $N_2$ and $H_2$, is introduced into the reaction space;

(4) generating reactive species from the nitrogen precursor;

(5) contacting the substrate with the reactive species; and (6) removing excess nitrogen atoms, plasma, or radicals and/or reaction byproducts, if any;

(7) applying to the substrate a nitrogen plasma treatment

Steps (1) through (6) may be repeated until a silicon nitride film of a desired thickness is formed.

In some embodiments, step (6) is not performed prior to application of the nitrogen plasma treatment. For example, contacting the substrate with reactive species generated from the nitrogen precursor may be followed by application of the nitrogen plasma treatment without or substantially without a purge process, such that a residual amount of one or more reactive species from the nitrogen precursor step may be present in the nitrogen plasma treatment. For example, a residual amount of hydrogen species may be present.

In some embodiments steps (4) and (5) are replaced by a step in which the nitrogen atoms, plasma or radicals are formed remotely and provided to the reaction space.

Figure 8:
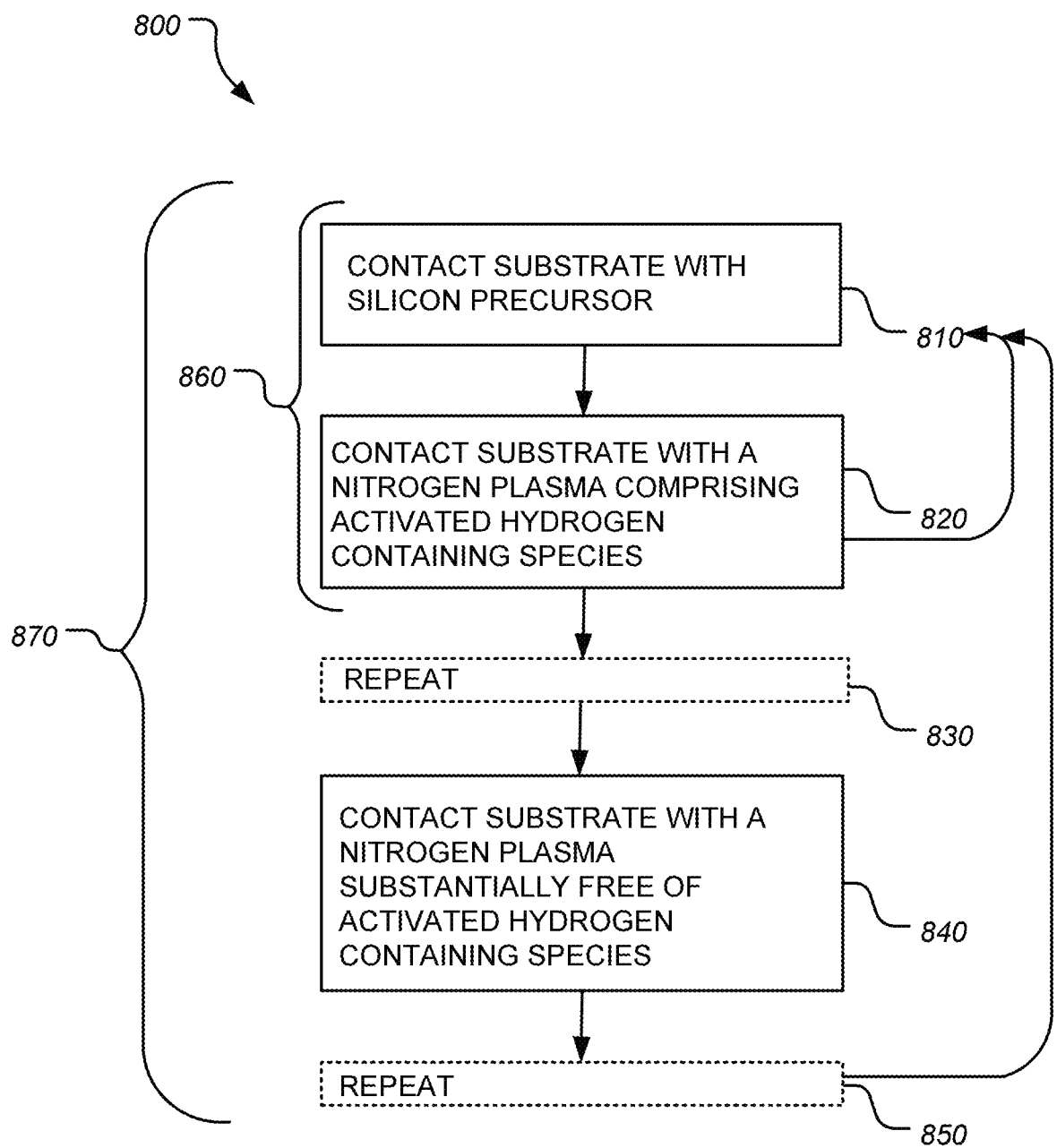
FIG. 8 is a flow chart generally illustrating another example of a method of forming a silicon nitride film by a PEALD process in combination with a nitrogen plasma treatment.

FIG. 8 is a flow chart 800 generally illustrating another example of a silicon nitride film formation process 870 comprising a silicon nitride PEALD deposition process 860 followed by a nitrogen plasma treatment 840 in accordance with some embodiments. As described herein, a silicon nitride film deposition process 860 can include one or more cycles 830 of contacting a target substrate with one or more silicon precursors 810 followed by contacting the target substrate with a nitrogen plasma comprising activated hydrogen containing species (e.g., as part of a step for contacting the substrate with one or more nitrogen precursors) 820.

Contacting the target substrate with a nitrogen plasma free or substantially free of activated hydrogen containing species (e.g., as a part of a nitrogen plasma treatment) 840 can follow one or more cycles 830 of contacting the target substrate with the one or more silicon precursors 810 and contacting the target substrate with the nitrogen plasma comprising activated hydrogen containing species 820. Contacting the target substrate with the nitrogen plasma free or substantially free of activated hydrogen containing species 840 can be carried out after each deposition cycle 830, or intermittently throughout the deposition process, for example every 2, 3, 4, 5, 6, 7 etc. . . . cycles.

In some embodiments, the silicon nitride deposition process 860 followed by contacting the target substrate with a nitrogen plasma that is free or substantially free of activated hydrogen species 840 can be repeated 850 a number of times. For example, a complete silicon nitride film formation process 870 can include a number of cycles of the silicon nitride deposition process 860 followed by contacting the target substrate with a nitrogen plasma free or substantially free of activated hydrogen containing species 840.

As described herein, the PEALD process may be performed at a temperature between about 200° C. to about 400° C., between about 300° C. and about 400° C., or at about 400° C.

In some embodiments, the nitrogen plasma treatment can comprise contacting the substrate with a plasma formed from a reactant that includes nitrogen and one or more inert gases. For example, the nitrogen plasma treatment can include contacting the substrate with a plasma formed from nitrogen ($N_2$) and one or more noble gases, such as argon (Ar). The nitrogen plasma treatment may comprise a direct plasma process. For example, one or more cycles of a PEALD silicon nitride deposition process may be followed by a nitrogen plasma treatment. One or more cycles of a PEALD silicon nitride deposition process comprising a plasma nitrogen precursor step can be combined with a nitrogen plasma treatment to facilitate formation of a conformal silicon nitride film having desired chemical and/or physical properties (e.g., desired wet etch characteristics and free or substantially free from delamination defects).

In some embodiments, the nitrogen plasma treatment does not include a significant quantity of activated hydrogen containing species (e.g., hydrogen ions (H+)). In some embodiments, the nitrogen plasma treatment can be free or substantially free of activated hydrogen containing species. In some embodiments, the nitrogen treatment can include a residual amount of activated hydrogen containing species remaining from a previous process performed in the reaction chamber, such as from a cycle in a silicon nitride deposition process for contacting the target substrate with nitrogen precursors (e.g., a nitrogen precursor step). As described herein, in some embodiments a purge process may not be performed prior to the nitrogen plasma treatment, such that some amount of hydrogen containing species remains in the reaction chamber. For example, the nitrogen plasma treatment may not supply a hydrogen containing component to the reaction chamber but some quantity of hydrogen containing species from a previous process step may remain in the process chamber during at least a portion of the nitrogen plasma treatment.

In some embodiments, plasma power in a PEALD process for depositing silicon nitride is sufficiently low to reduce or avoid formation of film defects and/or delamination. However, the plasma power may be higher in the nitrogen plasma treatment. Thus, in some embodiments, a plasma power used in a nitrogen plasma treatment is greater than or equal to that used in a PEALD process for depositing silicon nitride (e.g., a nitrogen precursor step of the PEALD process). For example, in a PEALD cycle for forming SiN, a plasma may be formed with a gas comprising nitrogen and hydrogen using a reduced plasma power, while in a nitrogen plasma treatment free of or comprising only a residual amount of hydrogen containing species, a relatively higher plasma power may be used. In some embodiments, a plasma power applied during the nitrogen plasma treatment is up to about 900% that of a plasma power applied during a PEALD process for forming SiN where activated hydrogen species are formed (e.g., during a nitrogen precursor step of the PEALD process). In some embodiments, a plasma power for the nitrogen plasma treatment is preferably up to about 400% that of the plasma power used in the nitrogen precursor step, more preferably about 100% to about 250% that of the plasma power used in the nitrogen precursor step, and most preferably about 100% to about 200% that of the plasma power used in the nitrogen precursor step.

In some embodiments, a plasma power used in a nitrogen plasma treatment is less than that used in a nitrogen precursor step. For example, a plasma power used in the nitrogen plasma treatment can be between about 50% and 100% of a plasma power used in the nitrogen precursor step.

Plasma power used in a PEALD silicon nitride deposition process can depend on various factors, including a geometry of structures and/or material of the target substrate on which the silicon nitride is deposited. As described herein, plasma power used in a cycle of PEALD silicon nitride deposition may be about 50 Watts (W) to about 600 W (e.g., in a reaction chamber configured for processing a 300 millimeter (mm) wafer substrate), including for example from about 100 W to about 300 W, and from about 150 W to about 250 W. As described herein, a plasma power applied during a nitrogen plasma treatment may be greater than or equal to a plasma power applied during the nitrogen precursor step, including for example, about 100 W to about 1000 W, preferably about 125 W to about 600 W, more preferably about 150 W to about 300 W. In some embodiments, a power density of a plasma applied during a nitrogen plasma treatment (e.g., in a reaction chamber configured for processing a 300 millimeter (mm) wafer substrate) can be about 0.07 Watts per cubic centimeter ($W/cm^3$) to about 70 $W/cm^3$, preferably about 0.08 $W/cm^3$ to about 0.4 $W/cm^3$, and more preferably about 0.1 $W/cm^3$ to about 0.2 $W/cm^3$.

A duration of the nitrogen plasma treatment can be selected to obtain desired results. In some embodiments the duration is based, in part, on a thickness of the silicon nitride film being treated. For example, a shorter nitrogen plasma treatment can be used in the nitrogen plasma treatment applied after each PEALD cycle, while a longer nitrogen plasma treatment can be used when the nitrogen plasma treatment is applied less frequently.

As described herein, a silicon nitride formation process may include a plurality of deposition cycles for depositing the silicon nitride film and one or more nitrogen plasma treatments steps, where each deposition cycle can include a silicon precursor step followed by a nitrogen precursor step. In some embodiments, a cycle including a plurality of deposition cycles (e.g., a deposition cycle including a silicon precursor step followed by nitrogen precursor step) and one or more nitrogen plasma treatment steps, can be repeated a number of times. In some embodiments, a plurality of deposition cycles can be repeated to achieve a desired silicon nitride film thickness, which then can be followed by one or more nitrogen plasma treatment steps.

In some embodiments, a total duration of the nitrogen precursor steps in PEALD silicon nitride film deposition is greater than or equal to the total duration of the nitrogen plasma treatments. A total duration of the nitrogen plasma treatment can be a sum of the lengths of all nitrogen plasma treatments performed in the silicon nitride film formation process, and a total duration of the nitrogen precursor step can be the sum all lengths of nitrogen precursor steps performed in the silicon nitride film formation process.

A duration of nitrogen precursor steps (e.g., plasma processes including activated hydrogen species, such as $H^+$ ions) may be selected to achieve desired film growth and/or desired conformal deposition of the film, while reducing or avoiding formation of film defects (e.g., blister defects). In some embodiments, a duration of a nitrogen precursor step can depend on a magnitude of the plasma power used in the nitrogen precursor step, and/or a duration in which the plasma power is applied. In some embodiments, a larger plasma power may be applied for a shorter duration to facilitate formation of silicon nitride films without or substantially without blistering and/or delamination. For example, without being limited to any particular theory or mode of operation, an increase in plasma power applied and/or duration of the nitrogen precursor step, may contribute to formation of film defects such as blistering and/or delamination. For example, a 6 seconds plasma duration for a nitrogen precursor step at a power of about 200 W may produce no or substantially no blisters, while a 8 seconds duration with the same plasma power of about 200 W has may result in formation of blisters. For example, a 6 seconds plasma duration at a power of about 400 W may result in formation of blisters.

In some embodiments, a nitrogen precursor step comprising hydrogen can have a plasma energy in Watts (W) multiplied by the plasma duration in seconds (s) of less than about 5000 W*s, preferably less than about 2500 W*s and most preferably less than about 1000 W*s.

In some embodiments, a nitrogen plasma treatment of a silicon nitride deposition process can have a total duration of about 1% to about 100% the total duration in which activated hydrogen containing species are provided in the nitrogen precursor step, preferably about 5% to about 75% that of the total duration in which activated hydrogen containing species are provided of in the nitrogen precursor step, and more preferably about 10% to about 50%.

In one embodiment, a nitrogen plasma treatment of a silicon nitride deposition process can have a total duration of about 40% of the total duration of the nitrogen precursor step in which activated hydrogen containing species are provided. For example, a silicon nitride deposition process can include twenty-five cycles of a silicon precursor step followed by a nitrogen precursor step, each cycle including 6 seconds of the nitrogen precursor step in which activated hydrogen containing species are provided, providing a silicon nitride process including 150 seconds total of nitrogen precursor steps in which activated hydrogen containing species are provided. The total duration of the nitrogen plasma treatment that is 40% of the nitrogen precursor step in which activated hydrogen containing species are provided can be about 60 seconds.

The frequency with which the target substrate is exposed to the nitrogen plasma treatment can be selected to achieve desired final film characteristics. For example, one or more nitrogen plasma treatments can follow a number of repetitions of cycles in which the target substrate is exposed to one or more silicon precursors followed by nitrogen precursors for silicon nitride film growth. In some embodiments, cycles of exposing the target substrate to one or more silicon precursors followed by nitrogen precursors can be repeated twenty-five times, before each nitrogen plasma treatment. For example, a nitrogen plasma treatment can follow every repetition of twenty-five cycles of exposing the target substrate to one or more silicon precursors followed by nitrogen precursors. In some embodiments, a nitrogen plasma treatment can follow every repetition of fifty cycles of exposing the target substrate to one or more silicon precursors followed by nitrogen precursors. In some embodiments, a nitrogen plasma treatment can follow every repetition of one hundred cycles of exposing the target substrate to one or more silicon precursors followed by nitrogen precursors.

Without being limited by any particular theory or mode of operation, a plasma nitrogen treatment can be applied for densification of the silicon nitride film, such as through ion bombardment of the silicon nitride film. For example, increased exposure of the silicon film to the plasma during the nitrogen plasma treatment can increase the dose of ion bombardment, increasing the film densification. A nitrogen plasma treatment free or substantially free of hydrogen may facilitate use of increased plasma power while facilitating formation of silicon nitride films without or substantially without delamination defects. Meanwhile, hydrogen containing species may be used in a silicon nitride growth cycle to facilitate surface reactions and/or conformal deposition of the silicon nitride film. A densified silicon nitride film can demonstrate decreased wet etch rate and/or increased wet etch uniformity, including for example increased uniformity in etch rates of features on a vertical surface and horizontal surface of 3-D features.

In some embodiments, a process for providing —NH surface functional groups can be performed subsequent to a nitrogen plasma treatment. Without being limited by any particular theory or mode of operation, a quantity of —NH surface functional groups for silicon nitride film growth may be removed by ion bombardment of the target substrate surface occurring during a nitrogen plasma treatment. A process for providing —NH surface functional groups can be performed subsequent to a nitrogen plasma treatment to provide the target substrate surface —NH functional groups which have been removed during the nitrogen plasma treatment. In some embodiments, the process for providing the surface —NH functional groups can comprise a plasma process, and one or more nitrogen containing and hydrogen containing components. In some embodiments, a process for providing surface —NH groups can be the same as a process for providing nitrogen precursors. For example, the plasma process for providing —NH surface functional groups can comprise exposing the target substrate to plasma generated in nitrogen containing gas. In some embodiments, the plasma may contain hydrogen as well, such as to provide activated hydrogen containing and nitrogen containing species. For example, a process similar to or the same as a nitrogen precursor step of a PEALD silicon nitride process can be performed subsequent to a nitrogen plasma treatment for providing —NH surface functional groups.

Examples of Nitrogen Treatment Process Combined with PEALD Silicon Nitride Deposition Example 1

Two examples of a cycle of silicon nitride film formation processes are provided below. Each process includes a combination of a PEALD silicon nitride deposition process with a nitrogen plasma treatment, and wet etch performance of silicon nitride films formed using each sequence is graphed in FIG. 9, as discussed below.

Example a)

A cycle of a silicon nitride film formation process included exposing a target substrate to plasma for a total of 18 seconds: exposing a target substrate for 2 seconds to a silicon precursor, followed by exposing the target substrate for 6 seconds to plasma generated for nitrogen precursors by nitrogen ($N_2$) and hydrogen ($H_2$) at a power of about 50 W, followed by exposing the target substrate for 6 seconds to a plasma generated by nitrogen ($N_2$) and argon (Ar) for a nitrogen plasma treatment at a plasma power of about 200 W, and followed by exposing the target substrate for 6 seconds to the plasma generated from nitrogen ($N_2$) and hydrogen ($H_2$) at a plasma power of about 50 W (e.g., for providing —NH surface functional groups to the target substrate surface).

Example b)

A cycle of a silicon nitride film formation process included exposing a target substrate to plasma for a total of 30 seconds: exposing a target substrate for 2 seconds to a silicon precursor, followed by exposing the target substrate for 12 seconds to plasma generated for nitrogen precursors using nitrogen ($N_2$) and hydrogen ($H_2$) at a power of about 50 W, followed by exposing the target substrate for 6 seconds to a plasma generated by nitrogen ($N_2$) and argon (Ar) for a nitrogen plasma treatment at a plasma power of about 200 W, and followed exposing the target substrate for 12 seconds to the plasma generated from nitrogen ($N_2$) and hydrogen ($H_2$) at a plasma power of about 50 W (e.g., for providing —NH surface functional groups to the target substrate surface).

Each of the example cycles were repeated for a number of times to obtain a desired silicon nitride film thickness and achieve a silicon nitride film having desired properties. A purge process prior to performing the nitrogen plasma treatment and subsequent to the step for contacting the target substrate with the nitrogen precursor was omitted, while purge processes were performed between silicon precursor and nitrogen precursor steps.

It was found that silicon nitride film formed using cycles of both examples provided films free or substantially free of blister and/or film delamination defects. The silicon nitride film growth rate per cycle for both examples was around 0.2 angstroms per cycle (A/c), demonstrating that surface reaction for film growth was saturated for the cycle including 12 seconds total of nitrogen ($N_2$) and hydrogen ($H_2$) 50 W process. Without being limited by any theory or mode of operation, additional plasma exposure beyond that provided in Example a) may contribute to densification of the silicon nitride film, rather than additional film growth.

Figure 9:
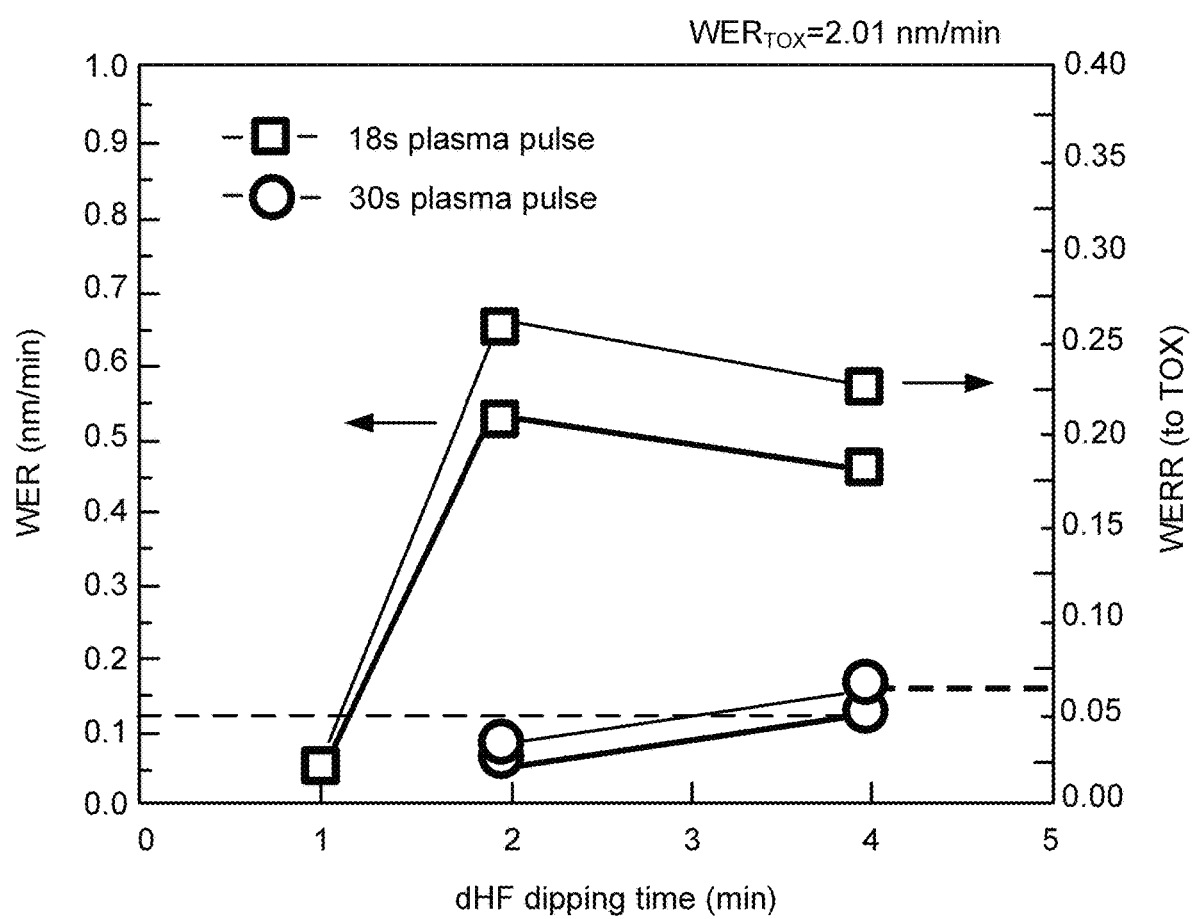
FIG. 9 shows wet etch rate of a silicon nitride film and wet etch rate ratio of the silicon nitride film as compared to a thermal silicon oxide film, as a function of time dipped in dHF.

FIG. 9 shows the wet etch rate (WER) in nanometers per minute (nm/min) and wet etch rate ratio (WERR) as compared to thermal silicon oxide (TOX), as a function of dipping time in dilute HF solution (dHF), in minutes (min), of two silicon nitride films formed using a plurality of cycles of the sequences shown in Examples a) and b). The WER and WERR data demonstrate that silicon nitride films formed using processes which include a nitrogen plasma treatment can have superior WER (e.g., less than about 0.1 nm/min) and WERR (e.g., less than about 0.06). Such WER and WERR values can be about one order of magnitude lower than that demonstrated by silicon nitride films formed using the conventional processes which do not include a nitrogen plasma treatment.

Example 2

Figure 10:
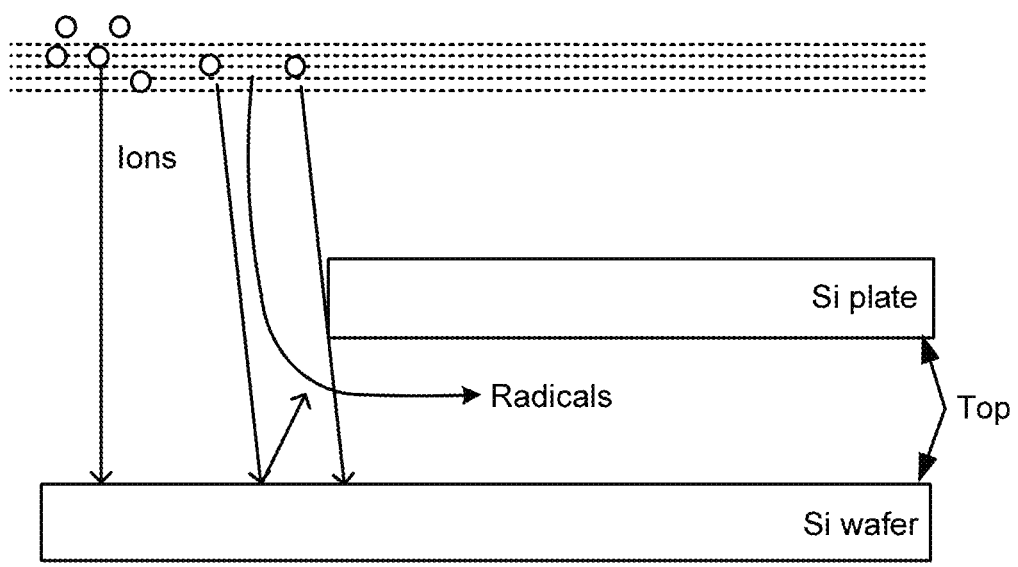
FIG. 10 shows an experimental setup for depositing silicon nitride film.

FIG. 10 shows a test setup in a direct plasma reaction chamber configured to demonstrate film growth induced by ion bombardment separate from radical induced film growth. A silicon coupon having a polished surface facing away (e.g., shown as down in FIG. 10) from the plasma (e.g., a showerhead in the reaction chamber) can be mounted over a silicon wafer. A gap can be maintained between the silicon coupon and the wafer. The gap can be varied between about 0.7 millimeters (mm) and about 2.1 mm. For example, in such a setup, few or no ions can reach the polished silicon coupon surface while radicals can diffuse to the polished silicon coupon surface. A $SiI_2H_2+N_2/H_2$ PEALD silicon nitride deposition process run using the test setup can grow film on the silicon coupon surface facing down. This growth is believed to be caused mainly by radicals, such as N*, H*, NH* and/or $NH_2$*. Film growth on the polished silicon coupon surface can be measured to determine radical induced film growth.

Figure 11:
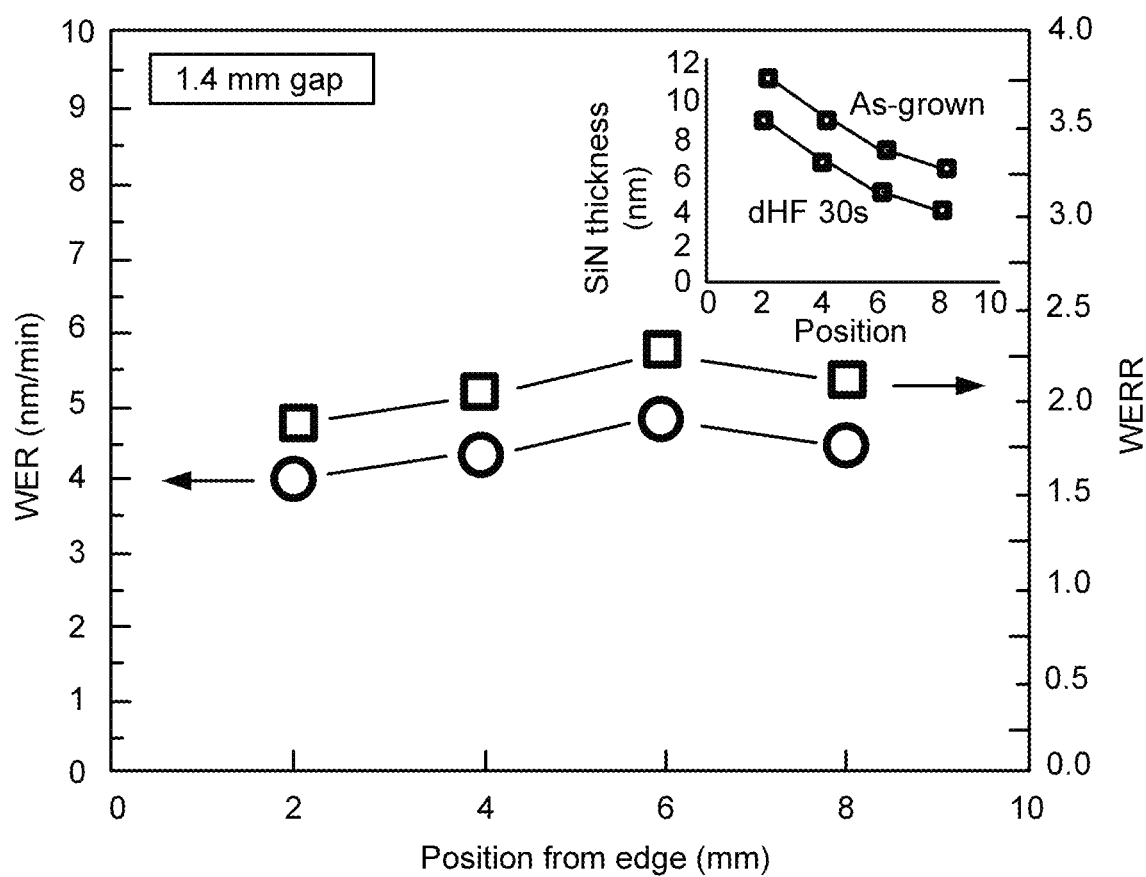
FIG. 11 shows wet etch rate of a silicon nitride film, wet etch rate ratio of the silicon nitride film as compared to a thermal silicon oxide film, and a thickness of the silicon nitride film as a function of position on the substrate.

FIG. 11 shows wet etch rate (WER) in nm/min and wet etch rate ratio (WERR) comparing wet etch rates of thermal silicon oxide to a silicon nitride film grown using a $SiI_2H_2+N_2/H_2$ PEALD process, where the silicon nitride film is grown on the polished surface of a silicon coupon in a setup shown in the experimental setup of FIG. 10. The gap between the silicon wafer and the silicon coupon was about 1.4 mm. The results indicate a very uniform film quality although film initial thickness are different which probably caused by radical flux reducing during the diffusing. FIG. 11 shows that the silicon nitride film grown on the Si coupon with radical enhanced ALD can demonstrate uniform WER, indicating for example uniformity in the quality of the film. The inset in FIG. 11 shows the silicon nitride film thickness before and after 30 seconds dHF wet etch. The film thickness across the coupon indicates that the silicon nitride can be grown with only or substantially only radicals using $SiI_2H_2$ precursor, for example, due to high reactivity of $SiI_2H_2$.

When another silicon precursor, bis(trichlorosilyl)ethane, was used instead of $SiI_2H_2$, using the setup shown in FIG. 10, no film growth was observed on the polished silicon coupon surface. Film growth was observed only on upper surfaces of the silicon wafer exposed to the direct ion bombardment. It can thus be concluded that $SiI_2H_2$ is a more reactive precursor than bis(trichlorosilyl)ethane and that radical enhanced ALD is possible.

Example 3

As described herein, silicon nitride film quality may be improved by applying increased process temperature, increased plasma power and/or longer plasma pulse duration. However, increasing plasma power and/or plasma pulse duration, such as with plasma comprising activated hydrogen containing species, may provide silicon nitride films demonstrating blister and/or delamination defects.

Figure 12:
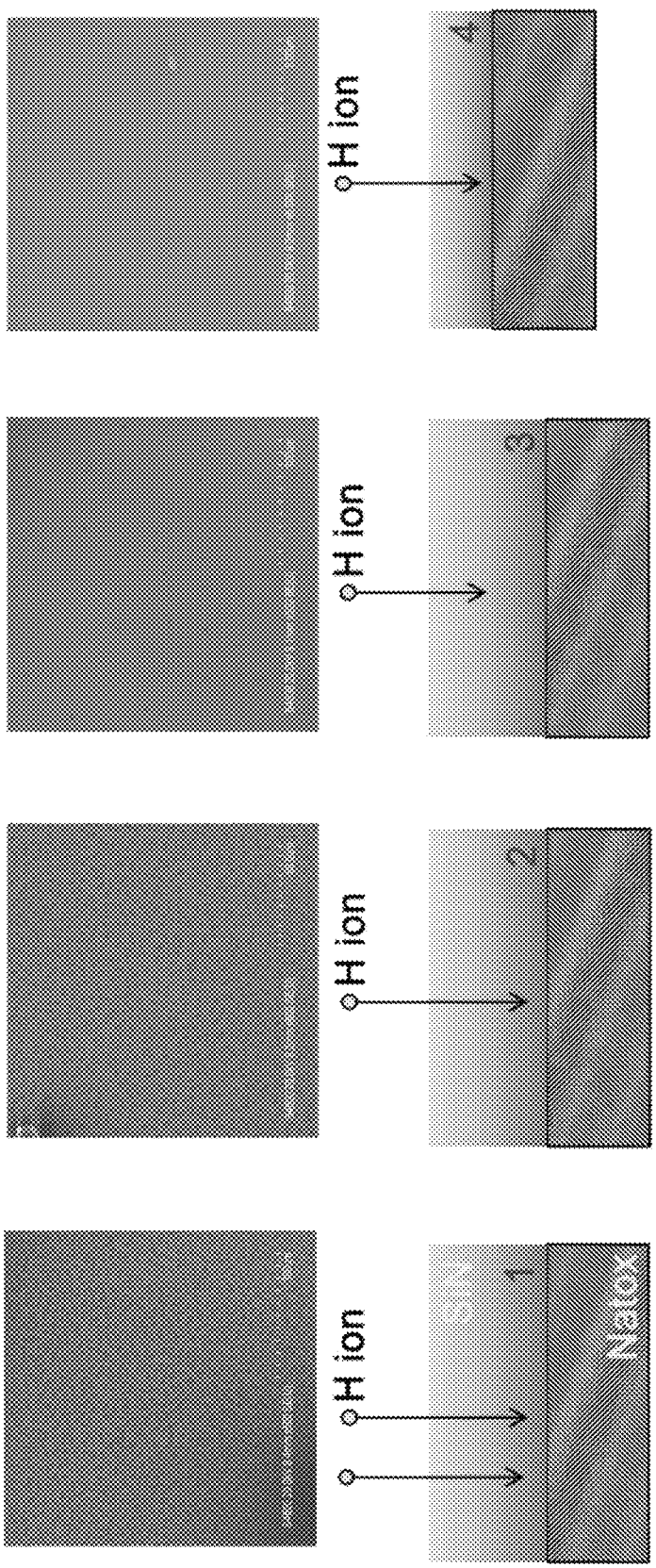
FIG. 12 are SEM images showing top-down views of silicon nitride films and the corresponding schematic showing hydrogen dosage applied to each silicon nitride film.

FIG. 12 shows formation of blister defects in silicon nitride films of different thicknesses in which the silicon nitride films were exposed to varying doses of activated hydrogen species (e.g., $H^+$ ion) in a post-hydrogen plasma treatment. The silicon nitride films were exposed to hydrogen plasma with different plasma powers and different durations, and the degree of blister defect formation on the respective silicon nitride films was observed. FIG. 12 shows top views of SiN films having various thicknesses, by SEM, corresponding to the following processes: (1) 20 nm $SiN+H_2$ plasma 200 W for 30 min, (2) 20 nm $SiN+H_2$ plasma 200 W for 15 min, (3) 20 nm $SiN+H_2$ plasma 100 W for 30 min, (4) 10 nm $SiN+H_2$ plasma 100 W for 30 min.

As shown in FIG. 12, increased blister defects, for example caused by silicon nitride film delamination, can increase with increased plasma power and/or dose of activated hydrogen species. Improving film quality, such as to reduce blister defects, may be facilitated by reducing film bombardment by high energetic and high dose of activated hydrogen species.

Example 4

As described herein, frequency with which the nitrogen plasma treatment is applied can be varied to achieve desired silicon nitride film characteristics. Effects upon silicon nitride film characteristics of nitrogen plasma treatment frequency was approximated by etching a silicon nitride film which was treated only once after film deposition, in which the one nitrogen plasma treatment was 30 minutes. FIG. 13A shows the film thickness in nm as a function of dipping time in minutes in dilute HF (dHF), and FIG. 13B shows a wet etch rate ratio (WERR) of the film as compared to thermal silicon oxide (TOX) as a function of dipping time in minutes in dilute HF (dHF). FIG. 13B shows that the etch rate of this film was very low in the first 4 minutes of etching time where approximately 1 nm was etched. After 10 minutes dip time the etch rate increased to the same level as a silicon nitride film which was not subjected to a nitrogen plasma treatment. It can be concluded that at least about 1 nm to about 2 nm of silicon nitride film can be made highly etch resistant (e.g., a "skin effect") using nitrogen plasma treatment. In some embodiments, a "skin effect" of the nitrogen treatment process can be achieved to a depth of about 2 nm to about 3 nm.

For example, with a growth rate of a silicon nitride deposition process can be about 0.4 Å/cycle, 25 to 50 cycles of silicon nitride film deposition can be applied to deposit about 1 nm to about 2 nm of film. A frequency at which a nitrogen plasma treatment can be applied during a silicon nitride film formation process can be after about every $25^{th}$ to about every $50^{th}$ cycle of silicon nitride film deposition (e.g., each cycle including a silicon precursor step followed by a nitrogen precursor step), such that an etch rate in dHF of most or all of the silicon nitride thickness can be decreased after application of the nitrogen plasma treatment.

In some embodiments, a frequency at which a nitrogen plasma treatment can be applied during a silicon nitride film formation process can be after about at least every $100^{th}$ cycle of silicon nitride film deposition, preferably after at least every $50^{th}$ cycle and most preferably after at least every $25^{th}$ cycle.

In some embodiments, a thickness of the silicon nitride film formed is less than about 3 nm, preferably less than about 2 nm, and more preferably less than about 1 nm, for example such that an etch rate of most or all of the silicon nitride film thickness can be improved after being treated by a nitrogen plasma treatment. In some embodiments, a silicon nitride film thickness can be less than about 0.5 nm.

Figure 14A:
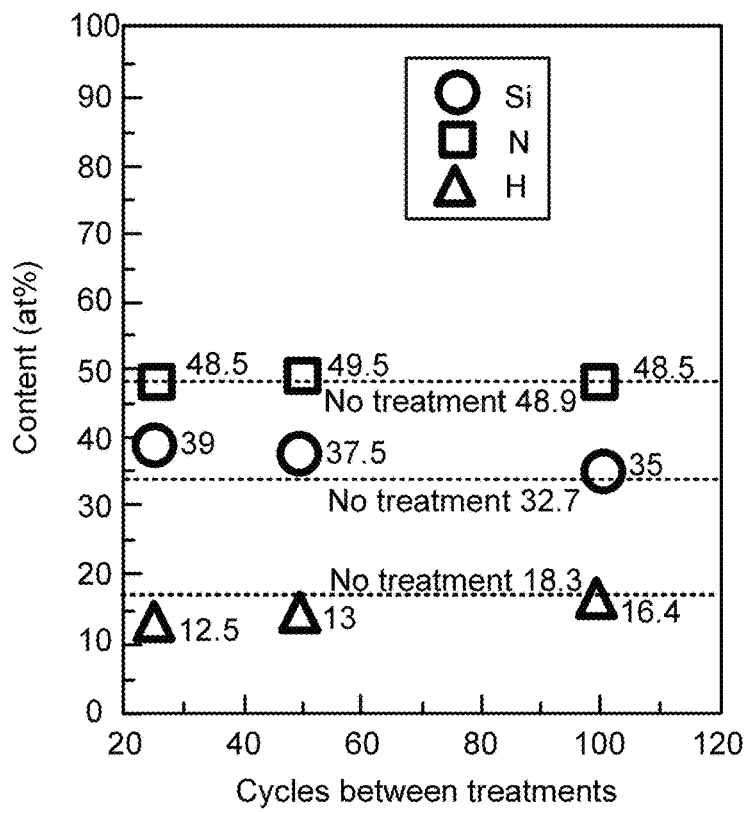
FIG. 14A shows a silicon nitride film composition.
Figure 14B:
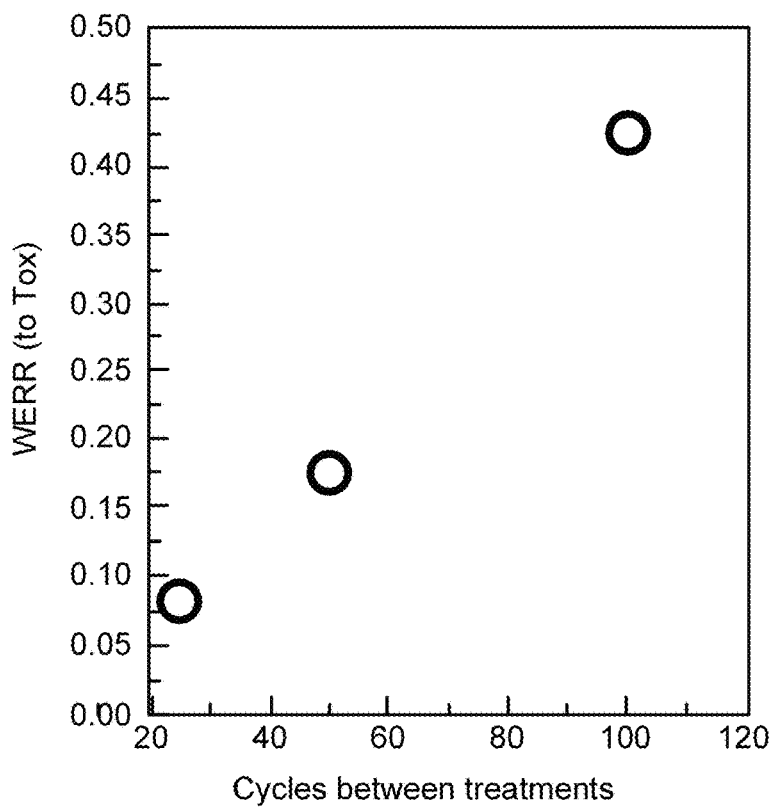
FIG. 14B shows wet etch rate ratio performance of the silicon nitride film of FIG. 13A as compared to a thermal silicon oxide film.

FIGS. 14A and 14B show film composition and dHF wet etch rate ratio (WERR), respectively, of the films processed using a one minute nitrogen plasma treatment after every 25th, 50th or 100th cycle of silicon nitride film deposition. FIG. 14A shows that the H content can be significantly decreased when frequency in applying the nitrogen plasma treatment is increased. Si and N contents remain approximately the same. The WERR increases when the number of cycles between nitrogen plasma treatments increases. For example, 100 cycles of silicon nitride film deposition can correspond to about 4 nm of film deposition and there the treatment is not as effective in reducing wet etch rate, as compared with nitrogen plasma treatments applied after about 1 nm and 2 nm film deposition, after every $25^{th}$ and $50^{th}$ cycles, respectively.

In some embodiments, a number of cycles between nitrogen plasma treatments can be selected based on a trade-off between silicon nitride film etch properties and throughput. For example, while good etch properties can be achieved with a nitrogen plasma treatment applied after every deposition cycle but will significantly reduce throughput. Thus, the skilled artisan can adjust the treatment ratio in order to form suitable films in the most efficient manner. In some embodiments a purge process may be applied for purging $H_2$ before applying a nitrogen plasma treatment in each cycle to reduce or avoid blister formation, while in other embodiments the purge process and or nitrogen plasma treatment are provided at a reduced frequency in order to increase throughput while maintaining desired film quality.

Example 5

Figure 15:
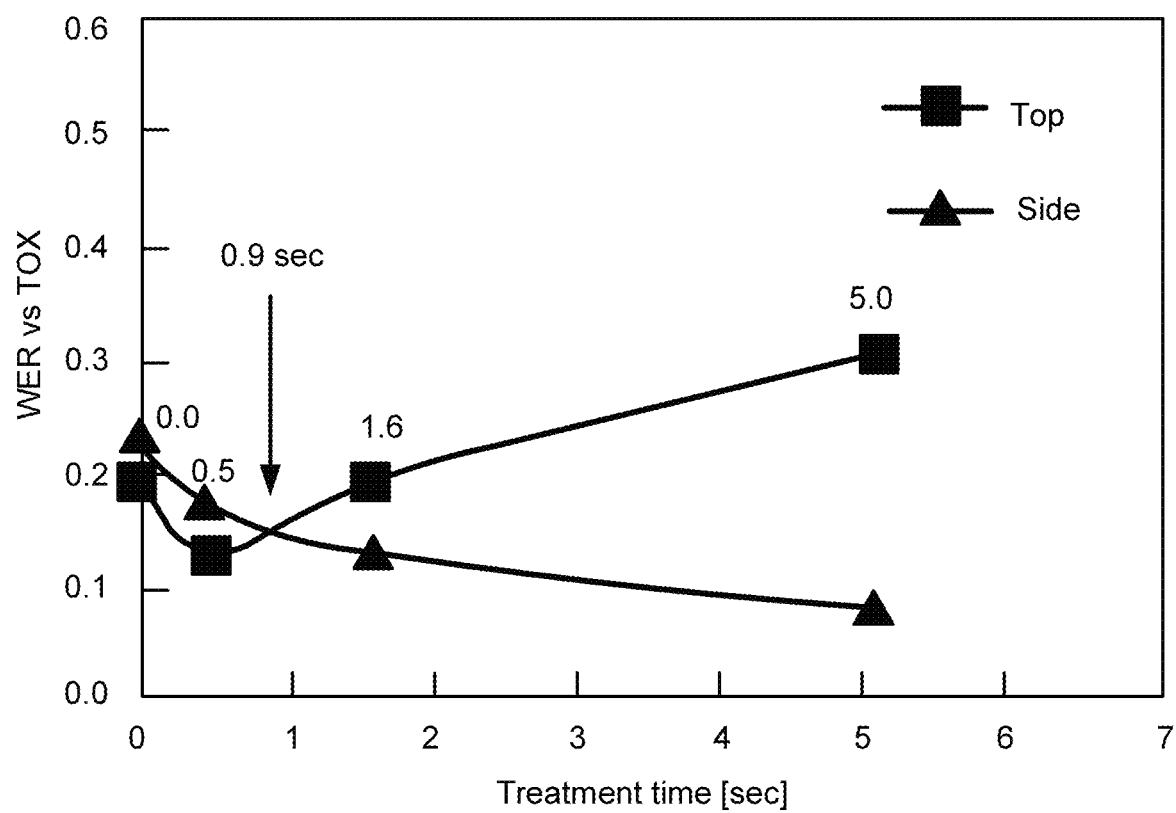
FIG. 15 shows wet etch ratio performance of a horizontal surface of a silicon nitride film as compared to a horizontal surface of a thermal silicon oxide film and a vertical surface of the silicon nitride film as compared to a vertical surface of the thermal silicon oxide film.

FIG. 15 shows wet etch rate ratio (WERR) as compared to thermal oxide (TOX) of a silicon nitride films formed on a horizontal (labelled as "Top" in FIG. 15) surface and vertical (labelled as "Side" in FIG. 15) surface of a 3-D feature, versus duration of nitrogen plasma treatment, in seconds, included in one cycle of the silicon nitride formation process. The silicon nitride film was grown using a PEALD silicon nitride film deposition process in combination with a nitrogen plasma treatment. One cycle of the silicon nitride formation process has a sequence as follows: 0.3 seconds of a silicon precursor step in which silicon precursor, and hydrogen and nitrogen are supplied to the reaction chamber, followed by 0.5 seconds of a purge process in which nitrogen and hydrogen are supplied to the reaction chamber, followed by 3.3 seconds of a plasma nitrogen precursor step in which nitrogen and hydrogen are supplied to the reaction chamber and at a plasma power of about 165 W (power density of about 0.11 W/cm$^3$), followed by 10 seconds of a purge process in which nitrogen is supplied to the reaction chamber, followed by a nitrogen plasma treatment in which nitrogen is supplied to the reaction chamber and at a plasma power of about 220 W (about 0.15 W/cm$^3$), and followed by a 10 seconds purge process in which hydrogen and nitrogen are supplied to the reaction chamber. The silicon nitride film corresponding to FIG. 15 was formed using about 190 cycles of the sequence, at a temperature 550° C.

As shown in FIG. 15, WERR of horizontal and vertical surfaces can be tuned, at least in part, by varying the duration of the nitrogen plasma treatment in each cycle. FIG. 15 shows that a uniform horizontal surface and vertical surface etch rate can be achieved using a nitrogen plasma treatment having a duration of about 0.9 seconds in the sequence above.

Multi-Step Plasma Exposure

In some embodiments, process for depositing a SiN thin film includes a multi-step plasma exposure. For example, a cycle of a PEALD process for depositing a SiN thin film may include a first phase which comprises contacting the substrate with a silicon precursor. In some embodiments, the silicon precursor comprises one or more silicon precursors as described herein. In some embodiments, the silicon precursor comprises a chlorine-containing precursor, such as octachlorotrisilane (OCTS).

A PEALD process for depositing SiN thin film includes a second phase which comprises contacting the substrate with a nitrogen precursor. In some embodiments, the second phase of the PEALD process cycle comprises a multi-step plasma exposure. In some embodiments, the silicon precursor comprises a chlorine-containing precursor. For example, in some embodiments the silicon precursor may comprise dichlorosilane (DCS), hexachlorodisilane (HCDS) and/or tetrachlorosilane (SiCl$_4$).

Figure 16:
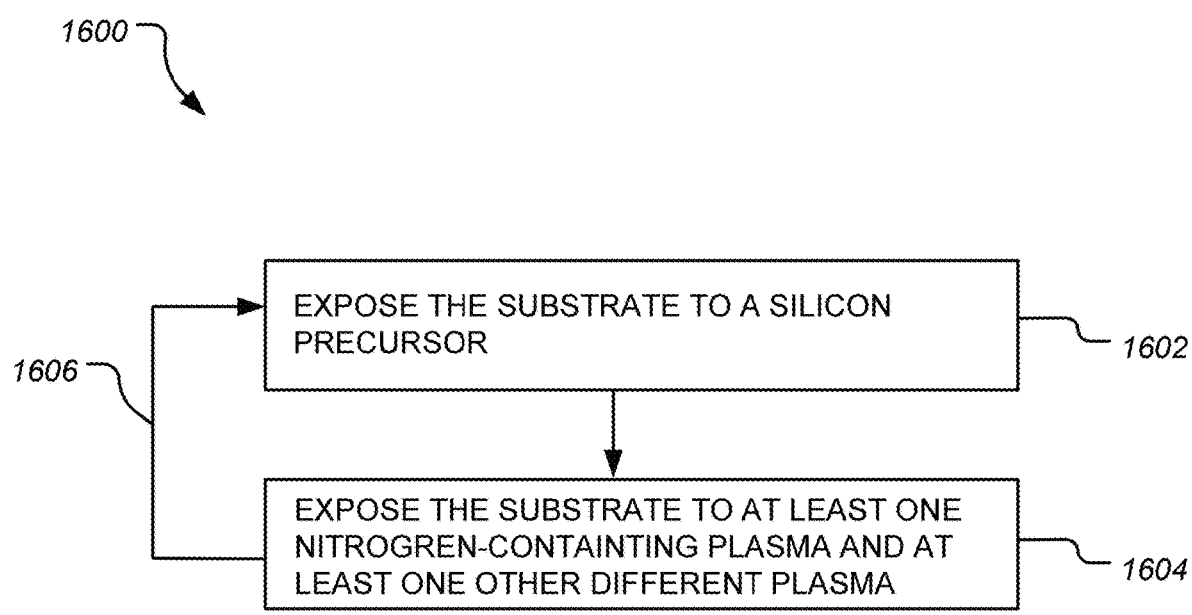
FIG. 16 is a flow chart generally illustrating an example of a method of forming a silicon nitride film by a PEALD process where the PEALD process includes a multi-step plasma exposure.

Referring to FIG. 16, an example of a deposition process 1600 is shown for forming a SiN thin film on a substrate within a reaction chamber. The deposition process 1600 may comprise a PEALD process. In block 1602, the substrate can be exposed to a silicon precursor. For example, the substrate may be exposed to octachlorotrisilane (OCTS). In some embodiments, the substrate may be exposed to one or more other silicon precursors described herein. The substrate may be subsequently exposed to a multi-step plasma exposure. In block 1604, the substrate can be exposed to at least one nitrogen-containing plasma and at least one other different plasma. The multi-step plasma exposure may comprise exposing the substrate to more than one nitrogen-containing plasma. For example, one or more steps of the multi-step plasma exposure may comprise exposing the substrate to a plasma generated by nitrogen gas ($N_2$).

In some embodiments, a cycle of a PEALD process comprises blocks 1602 and 1604. For example, a first phase of the cycle may comprise block 1602 and a second phase of the cycle may comprise block 1604. In some embodiments, the cycle comprising blocks 1602 and 1604 may be repeated 1606 a number of times to achieve a SiN film of desired thickness.

In some embodiments, one or more plasma steps of the multi-step plasma exposure comprises generating a plasma using nitrogen-containing and/or hydrogen-containing gases, and contacting the substrate with the plasma. For example, one or more plasma steps of the multi-step plasma exposure may include exposing the substrate to a plasma generated using nitrogen gas ($N_2$) and/or hydrogen gas ($H_2$). In some embodiments, one or more of the plasma steps comprises contacting the substrate with plasmas generated using both nitrogen gas ($N_2$) and hydrogen gas ($H_2$). In some embodiments, one or more of the plasma steps comprises plasmas generated by using only or substantially only hydrogen gas ($H_2$).

A multi-step plasma exposure can include two or more steps in which the substrate is contacted with a plasma reactant. In some embodiments, a multi-step plasma exposure can include three plasma steps. For example, the multi-step plasma exposure may include two plasma steps each comprising exposing the substrate to a plasma generated using both nitrogen gas ($N_2$) and hydrogen gas ($H_2$), and one plasma step comprising exposing the substrate to a plasma generated using hydrogen gas ($H_2$).

Figure 17:
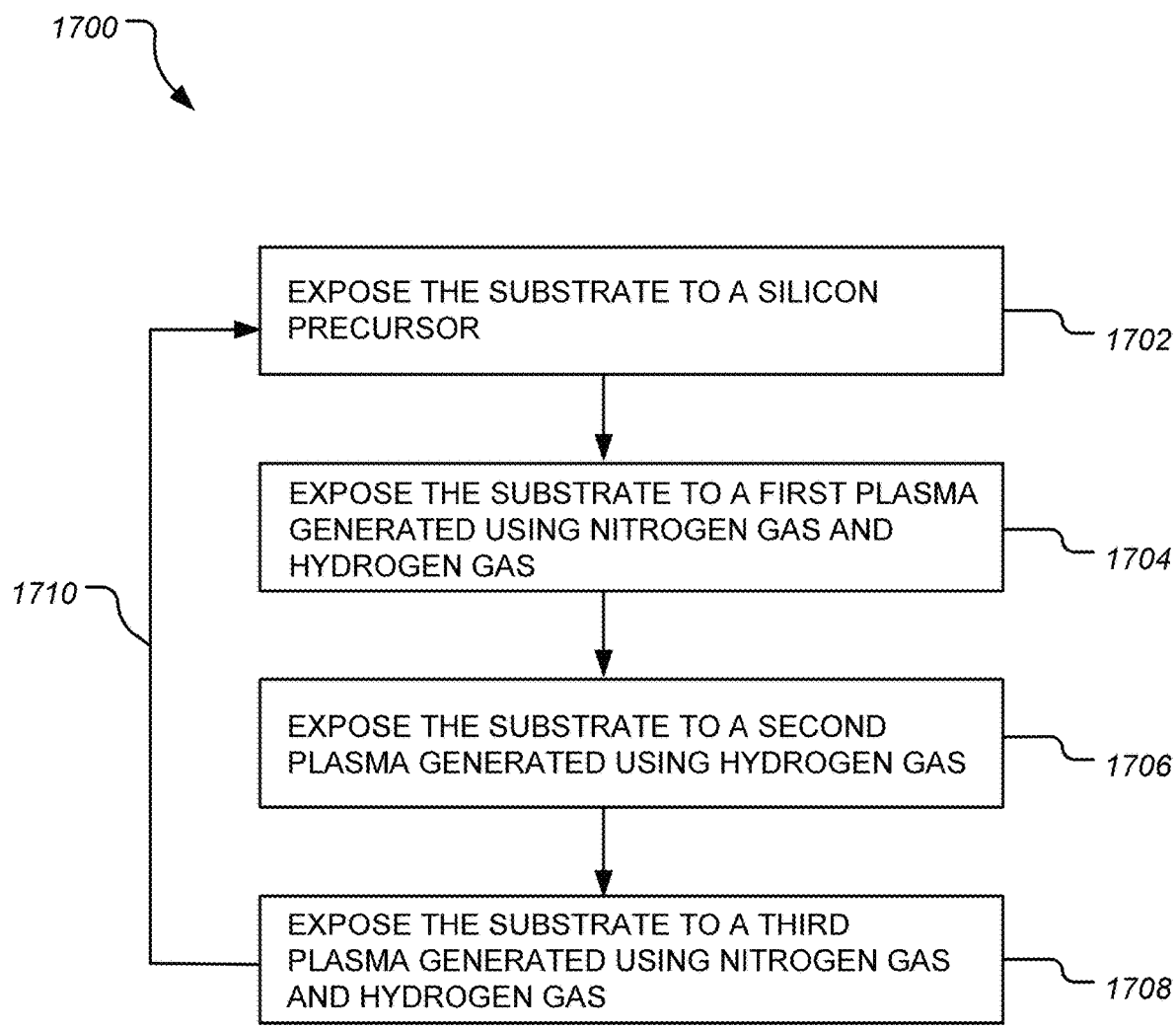
FIG. 17 is a flow chart generally illustrating another example of a method of forming a silicon nitride film by a PEALD process where the PEALD process includes a multi-step plasma exposure.

Referring to FIG. 17, another example of a deposition process 1700 is shown for forming a SiN thin film on a substrate within a reaction chamber. The deposition process 1700 may comprise a PEALD process. In block 1702, the substrate can be exposed to a silicon precursor. For example, silicon precursor may include octachlorotrisilane (OCTS). In some embodiments, the substrate may be exposed to one or more other silicon precursors described herein. The substrate may be subsequently exposed to multiple plasmas. In block 1704, the substrate can be exposed to a first plasma generated by using both nitrogen gas ($N_2$) and hydrogen gas ($H_2$). Subsequently, in block 1706, the substrate can be exposed to a second plasma generated by using hydrogen gas ($H_2$). For example, the second plasma may be generated using only or substantially only hydrogen gas ($H_2$). In block 1708, the substrate can be exposed to a third plasma generated by using both nitrogen gas ($N_2$) and hydrogen gas ($H_2$).

In some embodiments, a cycle of a PEALD process comprises blocks 1702, 1704, 1706 and 1708. For example, a first phase of the cycle may comprise block 1702 and a second phase of the cycle may comprise blocks 1704, 1706 and 1708. In some embodiments, the cycle comprising blocks 1702, 1704, 1706 and 1708 may be repeated 1710 a number of times to achieve a SiN film of desired thickness. In some embodiments, the multi-step plasma exposure is completed prior to exposing the substrate to a non-plasma reactant. In some embodiments, the multi-step plasma exposure is completed and another non-plasma reactant is not provided into the reaction chamber prior to contacting the substrate again with the silicon reactant. For example, the process for depositing the SiN film may include completing exposing the substrate to the plasma in blocks 1704, 1706 and 1708 prior to exposing the substrate again to the silicon precursor in block 1702.

In some embodiments, an interval in which no plasma is generated can follow a plasma exposure. In some embodiments, the interval can include a step for removing excess reactants and/or reaction byproducts from the reaction chamber. For example, a step for removing excess reactants and/or reaction byproducts from the vicinity of the substrate may follow one or more of the plasma steps in the multi-step plasma exposure. In some embodiments, the removal step may comprise evacuating the reaction chamber and/or flowing a purge gas through the reaction chamber. In some embodiments, the substrate may be moved to a space free or substantially free of the reactants during the removal step.

In some embodiments, each plasma step can be followed by a purge step. For example, each of exposing the substrate to the first plasma in block 1704, exposing the substrate to the second plasma in block 1706, and exposing the substrate to the third plasma in block 1708 may be followed by a purge step. In some embodiments, only some of the plasma steps of the multi-step plasma exposure are followed by a purge step. For example, a last plasma step of a multi-step plasma exposure may not be followed by a purge step.

In some embodiments, purge gas of a purge step can comprise an inert gas. For example, a purge gas can comprise a noble gas. In some embodiments, a purge gas can include argon (Ar).

In some embodiments, purge gas of a purge step can comprise one or more gases flowed in a plasma step. For example, purge gas flowed in a purge step can be selected based on gas used in an immediately succeeding plasma step. In some embodiments, gas flowed in a purge step can be the same gas used to generate the plasma in an immediately succeeding plasma step. For example, plasma power may be turned off during the purge step while flow of one or more gases used to generate the plasma in the plasma step preceding the purge step and in the plasma step immediately following the purge step can be continued during the purge step, while one or more gases, if any, not used to generate the plasma in the plasma step immediately following the purge step can be ramped down and/or turned off during the purge step.

In some embodiments, a duration of each of the plasma steps in a multi-step plasma exposure can be selected to achieve one or more desired SiN film qualities. In some embodiments, a duration of a plasma step is longer than that of an immediately succeeding plasma step. For example, a first plasma step may have a duration of about 4 seconds to about 8 seconds, such as about 6 seconds. For example, a second plasma step may have a duration of about 2 seconds to about 6 seconds, such as about 4 seconds. For example, a third plasma step may have a duration of about 1 second to about 3 seconds, such as about 2 seconds. In some embodiments, a duration of a plasma step may not be longer than that of an immediately succeeding plasma step. For example, a duration of each plasma step in a multi-step plasma exposure may have equal or substantially equal duration. In some embodiments, a duration of a plasma step can be shorter than that of an immediately succeeding plasma step.

In some embodiments, the pressure of the reaction chamber during one or more steps of the multi-step plasma exposure can be about 2 torr to about 8 torr, including about 2 torr to about 6 torr, or about 2 torr to about 4 torr.

In some embodiments, a plasma power for one or more steps of the multi-step plasma exposure can be about 50 Watts (W) to about 800 W, such as from about 100 W to about 800 W, about 100 W to about 600 W, and about 100 W to about 500 W. The plasma power can be selected based on the silicon precursor used, reaction chamber pressure of the plasma step and/or the duration of the plasma step. In some embodiments, plasma power of any one step in a multi-step plasma exposure may be the same as one or more other steps of the multi-step plasma exposure. In some embodiments, plasma power of any one step in a multi-step plasma exposure may be different from other steps of the multi-step plasma exposure.

An exemplary sequence for a multi-step plasma exposure in a PEALD process for depositing SiN thin films can include three plasma steps and an interval after each plasma step in which the plasma is turned off. Each interval may include a purge step. For example, the multi-step plasma exposure may include exposing the substrate to a first plasma generated by using both nitrogen gas ($N_2$) and hydrogen gas ($H_2$). The first plasma step may be followed by an interval in which the plasma is turned off and a first purge step is performed. The first purge step may comprise flow of hydrogen gas ($H_2$) and/or one or more other purge gases. The substrate is then exposed to a second plasma generated from only hydrogen gas ($H_2$). The second plasma step may be followed by an interval in which the plasma is turned off and a second purge step is performed. The second purge step may comprise flow of both nitrogen gas ($N_2$) and hydrogen gas ($H_2$), and/or one or more other purge gases. Subsequently, the substrate can be exposed to a third plasma generated by using both nitrogen gas ($N_2$) and hydrogen gas ($H_2$). The third plasma step may be followed by an interval in which the plasma is turned off and a third purge step is performed. The third purge step may comprise flow of both nitrogen gas ($N_2$) and hydrogen gas ($H_2$) and/or one or more other purge gases. In some embodiments, the third purge step may be omitted.

A flow rate of gases during a purge step and duration of the purge step may be selected to facilitate desired removal of excess reactants and/or reaction byproducts. In some embodiments, a flow rate of one or more gases of a purge gas may be the same as a flow rate of the gas during an immediately preceding or immediately succeeding plasma step. In some embodiments, the purge step can have a duration of about 1 second to about 10 seconds, including about 2 seconds to about 8 seconds. For example, a duration of a purge step can have a duration of about 4 seconds, or about 6 seconds.

Figure 18:
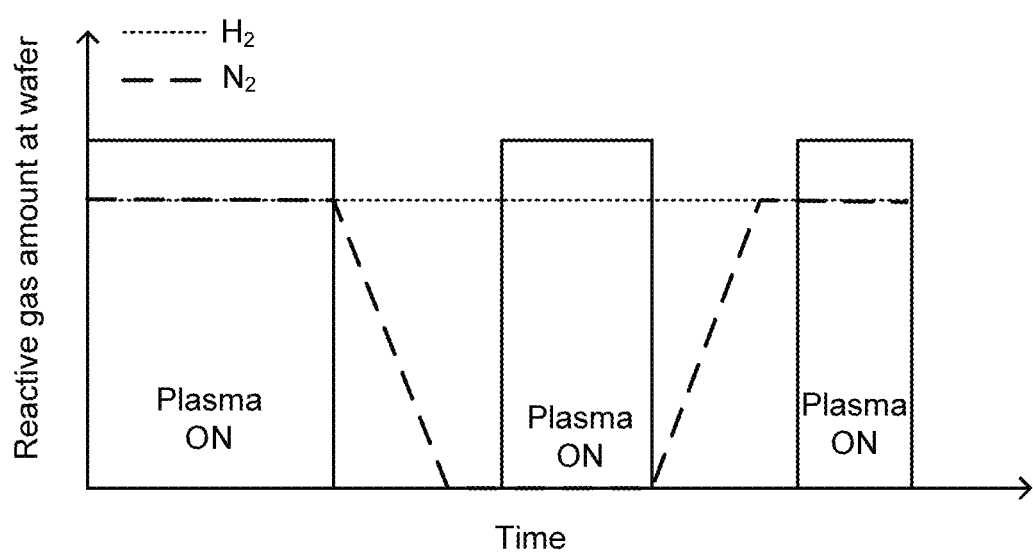
FIG. 18 is a graph showing gas flow rates and plasma power as a function of time for an example of a multi-step plasma exposure.

FIG. 18 is a graph showing plasma power and gas flow as a function of time for an example of a multi-step plasma exposure. The y-axis shows the amount of reactive gas at the substrate, and the x-axis shows time. FIG. 18 shows an example of a three-step plasma exposure in which the substrate is exposed to a hydrogen-containing and nitrogen-containing plasma, followed by a hydrogen-containing plasma, and then followed by a hydrogen-containing and nitrogen-containing plasma. The example shown in FIG. 18 includes plasmas generated using hydrogen gas ($H_2$) and/or nitrogen gas ($N_2$), where plasma power is turned on during each of the three plasma steps, and nitrogen gas ($N_2$) flow is turned on during the first and third plasma steps, while hydrogen gas ($H_2$) flow is continued throughout the multi-step plasma exposure.

As described herein, the graph in FIG. 18 shows three durations in which plasma is on, or three plasma steps. FIG. 18 shows that each plasma step may have a duration shorter than that of the immediately preceding plasma step. For example, the first plasma step starting at time equals 0 can have a longer duration than that of the subsequent second plasma step, and the second plasma step can have a longer duration than that of the third plasma step. In some embodiments, each plasma step can have a duration equal to that of other plasma steps. In some embodiments, each plasma step has a duration shorter than that of an immediately preceding plasma step.

FIG. 18 shows that the first and third plasma steps may comprise flow of both hydrogen gas ($H_2$) and nitrogen gas ($N_2$), while the second plasma step may comprise flow of hydrogen gas ($H_2$). As shown in FIG. 18, flow of hydrogen gas ($H_2$) may be continued throughout the multi-step plasma exposure. For example, the flow of hydrogen gas ($H_2$) can be constant or substantially constant throughout the multi-step plasma exposure, while the flow of nitrogen gas ($N_2$) may be ramped up or ramped down during an interval between plasma steps. For example, as shown in FIG. 18, the nitrogen gas ($N_2$) may be ramped down, such as a linear ramp, during an interval between the first and second plasma steps, and may be ramped up, such as a linear ramp, during the interval between the second and third plasma steps. For example, an interval between plasma steps may include flow of an increasing amount of nitrogen gas ($N_2$) or a decreasing amount of nitrogen gas ($N_2$), and a constant or substantially constant flow of hydrogen gas ($H_2$).

As shown in FIG. 18, the interval between the first plasma step and the second plasma step may begin with flow of both hydrogen gas ($H_2$) and nitrogen gas ($N_2$), and end with flow of only or substantially only hydrogen gas ($H_2$) as the nitrogen gas ($N_2$) is ramped down and then turned off. The nitrogen gas ($N_2$) flow during the second interval following the second plasma step may be ramped up. For example, the interval between the second plasma step and the third plasma step may begin with ramping up of the flow of nitrogen gas ($N_2$) and end with flow of both hydrogen gas ($H_2$) and nitrogen gas ($N_2$). For example, the nitrogen gas ($N_2$) flow during the second interval may be ramped up to a rate used for the third plasma step.

In some embodiments, the first and third plasma steps of a three-step plasma exposure may comprise flow of both nitrogen gas ($N_2$) and hydrogen gas ($H_2$), while the second plasma step may comprise flow of nitrogen gas ($N_2$). For example, flow of nitrogen gas ($N_2$) may be continued throughout the multi-step plasma exposure. In some embodiments, the flow of nitrogen gas ($N_2$) can be constant or substantially constant throughout the exposure, while the flow of hydrogen gas ($H_2$) may be ramped up or ramped down during an interval between plasma steps. For example, the hydrogen gas ($H_2$) may be ramped down, such as a linear ramp, during an interval between the first and second plasma steps, and may be ramped up, such as a linear ramp, during the interval between the second and third plasma steps. An interval between plasma steps may include flow of an increasing amount of hydrogen gas ($H_2$) or a decreasing amount of hydrogen gas ($H_2$), and a constant or substantially constant flow of nitrogen gas ($N_2$). For example, the interval between the first plasma step and the second plasma step may begin with flow of both hydrogen gas (H$_2$) and nitrogen gas (N$_2$), and end with flow of only or substantially only nitrogen gas (N$_2$) as the hydrogen gas (H$_2$) is ramped down and then turned off. The hydrogen gas (H$_2$) flow during the second interval following the second plasma step may be ramped up. For example, the interval between the second plasma step and the third plasma step may begin with ramping up of the flow of hydrogen gas (H$_2$) and end with flow of both hydrogen gas (H$_2$) and nitrogen gas (N$_2$). For example, the hydrogen gas (H$_2$) flow during the second interval may be ramped up to a rate used for the third plasma step.

In some embodiments, a three-step plasma exposure may comprise a first plasma step comprising flow of hydrogen gas (H$_2$), a second plasma step comprising flow of nitrogen gas (N$_2$), and a third step comprising flow of both hydrogen gas (H$_2$) and nitrogen gas (N$_2$). In some embodiments, nitrogen gas (N$_2$) may be ramped up and the hydrogen gas (H$_2$) can be ramped down during the interval between the first plasma step and the second plasma step, such that only or substantially only nitrogen gas (N$_2$) is flowed during the second plasma step. The nitrogen gas (N$_2$) may be continued during the interval between the second plasma step and the third plasma step while the hydrogen gas (H$_2$) is ramped up during the interval, such that both nitrogen gas (N$_2$) and hydrogen gas (H$_2$) are supplied during the third plasma step. In some embodiments, the flow of nitrogen gas (N$_2$) can be kept constant or substantially constant from the start of the second plasma step to the end of the third plasma step. In some embodiments, ramping of the flow of the hydrogen gas (H$_2$) and/or nitrogen gas (N$_2$) can be a linear ramp.

In some embodiments, a three-step plasma exposure may comprise a first plasma step comprising flow of both hydrogen gas (H$_2$) and nitrogen gas (N$_2$), a second plasma step comprising flow of hydrogen gas (H$_2$), and a third step comprising flow of nitrogen gas (N$_2$). In some embodiments, nitrogen gas (N$_2$) flow can be ramped down during the interval between the first plasma step and the second plasma step, while the flow of hydrogen gas (H$_2$) is continued, such that only or substantially only hydrogen gas is flowed during the second plasma step. In some embodiments, the flow of hydrogen gas (H$_2$) is kept constant or substantially constant from the start of the first plasma step to the end of the second plasma step. In some embodiments, hydrogen gas (H$_2$) is ramped down during the interval between the second plasma step and the third plasma step, while nitrogen gas (N$_2$) is ramped up, such that the third plasma step flows only or substantially only nitrogen gas (N$_2$). In some embodiments, ramping of the flow of nitrogen gas (N$_2$) and/or hydrogen gas (H$_2$) may be a linear ramp.

In some embodiments, a PEALD process for depositing a SiN thin film comprising a multi-step plasma exposure can be followed by one or more other plasma treatments as described above.

Example Film Characteristics of a SiN Film Deposited Using a Multi-Step Plasma Exposure FIG. 19A is table showing characteristics of two SiN thin films. The table in FIG. 19A lists the growth rate, in angstroms per cycle (Å/cycle), the refractive index, and the wet etch rate (WER), in nanometers per minute (nm/min), of each of the SiN films. The table also lists the wet etch rate ratio (WERR) comparing wet etch rate of each of the SiN films to that of thermal oxide (TOX). The wet etch rates and wet etch rate ratios shown in the table of FIG. 19A were measured after exposing the films to 0.5 weight % hydrofluoric acid (HF) solution (dilute HF, or dHF).

The SiN film shown in the first row of the table in FIG. 19A was formed using a PEALD process having a process temperature of about 120° C. A cycle of the PEALD process included a first phase in which the substrate was contacted with a silicon precursor comprising octachlorotrisilane (OCTS). The second phase of the PEALD process cycle included a single plasma step in which the substrate was contacted with a plasma generated using both nitrogen gas (N$_2$) and hydrogen gas (H$_2$).

The SiN film described in the second row of the table in FIG. 19A was formed using a PEALD process having a process temperature of about 120° C. A cycle of the PEALD process included a first phase in which the substrate was contacted with a silicon precursor comprising octachlorotrisilane (OCTS). The second phase of the PEALD process cycle included a multi-step plasma exposure in which the substrate was exposed to three plasma steps. The sequence of the multi-step plasma exposure used to form the SiN film shown in the second row of the table is provided in the table of FIG. 19B. As shown in FIG. 19B, the second phase of the PEALD process included a first plasma step having a duration of about 6 seconds in which the plasma was generated using both nitrogen gas (N$_2$) and hydrogen gas (H$_2$). The first plasma step was followed by a first purge step having a duration of about 4 seconds. The plasma was turned off during the first purge step and the first purge step included flow of hydrogen gas (H$_2$). Subsequently, the substrate was exposed to a second plasma for a duration of about 4 seconds, where the second plasma was generated using hydrogen gas (H$_2$). Then a second purge step having a duration of about 4 seconds was performed, where the second purge step comprised flowing of nitrogen gas (N$_2$) and hydrogen gas (H$_2$). The second purge step was followed by a third plasma step. The third plasma step had a duration of about 2 seconds, in which the substrate was exposed to a plasma generated using nitrogen gas (N$_2$) and hydrogen gas (H$_2$). The complete cycle of the PEALD process was repeated about 500 times to achieve a SiN film having a thickness of about 37 nanometers.

As shown in the table of FIG. 19A, SiN film growth rates per cycle of the two PEALD cycles and the refractive indices of the two SiN films were similar. The PEALD process for forming the SiN film shown in the first row demonstrated a film growth rate of about 0.73 Å/cycle and the deposited SiN film demonstrated a refractive index of about 1.78. The PEALD process for forming the SiN film shown in the second row demonstrated a film growth rate of about 0.74 Å/cycle and the deposited SiN film demonstrated a refractive index of about 1.80. Meanwhile, the SiN film shown in the second row of the table in FIG. 19A and deposited using the multi-step plasma exposure demonstrated a significantly lower wet etch rate in dHF (0.5%), as compared to that of the SiN film shown in the first row. As shown in the table of FIG. 19A, the wet etch rate of the SiN film in the second row, formed using the multi-step plasma exposure, was about half that of the SiN film shown in the first row. The table in FIG. 19A also shows that the wet etch rate ratio of the SiN formed using a multi-step plasma exposure was about half that of the SiN film in the first row, formed without using the multi-step plasma exposure.

Without being limited by any particular theory or mode of operation, a PEALD process for forming a SiN thin film comprising a multi-step plasma exposure can facilitate formation of SiN films having desired wet etch rates, including desired wet etch rates in 0.5 weight % HF solution. For example, a PEALD process comprising a multi-step plasma exposure may facilitate formation of SiN films having desired wet etch rates, while providing desired film deposition rates and/or films having other desired film characteristics, such as film refractive indices.

It will be understood by those of skill in the art that numerous and various modifications can be made without departing from the spirit of the present invention. The described features, structures, characteristics and precursors can be combined in any suitable manner. Therefore, it should be clearly understood that the forms of the present invention are illustrative only and are not intended to limit the scope of the present invention. All modifications and changes are intended to fall within the scope of the invention, as defined by the appended claims.

What is claimed is:

1. A method of forming a SiN thin film on a surface of a substrate in a reaction space comprising:
    contacting the substrate with a silicon precursor comprising $SiI_2H_2$ to provide a first silicon species adsorbed on the surface of the substrate;
    contacting the substrate comprising the first silicon species adsorbed on the surface with a first plasma comprising activated hydrogen species thereby forming SiN on the substrate; and
    contacting the substrate comprising SiN with a second plasma formed from a gas comprising $N_2$ and a noble gas, wherein the second plasma is substantially free of hydrogen-containing species.

2. The method of claim 1, wherein the second plasma comprises Ar or He species.

3. The method of claim 1, wherein the activated hydrogen species comprises at least one of hydrogen atoms, hydrogen plasma, hydrogen radicals, N* radicals, NH* radicals and $NH_2$* radicals.

4. The method of claim 1, wherein the SiN thin film is formed on a three-dimensional structure comprising a sidewall and a top region and wherein a ratio of a wet etch rate (WER) of the SiN thin film on the sidewall to a wet etch rate (WER) of the SiN thin film on the top region is from 0.75 to 1.5 in 0.5% dHF.

5. The method of claim 1, wherein the SiN thin film has a blanket wet etch rate in dHF relative to the wet etch rate of thermal silicon oxide of less than 0.5.

6. The method of claim 1, wherein the SiN thin film has a blanket wet etch rate of less than 5 nm/min in 0.5% dHF.

7. The method of claim 1, wherein the amount of etching of the SiN thin film is one to two times less than the amount of etching of a thermal $SiO_2$ film in a 0.5% dHF dip process.

8. The method of claim 1, wherein the first plasma is generated using a first power and the second plasma is generated using a second power that is different from the first power.

9. The method of claim 8, wherein the second power is greater than the first power.

10. The method of claim 9, wherein the second power is up to 900% of the first power.

11. The method of claim 8, wherein the first power is from 50 W to 600 W.

12. The method of claim 8, wherein the second power is from 100 W to 1000 W.

13. The method of claim 1, wherein the first plasma has a plasma energy of less than 2500 W*s.

14. The method of claim 1, wherein the second plasma has a power density of 0.07 $W/cm^3$ to 70 $W/cm^3$.

15. The method of claim 1, further comprising exposing the substrate to a third plasma different from at least one of the first plasma and the second plasma.

16. The method of claim 1, further comprising repeating contacting the substrate with the silicon precursor and contacting the substrate with the first plasma two or more times prior to contacting the substrate with the second plasma.

17. The method of claim 16, wherein contacting the substrate with the silicon precursor and contacting the substrate with the first plasma is repeated at least 25 times prior to contacting the substrate with the second plasma.

18. The method of claim 16, wherein a total duration during which the substrate is contacted with the first plasma is greater than or equal to a total duration during which the substrate is contacted with the second plasma.

19. The method of claim 1, wherein no additional reactants are used for forming the SiN thin film.

20. The method of claim 1, wherein at least one of the first and third plasmas is generated from a gas comprising both hydrogen gas and nitrogen gas.

21. The method of claim 1, wherein the SiN thin film has a total impurity level excluding hydrogen of below 5 at-%.

22. The method of claim 1, wherein the SiN thin film has a hydrogen level below about 10 at-%.

23. The method of claim 1, wherein the SiN thin film has a step coverage and pattern loading effect of greater than 90% on a three-dimensional structure.

* * * * *

UNITED STATES PATENT AND TRADEMARK OFFICE
CERTIFICATE OF CORRECTION

PATENT NO. : 10,741,386 B2  
APPLICATION NO. : 16/381634  
DATED : August 11, 2020  
INVENTOR(S) : Shang Chen et al.

Page 1 of 3

It is certified that error appears in the above-identified patent and that said Letters Patent is hereby corrected as shown below:

On the Title Page

On Page 2, Column 1, Item (56), Line 2, under Related U.S. Application Data, delete "Jul. 7, 2017," and insert --Feb. 7, 2017,--.

On Page 2, Column 1, Item (56), Line 37, under U.S. Patent Documents, delete "Fukada" and insert --Fukuda--.

On Page 3, Column 2, Item (56), Line 13, under Other Publications, delete "Hyddrolysis" and insert --Hydrolysis--.

In the Drawings

On Sheet 13 of 19, FIG. 13A, X-axis, Line 6 (Approx.), delete "N2" and insert --$N_2$--.

On Sheet 13 of 19, FIG. 13B, X-axis, Line 14 (Approx.), delete "N2" and insert --$N_2$--.

On Sheet 16 of 19, FIG. 16, Reference Number 1604, Line 2, delete "NITROGREN-CONTAINTING" and insert --NITROGEN-CONTAINING--.

In the Specification

In Column 4, Line 54, delete "repetition" and insert --repetition.--.

In Column 8, Line 40, delete "finFET" and insert --FinFET--.

In Column 10, Line 10, delete "Ar" and insert --Ar.--.

In Column 14, Line 58 (Approx.), delete "(4)" and insert --(5)--.

Signed and Sealed this  
Third Day of November, 2020

Andrei Iancu  
*Director of the United States Patent and Trademark Office*

CERTIFICATE OF CORRECTION (continued)
U.S. Pat. No. 10,741,386 B2

In Column 20, Line 28 (Approx.), delete "$H_{2+2}$" and insert --$H_{2n+2}$--.

In Column 21, Line 47 (Approx.), delete "$A_zR_n$" and insert --$A_zR^{II}_w$--.

In Column 21, Line 56, delete "$R^{n'}$" and insert --$R^{II}$--.

In Column 22, Line 1, delete "$R^{n'}$" and insert --$R^{II}$--.

In Column 24, Line 11, delete "$R_i$" and insert --$R_1$--.

In Column 24, Line 18, delete "$R_i$" and insert --$R_1$--.

In Column 24, Line 21, delete "$R_i$" and insert --$R_1$--.

In Column 24, Line 43, delete "$Et_5Si_2I$," and insert --$Et_5Si_2I$,--.

In Column 24, Line 48, delete "$Et_2MeSi$," and insert --$Et_2MeSiI$,--.

In Column 24, Line 56, delete "$HSi_3$," and insert --$HSiI_3$,--.

In Column 24, Line 57, delete "$Me_3Si$," and insert --$Me_3SiI$,--.

In Column 24, Line 59, delete "$HEtSi_2$." and insert --$HEtSiI_2$.--.

In Column 25, Line 7, delete "$(Si_3)NiPr_2$," and insert --$(SiI_3)N^iPr_2$,--.

In Column 25, Line 13, delete "$NMe^ipr$," and insert --$NMe^iPr$,--.

In Column 25, Line 19, delete "$(NH_iPr)_2$," and insert --$(NH^iPr)_2$,--.

In Column 25, Line 22, delete "$(N^1Pr_2)_2$," and insert --$(N^iPr_2)_2$,--.

In Column 25, Line 29, delete "$(N^1Pr_2)_2$," and insert --$(N^iPr_2)_2$,--.

In Column 25, Line 38, delete "$NPr_2$," and insert --$N^iPr_2$,--.

In Column 25, Line 38, delete "$N^iPr^tBu$," and insert --$N^iP_r{}^tBu$,--.

In Column 25, Line 45, delete "$NPr_2$," and insert --$N^iPr_2$,--.

In Column 26, Line 11, delete "$NPr_2$," and insert --$N^iPr_2$,--.

In Column 26, Line 60 (Approx.), delete "$H_{2+2-Y-Z-W}$" and insert --$H_{2n+2-Y-Z-W}$--.

In Column 30, Line 56, delete "(1-G)." and insert --(1-σ).--.

CERTIFICATE OF CORRECTION (continued)
U.S. Pat. No. 10,741,386 B2

In Column 30, Line 57, delete "(1-G)." and insert --(1-$\sigma$).--.

In Column 32, Line 33, delete "$H_{3+}$" and insert --$H_3^+$--.

In Column 32, Line 62, delete "$H_{3+}$." and insert --$H_3^+$.--.

In Column 33, Line 41, delete "FiNFETs" and insert --FinFETs--.

In Column 34, Line 29, delete "treatment" and insert --treatment.--.

In Column 35, Line 32, delete "(H+))." and insert --($H^+$)).--.

In Column 39, Line 36, delete "(A/c)," and insert --(Å/c),--.

In Column 42, Line 8, delete "and or" and insert --and/or--.